(12) United States Patent
Sugihara et al.

(10) Patent No.: US 10,101,657 B2
(45) Date of Patent: Oct. 16, 2018

(54) RESIN, RESIST COMPOSITION AND METHOD FOR PRODUCING RESIST PATTERN

(71) Applicant: SUMITOMO CHEMICAL COMPANY, LIMITED, Tokyo (JP)

(72) Inventors: Masako Sugihara, Osaka (JP); Takashi Nishimura, Osaka (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 0 days.

(21) Appl. No.: 15/085,443

(22) Filed: Mar. 30, 2016

(65) Prior Publication Data

US 2016/0291467 A1    Oct. 6, 2016

(30) Foreign Application Priority Data

Mar. 31, 2015   (JP) ................. 2015-073002

(51) Int. Cl.
| | | |
|---|---|---|
| G03F 7/004 | (2006.01) | |
| G03F 7/30 | (2006.01) | |
| C08F 212/02 | (2006.01) | |
| C08F 216/10 | (2006.01) | |
| C08F 216/12 | (2006.01) | |
| C08F 216/14 | (2006.01) | |
| G03F 7/039 | (2006.01) | |
| G03F 7/075 | (2006.01) | |
| G03F 7/085 | (2006.01) | |

(52) U.S. Cl.
CPC .......... *G03F 7/0392* (2013.01); *C08F 212/02* (2013.01); *C08F 216/10* (2013.01); *C08F 216/12* (2013.01); *C08F 216/14* (2013.01); *G03F 7/0045* (2013.01); *G03F 7/0397* (2013.01); *G03F 7/0751* (2013.01); *G03F 7/085* (2013.01)

(58) Field of Classification Search
CPC ........ G03F 7/0392; G03F 7/30; C08F 212/02; C08F 216/10; C08F 216/12; C08F 216/14
USPC ............ 430/270.1, 326, 905, 910; 525/132; 526/346
See application file for complete search history.

(56) References Cited

U.S. PATENT DOCUMENTS

| | | | |
|---|---|---|---|
| 3,779,778 A | 12/1973 | Smith et al. | |
| 3,849,137 A | 11/1974 | Barzynski et al. | |
| 4,576,902 A | 3/1986 | Saenger et al. | |
| 4,822,716 A | 4/1989 | Onishi et al. | |
| 4,857,437 A | 8/1989 | Banks et al. | |
| 5,017,453 A | 5/1991 | Onishi et al. | |
| 5,073,476 A | 12/1991 | Meier et al. | |
| 5,198,520 A | 3/1993 | Onishi et al. | |
| 5,260,410 A | 11/1993 | Schwalm | |
| 5,453,341 A | 9/1995 | Schwalm | |
| 6,284,427 B1* | 9/2001 | Okazaki ................ C08F 212/14 430/270.1 |
| 6,686,121 B2* | 2/2004 | Okazaki ................ C08F 212/14 430/270.1 |
| 2003/0219677 A1* | 11/2003 | Namba ................ G03F 7/0392 430/270.1 |
| 2008/0020289 A1* | 1/2008 | Hatakeyama .......... C08F 12/24 430/4 |
| 2008/0153036 A1 | 6/2008 | Suetsugu et al. | |
| 2010/0151380 A1 | 6/2010 | Ando et al. | |

FOREIGN PATENT DOCUMENTS

| | | |
|---|---|---|
| DE | 39 14407 A1 | 10/1990 |
| EP | 0 126 712 A1 | 11/1984 |
| JP | 55-164824 A | 12/1980 |
| JP | 62-69263 A | 3/1987 |
| JP | 62-153853 A | 7/1987 |
| JP | 63-26653 A | 2/1988 |
| JP | 63-146029 A | 6/1988 |
| JP | 63-146038 A | 6/1988 |
| JP | 63-163452 A | 7/1988 |
| JP | 2001-75277 A | 3/2001 |
| JP | 2004-309776 A | 11/2004 |
| JP | 2008-46594 A | 2/2008 |
| JP | 2008-134515 A | 6/2008 |
| JP | 2010-79081 A | 4/2010 |
| JP | 2010-204634 A | 9/2010 |
| JP | 2011-75864 A | 4/2011 |

* cited by examiner

*Primary Examiner* — John S Chu
(74) *Attorney, Agent, or Firm* — Birch, Stewart, Kolasch & Birch, LLP

(57) ABSTRACT

A resist composition contains: a resin having an acid-labile group, a resin having a structural unit represented by formula (I), an acid generator, and a solvent;

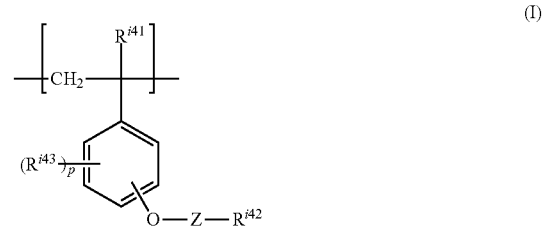

(I)

wherein $R^{i41}$ represents a hydrogen atom or a methyl group, $R^{i42}$ represents a $C_1$ to $C_{10}$ hydrocarbon group that may be substituted with a hydroxy group, a $C_2$ to $C_7$ acyl group or a hydrogen atom, $R^{i43}$ in each occurrence independently represents a $C_1$ to $C_6$ alkyl group or a $C_1$ to $C_6$ alkoxy group, "p" represents an integer of 0 to 4, Z represents a divalent $C_3$ to $C_{20}$ hydrocarbon group having a group represented by formula (Ia), and a methylene group contained in the hydrocarbon group may be replaced by an oxygen atom, a sulfur atom or a carbonyl group, *—[(CH$_2$)$_w$—O]$_r$— (Ia): wherein "w" and "r" each independently represents an integer of 1 to 10, and * represent a bonding position.

5 Claims, 1 Drawing Sheet

RESIN, RESIST COMPOSITION AND METHOD FOR PRODUCING RESIST PATTERN

CROSS-REFERENCE TO RELATED APPLICATIONS

This application claims priority to Japanese Application No. 2015-73002 filed on Mar. 31, 2015. The entire disclosure of Japanese Application No. 2015-73002 is incorporated hereinto by reference.

BACKGROUND

1. Field of the Invention

The disclosure relates to a resin, a resist composition and a method for producing resist pattern.

2. Related Art

In the mounting of the semiconductor chip being thin film and having multi-pin, the protruding electrodes of about 4 to 150 μm height, which is connection terminals (bumps), are formed on the substrate (wafer) by photolithography. As a method for forming such a connection terminal, JP2011-75864A1 mentions use of a resin having a structural unit derived from p-hydroxystyrene for resist compositions.

SUMMARY

The present application provides the inventions as follow.

[1] A resist composition contains:
a resin having an acid-labile group,
a resin having a structural unit represented by formula (I),
an acid generator, and
a solvent:

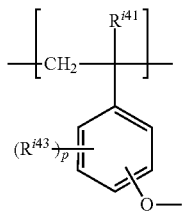
(I)

wherein $R^{i41}$ represents a hydrogen atom or a methyl group,
$R^{i42}$ represents a $C_2$ to $C_7$ acyl group or a hydrogen atom, or a $C_1$ to $C_{10}$ hydrocarbon group in which a hydrogen atom can be replaced by a hydroxy group,
$R^{i43}$ in each occurrence independently represents a $C_1$ to $C_6$ alkyl group or a $C_1$ to $C_6$ alkoxy group,
"p" represents an integer of 0 to 4,
Z represents a divalent $C_3$ to $C_{20}$ hydrocarbon group having a group represented by formula (Ia), and a methylene group contained in the hydrocarbon group may be replaced by an oxygen atom, a sulfur atom or a carbonyl group:

(Ia)

wherein "w" and "r" each independently represents an integer of 1 to 10, and
\* represent a bonding position, provided that $R^{i42}$ represents a $C_2$ to $C_7$ acyl group when "w" represents 1.

[2] The resist composition according to [1] wherein the structural unit represented by formula (I) is a structural unit represented by formula (I-1) or formula (I-2):

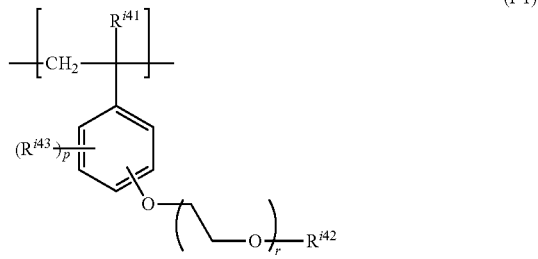
(I-1)

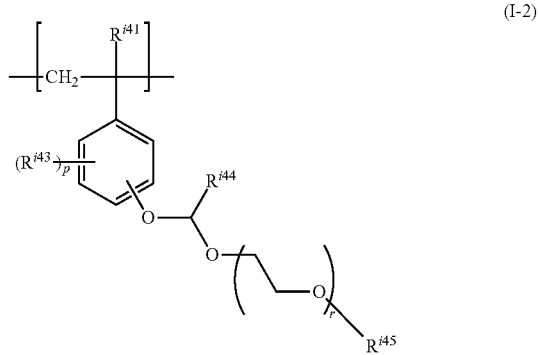
(I-2)

wherein $R^{i41}$ represents a hydrogen atom or a methyl group,
$R^{i42}$ represents a $C_1$ to $C_{10}$ hydrocarbon group that may be substituted with a hydroxy group, a $C_2$ to $C_7$ acyl group or a hydrogen atom,
$R^{i43}$ in each occurrence independently represents a $C_1$ to $C_6$ alkyl group or a $C_1$ to $C_6$ alkoxy group,
"p" represents an integer of 0 to 4,
$R^{i44}$ represents a $C_1$ to $C_{10}$ hydrocarbon group,
"r" represents an integer of 1 to 10, and
$R^{45}$ represents a $C_1$ to $C_{10}$ hydrocarbon group that may be substituted with a hydroxy group, a $C_2$ to $C_7$ acyl group or a hydrogen atom.

[3] The resist composition according to [1] or [2] wherein the resin having an acid-labile group is a resin having a structural unit represented by formula (a1-2):

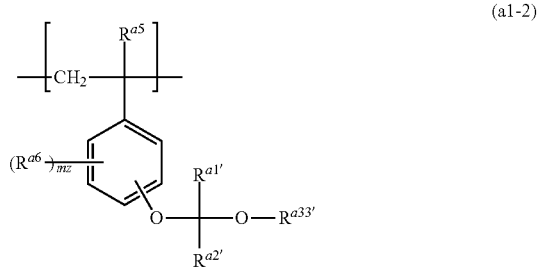
(a1-2)

wherein $R^{a5}$ represents a hydrogen atom or a methyl group,
$R^{a1'}$ and $R^{a2'}$ each independently represent a hydrogen atom or a $C_1$ to $C_{12}$ hydrocarbon group, $R^{a33'}$ represents a $C_1$ to $C_{20}$ hydrocarbon group, or $R^{a1'}$ represents a hydrogen atom or a $C_1$ to $C_{12}$ hydrocarbon group, and $R^{a2'}$ and $R^{a33'}$ are bonded together with a carbon atom and an oxygen atom bonded thereto to form a divalent heterocyclic group having 2 to 20 carbon atoms, and a methylene group contained in the hydrocarbon group represented by $R^{a1'}$ and $R^{a2'}$ or the divalent heterocyclic group may be replaced by an oxygen atom or a sulfur atom, $R^{a6}$ in each occurrence independently represents a $C_1$ to $C_6$ alkyl group or a $C_1$ to $C_6$ alkoxy group, and "mz" represents an integer of 0 to 4.

[4] The resist composition according to claim any one of [1] to [3] wherein the acid generator is a compound having a group represented by formula (B1):

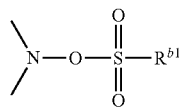
(B1)

wherein $R^{b1}$ represents a $C_1$ to $C_{18}$ hydrocarbon group in which a hydrogen atom may have a fluorine atom and in which a methylene group may be replaced by an oxygen atom or a carbonyl group.

[5] A method for producing a resist pattern comprising steps (1) to (4);

(1) applying the resist composition according to any one of [1] to [4] onto a substrate;

(2) drying the applied composition to form a composition layer;

(3) exposing the composition layer; and (4) developing the exposed composition layer.

[6] A resin has a structural unit represented by formula (I-2):

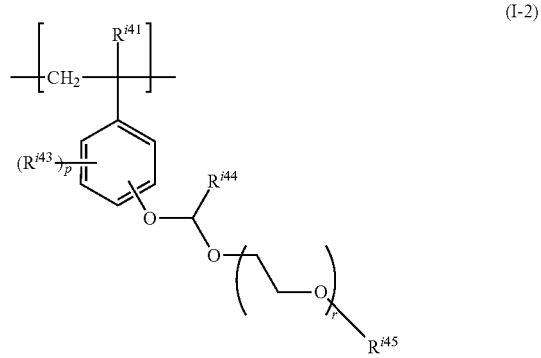
(I-2)

wherein $R^{i41}$ represents a hydrogen atom or a methyl group, $R^{i43}$ in each occurrence independently represents a $C_1$ to $C_6$ alkyl group or a $C_1$ to $C_6$ alkoxy group, "p" represents an integer of 0 to 4, $R^{i44}$ represents a $C_1$ to $C_{10}$ hydrocarbon group, "r" represents an integer of 1 to 10, and $R^{i45}$ represents a $C_1$ to $C_{10}$ hydrocarbon group that may be substituted with a hydroxy group, a $C_2$ to $C_7$ acyl group or a hydrogen atom.

DETAILED DESCRIPTION OF DISCLOSURE

Figure 1A:
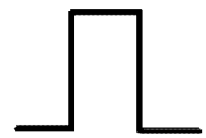
FIG. 1(a) illustrates an excellent cross-sectional view of a photoresist pattern which has substantially rectangle shape at its top and bottom portions.

In the specification, the term "(meth)acrylic monomer" means a monomer having a structure of "$CH_2=CH-CO-$" or "$CH_2=C(CH_3)-CO-$", as well as "(meth)acrylate" and "(meth)acrylic acid" mean "an acrylate or methacrylate" and "an acrylic acid or methacrylic acid," respectively. The group described herein, which can take both the linear structure and branch structure, may be either. When stereo isomers exist, it includes all stereoisomers. The indefinite articles "a" and "an" are taken as the same meaning as "one or more".

The term "solid components" means components other than solvents in a resist composition.

<Resist Composition>

The resist composition according to the disclosure contains a resin having an acid-labile group (which is sometimes referred to as "resin (A1)"), a resin having a structural unit represented by formula (I) (which is sometimes referred to as "resin (A3)"), an acid generator (which is sometimes referred to as "acid generator (B)"), and a solvent (which is sometimes referred to as "solvent (D)").

The resist composition of the disclosure may further contain a resin different from the resin (A1), such as an alkali-soluble resin (which is sometimes referred to as "resin (A2)"), a quencher (which is sometimes referred to as "quencher (C)") and an adhesion improver (which is sometimes referred to as "adhesion improver (E)"), or the like. The structural unit represented by formula (I) is sometimes referred to as "structural unit (I)".

<Resin (A1)>

The resin (A1) has the structural unit having an acid-labile group (which is sometimes referred to as "structural unit (a1)").

The "acid-labile group" means a group having a leaving group which is detached by contacting with an acid resulting in forming a hydrophilic group such as a hydroxy or carboxy group. In other words, the "acid-labile group" means ones solubility of the structural unit having the acid-labile group into an alkaline aqueous solution is increased by the action of an acid. Therefore, solubility into an alkaline aqueous solution of the resin (A1) increases by the action of the acid.

The "solubility in an alkaline aqueous solution is increased by the action of an acid" means to increase the solubility in an alkaline aqueous solution by contact with an acid. The resin is preferably a resin which is insoluble or poorly soluble in an alkali aqueous solution before contact with the acid, and becomes soluble in an alkaline aqueous solution after contact with the acid.

The resin (A1) may further have a structural unit having no acid-labile group (which is sometimes referred to as "structural unit (a2)") and/or another type of known structural unit in the art in addition to the structural unit having an acid-labile group. Herein, the resin (A1) does not have the structural unit represented by formula (I).

Examples of the acid-labile group include a group represented by the formula (1) and the formula (2).

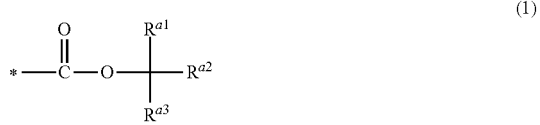
(1)

In the formula (1), $R^{a1}$, $R^{a2}$ and $R^{a3}$ each independently represent a $C_1$ to $C_8$ alkyl group, a $C_3$ to $C_{20}$ alicyclic hydrocarbon group, or $R^{a1}$ and $R^{a2}$ may be bonded together with a carbon atom bonded thereto to form a $C_2$ to $C_{20}$ divalent hydrocarbon group and $R^{a3}$ represents a $C_1$ to $C_8$ alkyl group or a $C_3$ to $C_{20}$ alicyclic hydrocarbon group, and * represents a binding position.

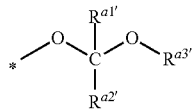
(2)

In the formula (2), $R^{a1'}$ and $R^{a2'}$ each independently represent a hydrogen atom or a $C_1$ to $C_{12}$ hydrocarbon group, $R^{a3'}$ represents a $C_1$ to $C_{20}$ hydrocarbon group, or $R^{a1'}$ at represents a hydrogen atom or a $C_1$ to $C_{12}$ hydrocarbon group, and $R^{a2'}$ and $R^{a3'}$ are bonded together with a carbon atom and an oxygen atom bonded thereto to form a divalent heterocyclic group having 2 to 20 carbon atoms, and a methylene group contained in the hydrocarbon group or the divalent heterocyclic group may be replaced by an oxygen atom or a sulfur atom, and * represents a binding position.

Examples of the alkyl group for $R^{a1}$ to $R^{a3}$ include methyl, ethyl, propyl, butyl, pentyl, hexyl, heptyl and octyl groups.

The alicyclic hydrocarbon group for $R^{a1}$ to $R^{a3}$ may be a monocyclic or polycyclic group. Examples of the monocyclic alicyclic hydrocarbon group include a cycloalkyl group such as cyclopentyl, cyclohexyl, cycloheptyl and cyclooctyl groups. Examples of the polycyclic alicyclic hydrocarbon group include decahydronaphthyl, adamantyl, norbornyl, and the following groups.

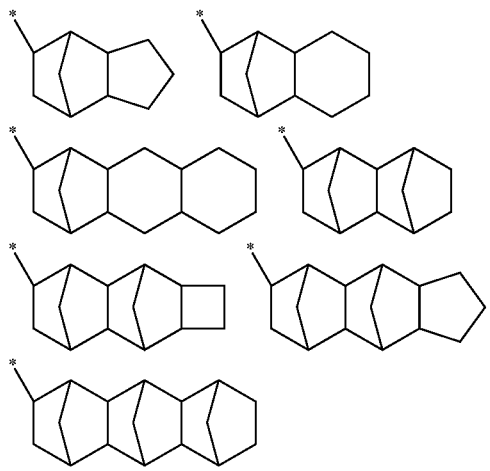

In the formula, * represents a binding position.

The alicyclic hydrocarbon group for $R^{a1}$ to $R^{a3}$ preferably is a $C_3$ to $C_{16}$ alicyclic hydrocarbon group.

When $R^{a1}$ and $R^{a2}$ is bonded together to form a divalent hydrocarbon group, examples of the group —$C(R^{a1})(R^{a2})$ ($R^{a3}$) include the following groups. The divalent hydrocarbon group is preferably a $C_3$ to $C_{12}$ alicyclic hydrocarbon group. In each of the formulae, * represent a binding position to —O—.

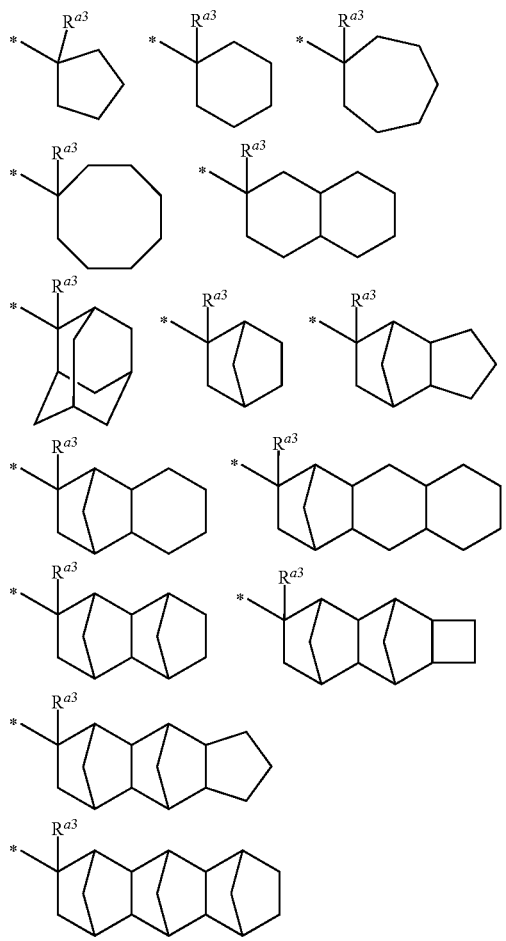

Specific examples of the group represented by the formula (1) include, for example, an alkoxycarbonyl group (a group in which $R^{a1}$ to $R^{a3}$ are alkyl groups, preferably tert-butoxycarbonyl group, in the formula (1)), 1-alkylcyclopentane-1-yloxycarbonyl group and 1-alkylcyclohexane-1-yloxycarbonyl group (a group in which $R^{a1}$ and $R^{a2}$ form a cyclopentyl or a cyclohexyl group, and $R^{a3}$ is an alkyl group, in the formula (1)), and 1-(cyclopentane-1-yl)-1-alkylalkoxycarbonyl group and 1-(cyclohexane-1-yl)-1-alkylalkoxycarbonyl group (a group in which $R^{a1}$ and $R^{a2}$ are an alkyl group, and $R^{a3}$ a cyclopentyl or a cyclohexyl group, in the formula (1)).

The hydrocarbon group for $R^{a1'}$ to $R^{a3'}$ in formula (2) may be an alkyl group, an alicyclic hydrocarbon group, an aromatic hydrocarbon group and a combination thereof.

Examples of the alkyl group include methyl, ethyl, propyl, butyl, pentyl, hexyl, heptyl, octyl, decyl and dodecyl groups.

Examples of the alicyclic hydrocarbon group include a cycloalkyl group such as cyclopentyl, cyclohexyl, cycloheptyl and cyclooctyl groups; and a polycyclic alicyclic hydrocarbon group such as decahydronaphthyl, adamantyl, norbornyl, and the following groups.

Examples of the aromatic hydrocarbon group include an aryl group such as phenyl, naphthyl, anthryl, p-methylphenyl, p-tert-butylphenyl, p-adamantylphenyl, tolyl, xylyl, cumenyl, mesityl, biphenyl, phenanthryl, 2,6-diethylphenyl and 2-methyl-6-ethylphenyl groups.

Examples of groups combining the alkyl group and the alicyclic hydrocarbon group include methylcyclohexyl, dimethylcyclohexyl, methylnorbornyl, isobonyl, 2-alkyl-adamanane-2-yl and 1-(adamantane-1-yl) alkane-1-yl groups.

Examples of groups combining the aromatic hydrocarbon group and the alkyl group include aralkyl group such as benzyl, phenethyl, phenylpropyl, naphthylmethyl and naphthylethyl groups.

Examples of the divalent heterocyclic group formed by binding with $R^{a2'}$ and $R^{a3'}$ with a carbon atom and an oxygen atom bonded thereto include the following groups. * represent a binding position.

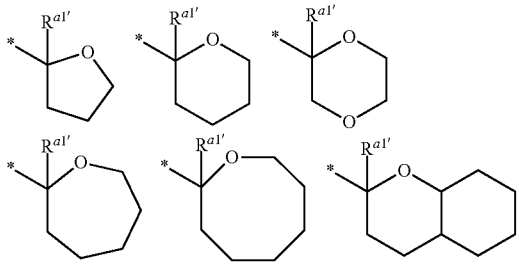

In each formula, $R^{a1'}$ is preferably a hydrogen atom.

Specific examples of the group represented by the formula (2) include the following groups.

In each of the formulae, * represent a binding position.

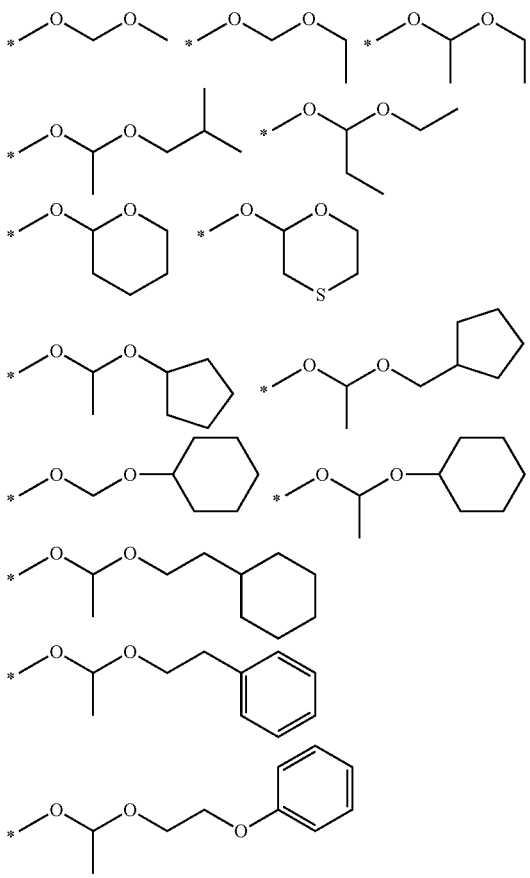

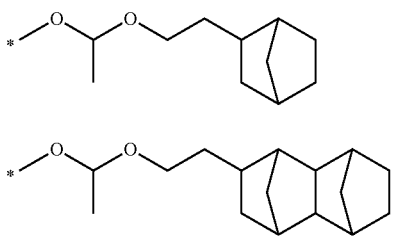

<Structural Unit (a1)>

The monomer which derives the structural unit (a1) is preferably a monomer which has an acid-labile group and an ethylene unsaturated bond, and is more preferably a monomer having a group represented by the formula (1) and/or (2) and a ethylene unsaturated bond, provided that the monomers is those other than the monomers which derives the structural unit (a1).

The resin (A1) may have one kind of the structural unit (a1-1) or two or more of them.

Examples of the structural units (a1) preferably include the structural units represented by formula (a1-1) and formula (a1-2), these are sometimes referred to as the "structural unit (a1-1)" and "structural unit (a1-2)".

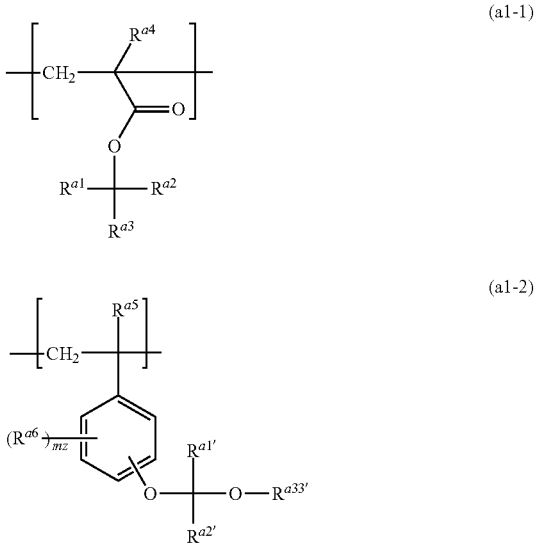

In the formulae, $R^{a1}$, $R^{a2}$, $R^{a3}$, $R^{a1'}$ and $R^{a2'}$ are as defined above, $R^{a33'}$ represents a $C_1$ to $C_{20}$ hydrocarbon group or $R^{a2'}$ and $R^{a33'}$ are bonded together with a carbon atom and an oxygen atom bonded thereto to form a divalent heterocyclic group having 2 to 20 carbon atoms, $R^{a4}$ and $R^{a5}$ each independently represent a hydrogen atom or a methyl group, $R^{a6}$ in each occurrence independently represents a $C_1$ to $C_6$ alkyl group or a $C_1$ to $C_6$ alkoxy group, and "mz" represents an integer of 0 to 4.

Examples of the hydrocarbon group for $R^{a33'}$ include the same groups as those of $R^{a3'}$.

In the formula (a1-1), $R^{a4}$ is preferably a hydrogen atom.
In the formula (a1-2), $R^{a1'}$ is preferably a hydrogen atom.

$R^{a2'}$ is preferably a $C_1$ to $C_{12}$ hydrocarbon group, and more preferably a methyl group or an ethyl group.

The hydrocarbon group of $R^{a3'}$ is preferably a $C_1$ to $C_{18}$ alkyl group, a $C_3$ to $C_{18}$ alicyclic hydrocarbon group, a $C_6$ to $C_{18}$ aromatic hydrocarbon group or a combination thereof, and more preferably a $C_1$ to $C_{18}$ alkyl group, a $C_3$ to $C_{18}$ alicyclic hydrocarbon group or a $C_7$ to $C_{18}$ aralkyl group. The alkyl group and the alicyclic group is preferably unsubstituted. When the aromatic hydrocarbon group has been substituted, the substituent is preferably a $C_6$ to $C_{10}$ aryloxy group.

$R^{a5}$ is preferably a hydrogen atom.

$R^{a6}$ is preferably a $C_1$ to $C_4$ alkoxy group, more preferably a methoxy group or an ethoxy group, and still more preferably a methoxy group.

"mz" is preferably 0 or 1, and more preferably 0.

Examples of the structural unit represented by formula (a1-1) include those represented by formulae (a1-1-1) to (a1-1-17).

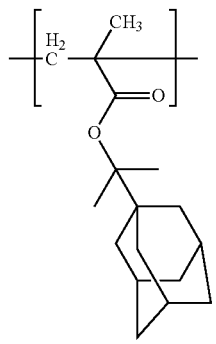

(a1-1-1)

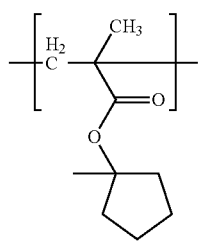

(a1-1-2)

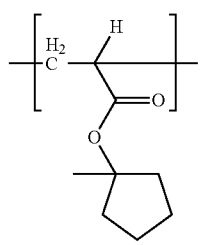

(a1-1-3)

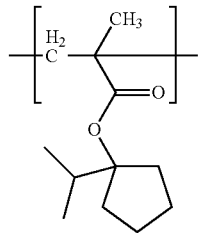

(a1-1-4)

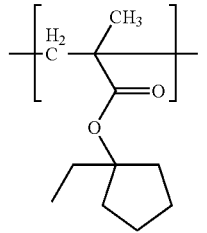

(a1-1-5)

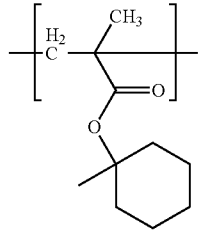

(a1-1-6)

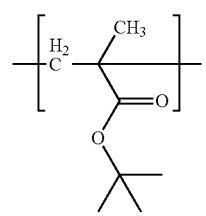

(a1-1-7)

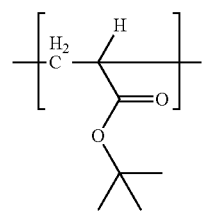

(a1-1-8)

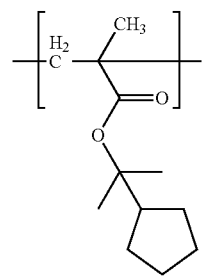

(a1-1-9)

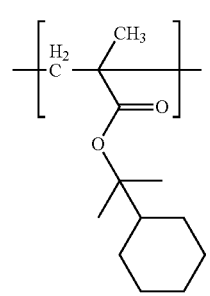

(a1-1-10)

(a1-1-11)
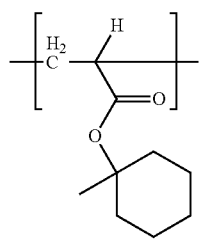
(a1-1-12)
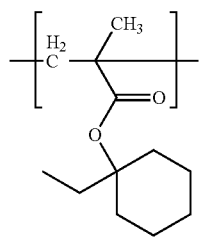
(a1-1-13)
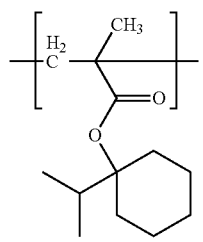
(a1-1-14)
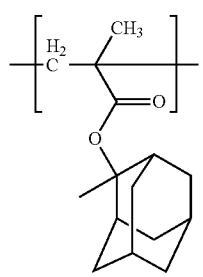
(a1-1-15)
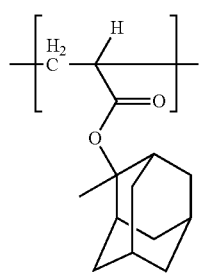
(a1-1-16)
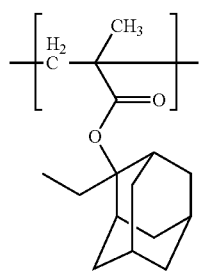
(a1-1-17)
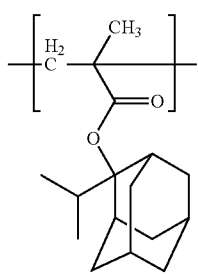
Examples of the monomers which derive the structural unit (a1-2) include those represented by formulae (a1-2-1) to (a1-2-14).
(a1-2-1)
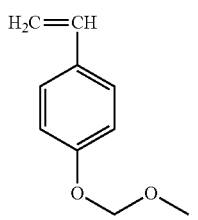
(a1-2-2)
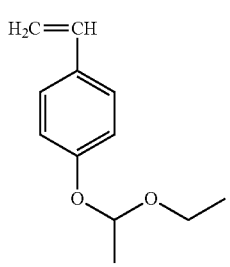
(a1-2-3)
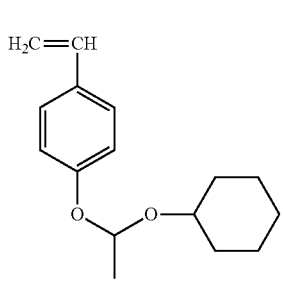
(a1-2-4)
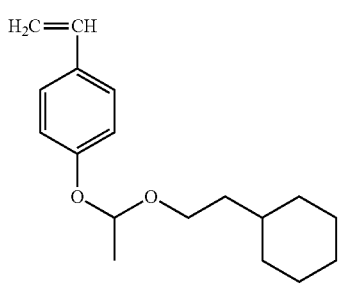

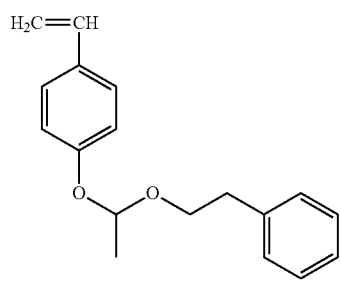
(a1-2-5)
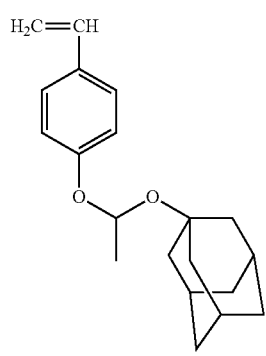
(a1-2-6)
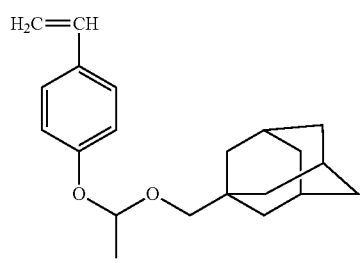
(a1-2-7)
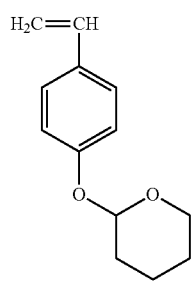
(a1-2-8)
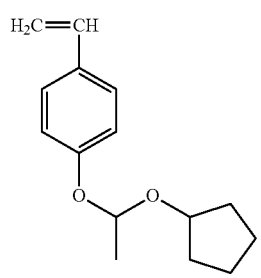
(a1-2-9)
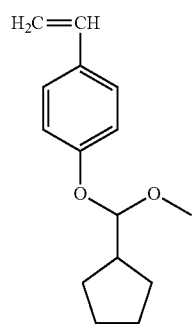
(a1-2-10)
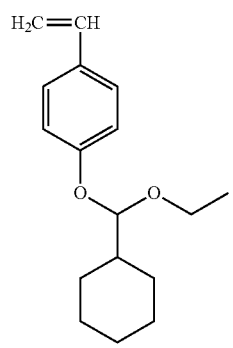
(a1-2-11)
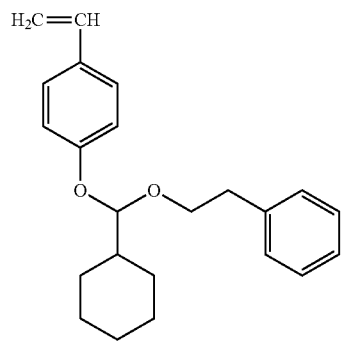
(a1-2-12)
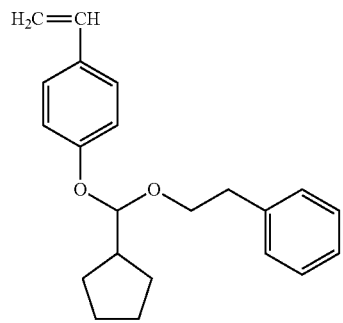
(a1-2-13)

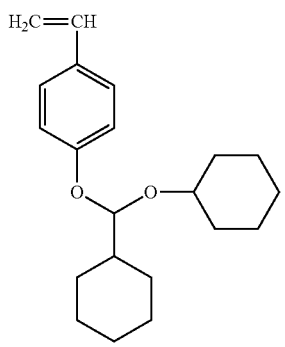
(a1-2-14)

Examples of the monomers include monomers in which a methyl group corresponding to $R^{a4}$ and $R^{a5}$ has been replaced by a hydrogen atom.

Among them, the structural units derived from the monomers represented by formulae (a1-2-2), (a1-2-3), (a1-2-4), (a1-2-9) and (a1-2-14) are preferred, and the structural units derived from the monomers represented by formulae (a1-2-2), (a1-2-3), (a1-2-4) and (a1-2-9) are more preferred.

The resin (A1) having an acid-labile group is preferably a resin having the structural unit (a1-2).

When the resin (A1) has the structural unit(s) represented by formula (a1-1) and/or formula (a1-2), the total content of these is preferably 5 to 60% by mole, more preferably 10 to 55% by mole, still more preferably 15 to 50% by mole, and particularly preferably 20 to 45% by mole with respect to the total structural units (100% by mole) of the resin (A1).

<Structural Unit (a2)>

The resin (A1) may have one kind of the structural unit (a2), or two or more them.

Examples of the structural unit (a2) include structural units represented by formulae (a2-1), (a2-2) and (a2-3), these are sometimes referred to as the "structural unit (a2-1)", "structural unit (a2-2)" and "structural unit (a2-3)".

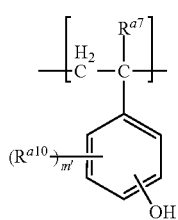
(a2-1)

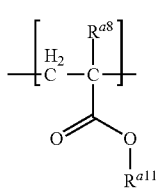
(a2-2)

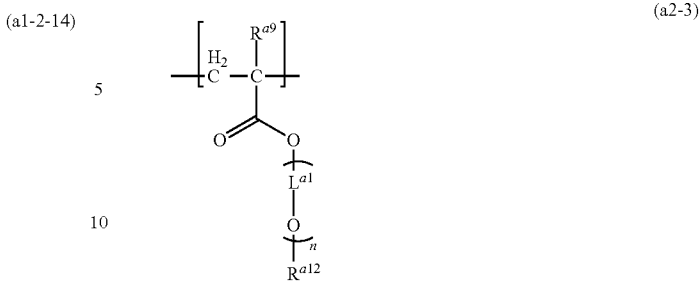
(a2-3)

In the formulae, $R^{a7}$, $R^{a8}$ and $R^{a9}$ each independently represent a hydrogen atom or a methyl group, $R^{a10}$ in each occurrence independently represents a $C_1$ to $C_6$ alkyl group or a $C_1$ to $C_6$ alkoxy group, m' represents an integer of 0 to 4, $R^{a11}$ represents a hydrogen atom, a $C_1$ to $C_{10}$ primary or secondary hydrocarbon group, $R^{a12}$ represents a $C_1$ to $C_6$ primary or secondary alkyl group, $L^{a1}$ represents a $C_2$ to $C_6$ alkanediyl group where the carbon atom bonding to an oxygen atom is a primary or secondary carbon atom, and n represents an integer of 1 to 30.

Examples of the alkyl group for $R^{a10}$ and $R^{a12}$ include methyl, ethyl, propyl, butyl, pentyl and hexyl groups.

Examples of the alkoxy group for $R^{a10}$ include methoxy, ethoxy, propoxy, butoxy, pentyloxy and hexyloxy groups.

The hydrocarbon group for $R^{a11}$ may be an alkyl group, an alicyclic hydrocarbon group, an aromatic hydrocarbon group or a combination thereof.

Examples of the alkyl group include methyl, ethyl, propyl, butyl, pentyl, hexyl, heptyl, octyl, nonyl and decyl groups.

The alicyclic hydrocarbon group may include a monocyclic and polycyclic groups.

Examples of the monocyclic alicyclic hydrocarbon group include a cycloalkyl group such as cyclopentyl, cyclohexyl, cycloheptyl and cyclooctyl groups.

Examples of the polycyclic alicyclic hydrocarbon group include a decahydronaphtyl, adamantyl and norbornyl groups as well as the following groups. In each of the formulae, * represents a binding position.

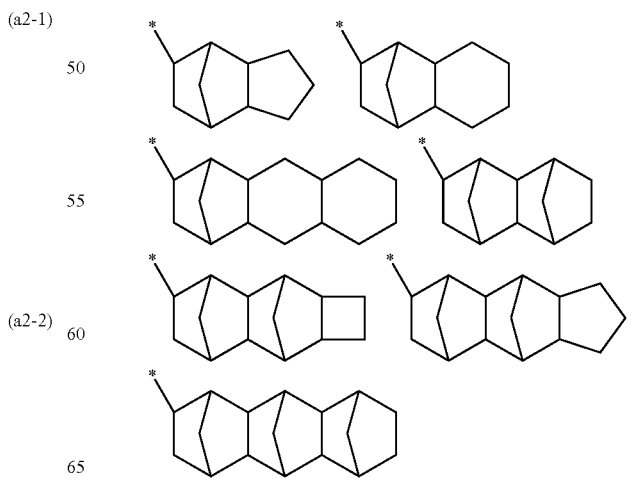

Examples of groups combining the alkyl group and the alicyclic hydrocarbon group include methylcyclohexyl, dimethylcyclohexyl, methylnorbornyl, cyclohexylmethyl, adamantylmethyl and norbornyletyl groups.

Examples of the aromatic hydrocarbon group include phenyl and naphthyl groups.

Examples of groups combining the alkyl group and the aromatic hydrocarbon group include an aralkyl group such as benzyl group.

Examples of the alkanediyl group for $L^{a1}$ include linear alkanediyl groups such as ethylene, propane-1,3-diyl, propane-1,2-diyl, butane-1,4-diyl, pentane-1,5-diyl, hexane-1,6-diyl, ethane-1,1-diyl, propane-1,1-diyl and propane-2,2-diyl groups; and branched alkanediyl groups such as propane-1,2-diyl, pentane-2,4-diyl, 2-methylpropane-1,3-diyl, pentane-1,4-diyl and 2-methylbutane-1,4-diyl groups.

$R^{a7}$ preferably represents a hydrogen atom.

$R^{a8}$ and $R^{a9}$ independently are preferably a methyl group.

$R^{a10}$ is preferably a $C_1$ to $C_4$ alkoxy group, more preferably a methoxy group or an ethoxy group, and still more preferably a methoxy group.

m' represents preferably 0 or 1, more preferably 0.

$R^{a11}$ represents preferably a $C_1$ to $C_6$ primary or secondary alkyl group.

$L^{a1}$ represents preferably a $C_2$ to $C_4$ alkanediyl group such as ethane-1,2-diyl, propane-1,3-diyl, propane-1,2-diyl and butane-1,4-diyl groups, more preferably an ethane-1,2-diyl group.

n represents preferably an integer of 1 to 10.

$R^{a12}$ represents preferably a $C_1$ to $C_3$ primary or secondary alkyl group.

Examples of the structural unit represented by formula (a2-1) preferably include those represented by formulae (a2-1-1), (a2-1-2), (a2-1-3) and (a2-1-4). The monomer which derives the structural unit (a1) is preferably monomers described in JP2010-204634A1.

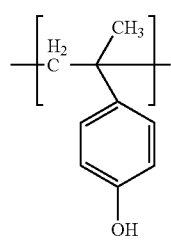

(a2-1-1)

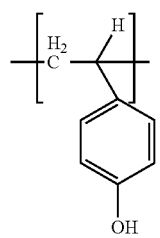

(a2-1-2)

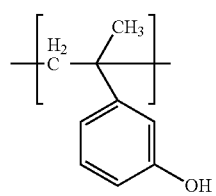

(a2-1-3)

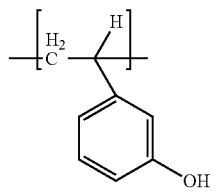

(a2-1-4)

Examples of the monomers which derive the structural units represented by formula (a2-2) include alkyl(meth)acrylates such as methyl(meth)acrylate, ethyl(meth)acrylate, propyl(meth)acrylate, butyl(meth)acrylate and hexyl(meth)acrylate;

cycloalkyl(meth)acrylates such as cyclopentyl(meth)acrylate and cyclohexyl(meth)acrylate;

polycyclic(meth)acrylates such as adamantyl(meth)acrylate, and aryl(meth)acrylates such as phenyl(meth)acrylate and benzyl(meth)acrylate.

Examples of the monomers which derive the structural units represented by formula (a2-3) include (meth)acrylates such as ethylene glycol monomethyl ether(meth)acrylate, ethylene glycol monoethyl ether(meth)acrylate, ethylene glycol monopropyl ether(meth)acrylate, ethylene glycol monobutyl ether(meth)acrylate, diethylene glycol monomethyl ether(meth)acrylate, triethylene glycol monomethyl ether(meth)acrylate, tetraethylene glycol monomethyl ether(meth)acrylate, pentaethylene glycol monomethyl ether(meth)acrylate, hexaethylene glycol monomethyl ether(meth)acrylate, nonaethylene glycol monomethyl ether(meth)acrylate, and octaethylene glycol monomethyl ether(meth)acrylate.

Further, examples of the monomers which derive the structural units represented by formula (a2) include acrylic acid, methacrylic acid, crotonic acid, 2-hydroxyethyl(meth)acrylate, 2-hydroxypropyl(meth)acrylate, styrene, α-methylstyrene, 4-methylstyrene, 2-methylstyrene, 3-methylstyrene, 4-methoxystyrene and 4-isopropoxystyrene.

Examples of the structural unit (a2) may include a structural unit represented by formula (a2-4). The structural unit is sometimes referred to as "structural unit (a2-4)".

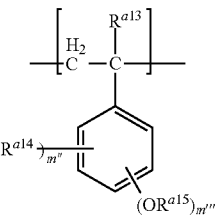

(a2-4)

In the formula, $R^{a13}$ represents a hydrogen atom or a methyl group, $R^{a14}$ in each occurrence independently represent a $C_1$ to $C_6$ alkyl group or a $C_1$ to $C_6$ alkoxy group, $R^{a15}$ in each occurrence independently represent a primary or a secondary $C_1$ to $C_{12}$ hydrocarbon group where a methylene group may be replaced by an oxygen atom or a carbonyl group, provided that the methylene group bonding to an oxygen atom may not be replaced by an oxygen, m" represents an integer of 0 to 4, and m''' represents an integer of 0 to 4, provided that the total number of m″ and m‴ is 5 or less.

The hydrocarbon group for $R^{a15}$ is a group in which the carbon atom bonding to an oxygen atom is not a tertiary carbon atom, that is, the carbon atom bonding to an oxygen atom has at least one atom other than the carbon atom such as a hydrogen atom.

The structural unit represented by formula (a2-4) does not include the structural unit (I) and the structural unit (a1-2).

Examples of the alkyl group and the alkoxy group for $R^{a14}$ are the same examples as the group described in $R^{a10}$.

Examples of the hydrocarbon group for $R^{a15}$ are the same examples as the group described in $R^{a11}$.

Among them, $R^{a15}$ is preferably a $C_1$ to $C_5$ liner or branched alkyl group, a $C_5$ to $C_{10}$ alicyclic hydrocarbon group and phenyl groups as well as a combination thereof, or these groups where a carbon atom bonding to an oxygen atom in these groups may be replaced by a carbonyl group.

Examples of the structural unit (a2-4) include the following ones.

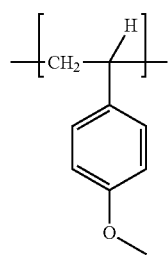
(a2-4-1)

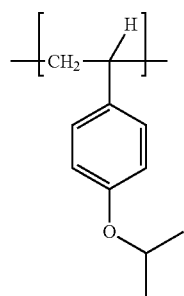
(a2-4-2)

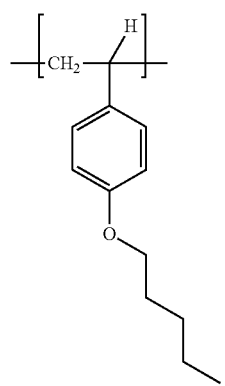
(a2-4-3)

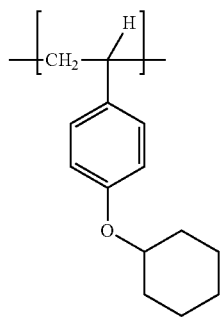
(a2-4-4)

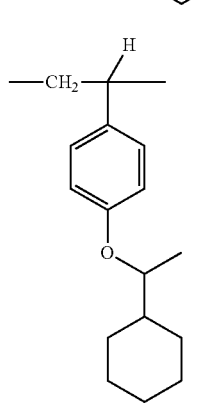
(a2-4-5)

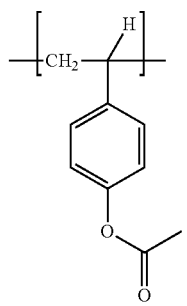
(a2-4-6)

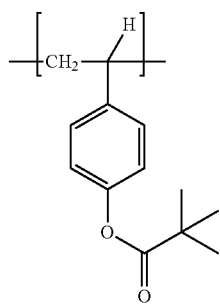
(a2-4-7)

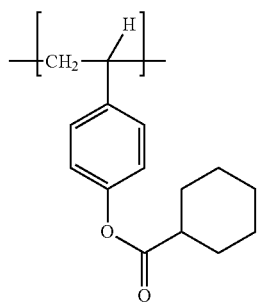
(a2-4-8)

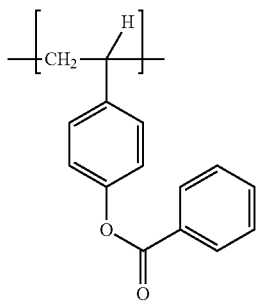 (a2-4-9)

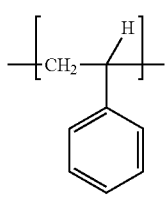 (a2-4-10)

Examples of the structural unit (a2-4) include the structural units represented by the above formulae in which a hydrogen atom corresponding to $R^{a13}$ has been replaced by a methyl group.

When the resin (A1) has the structural units (a2-1), (a2-2), (a2-3) and (a2-4), the total content of these is preferably 1 to 30% by mole, more preferably 1 to 25% by mole, still more preferably 5 to 25% by mole, and particularly preferably 5 to 20% by mole with respect to the total structural units (100% by mole) of the resin (A1).

When the resin (A1) has the structural unit (a2), the mole ratio of the structural unit (a1): the structural unit (a2) is preferably 10:90 to 80:20, more preferably 15:85 to 60:40, and still more preferably 15:85 to 45:55.

Examples of combinations of the structural units in the resin (A1) include the following ones.

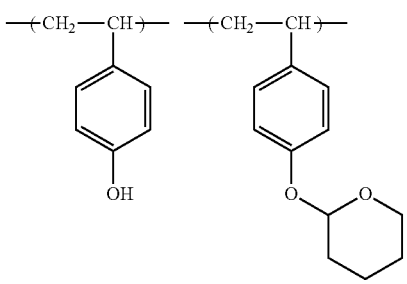 (A1-1)

(A1-2)

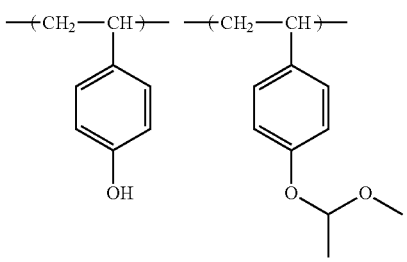 (A1-3)

(A1-4)

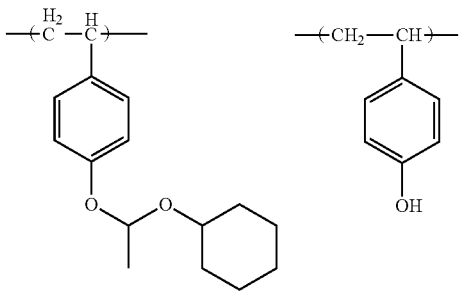 (A1-5)

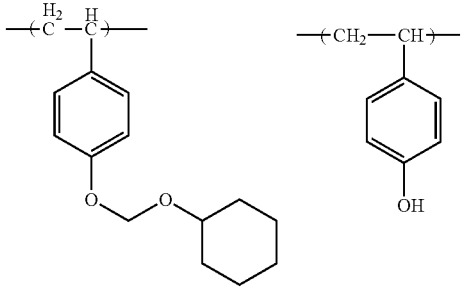 (A1-6)

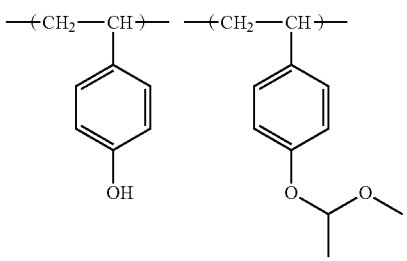 (A1-7)

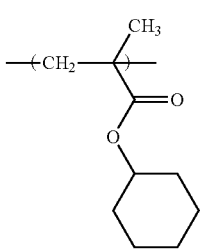

(A1-8)
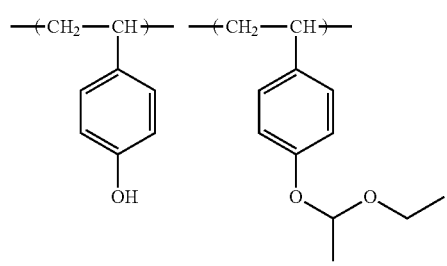
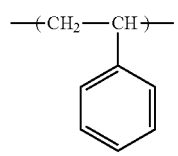
(A1-9)
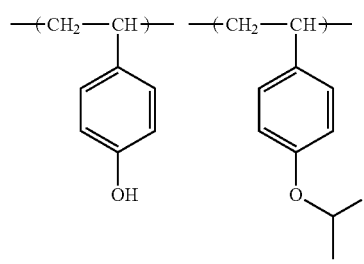
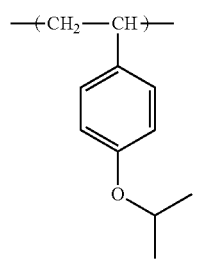
(A1-10)
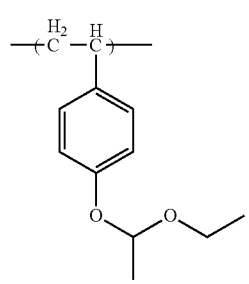
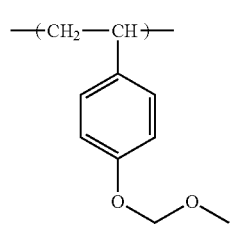
(A1-11)
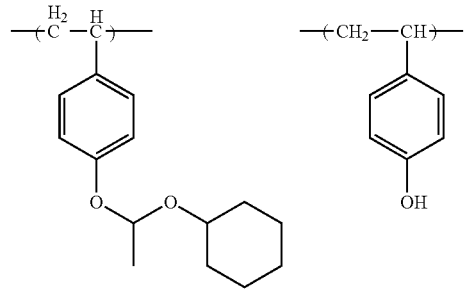
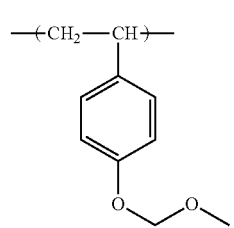
(A1-12)
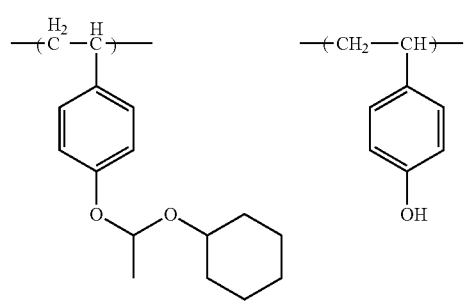
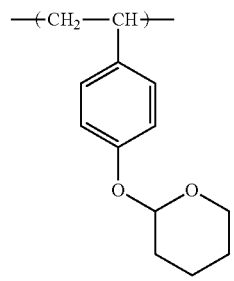
(A1-13)
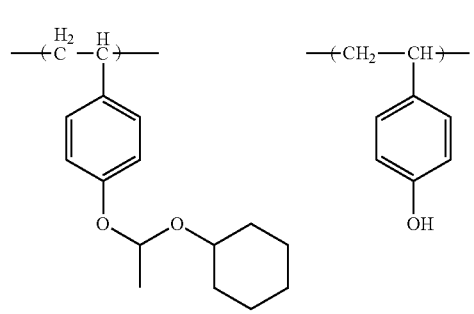
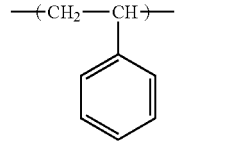

(A1-14)
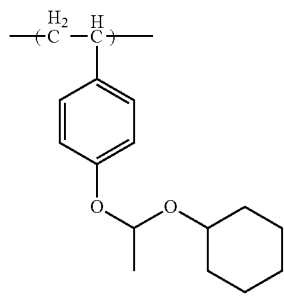 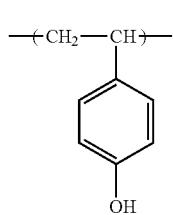
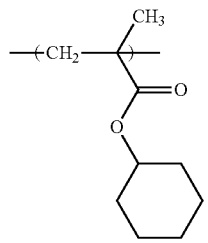
(A1-15)
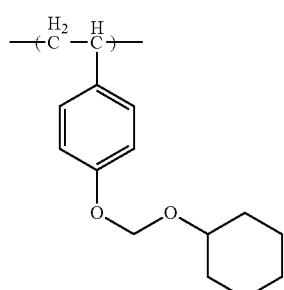 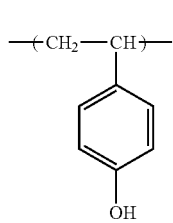
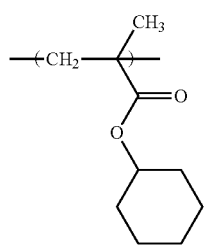
(A1-16)
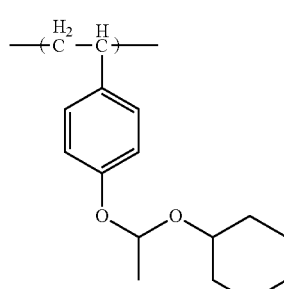 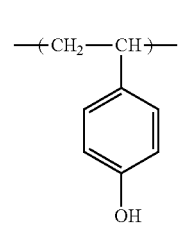
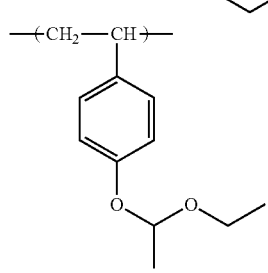
(A1-17)
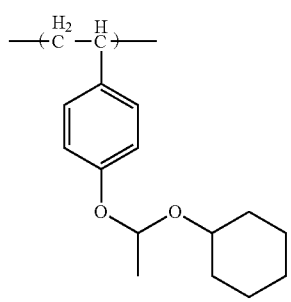 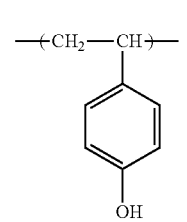
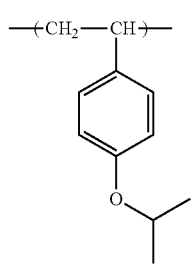
(A1-18)
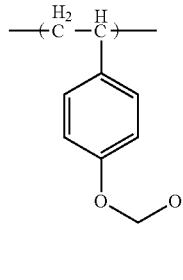 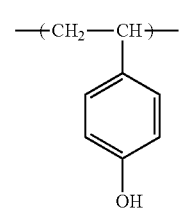
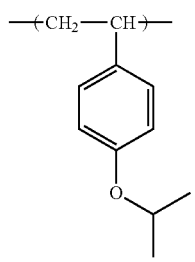
(A1-19)
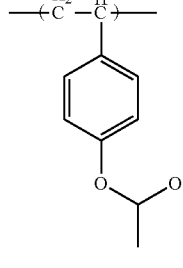 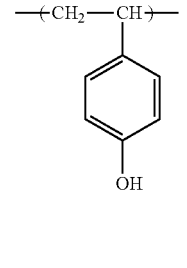

-continued
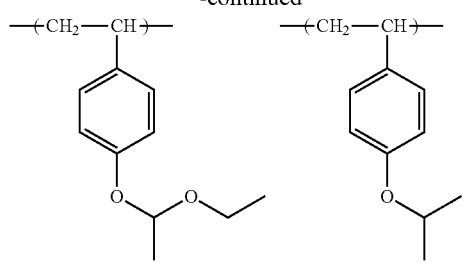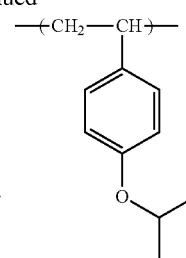
(A1-20)
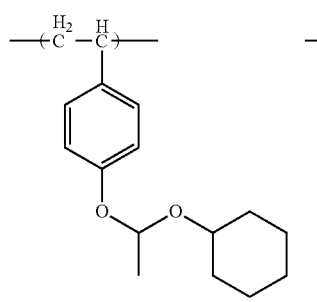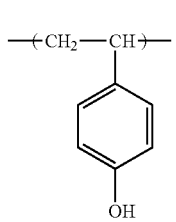
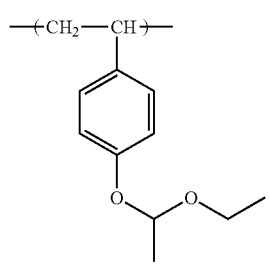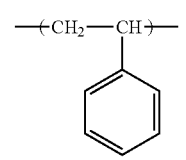
(A1-21)
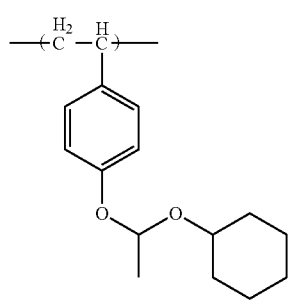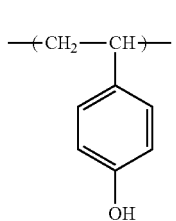
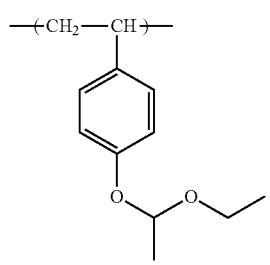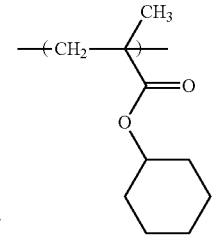
-continued
(A1-22)
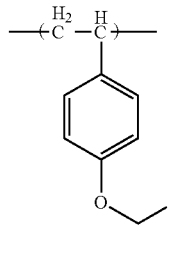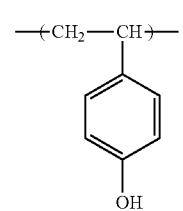
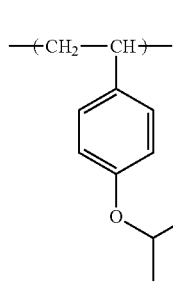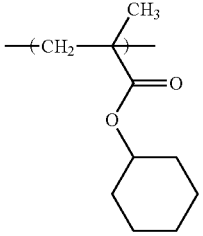
(A1-23)
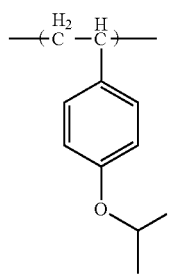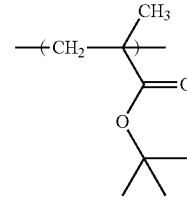
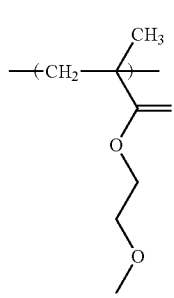
(A1-24)
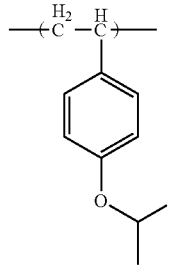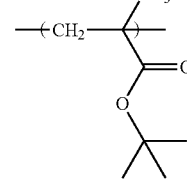

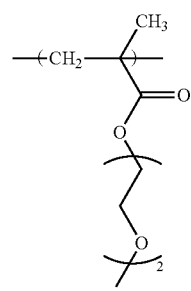
(A1-25)
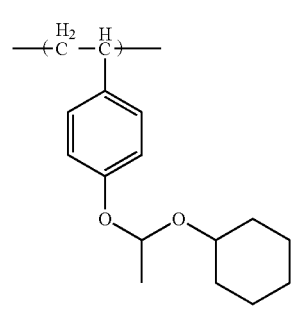
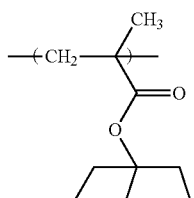
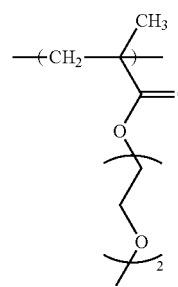
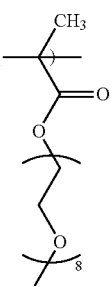
(A1-26)
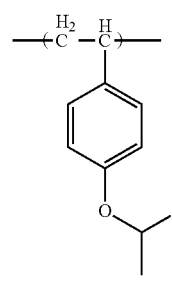
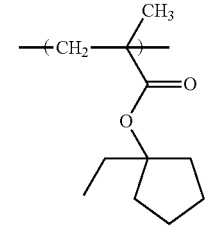
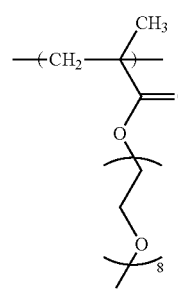
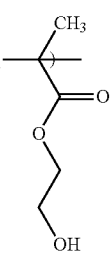
(A1-27)
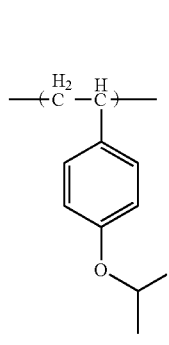
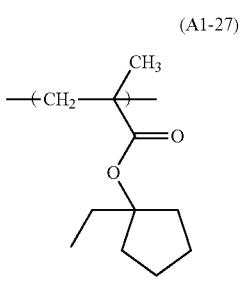
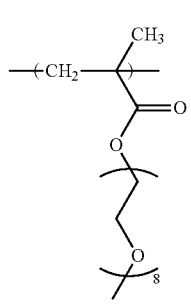
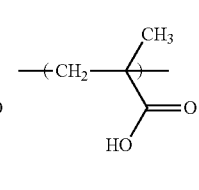
(A1-28)
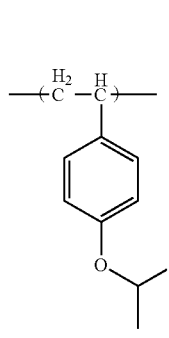
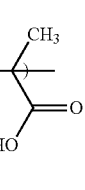
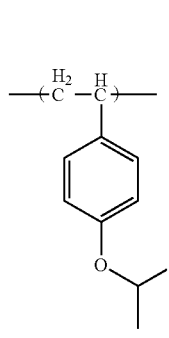
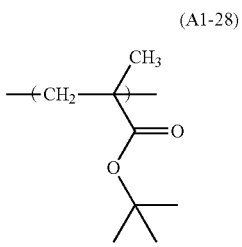
(A1-29)
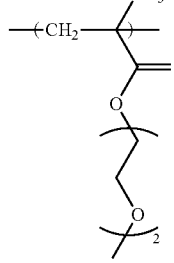
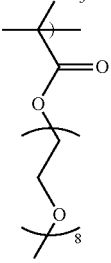

-continued
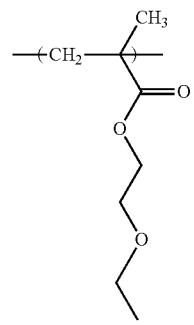
(A1-30)
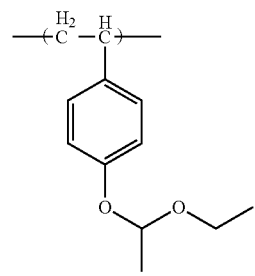
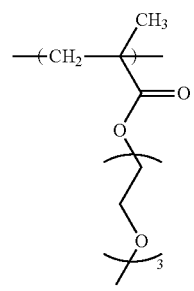
(A1-31)
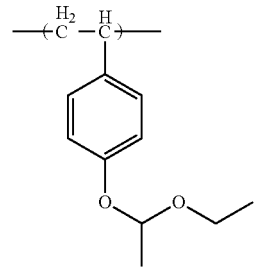
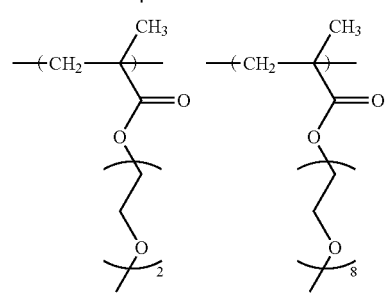
(A1-32)
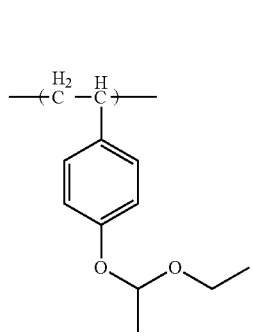
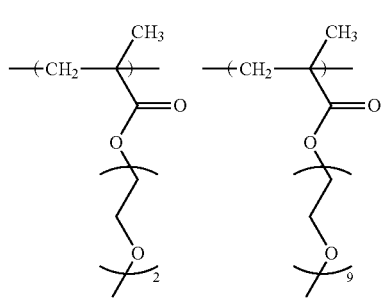
(A1-33)
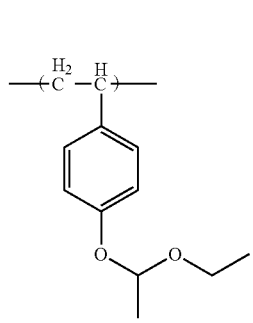
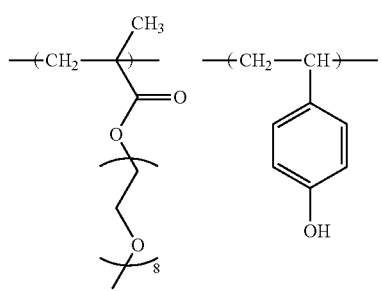
(A1-34)
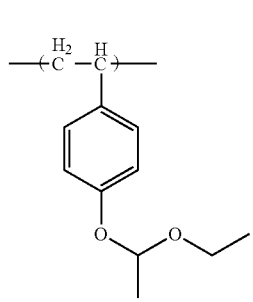

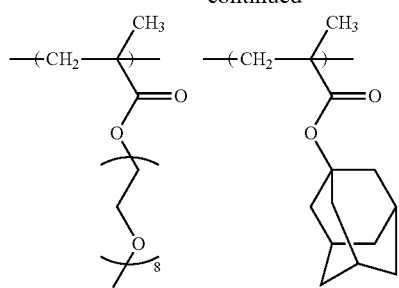
(A1-35)
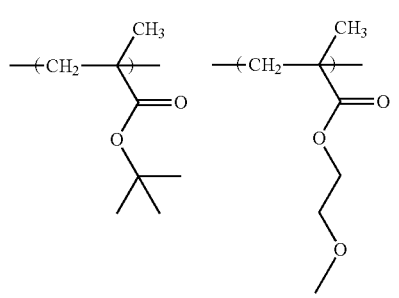
(A1-36)
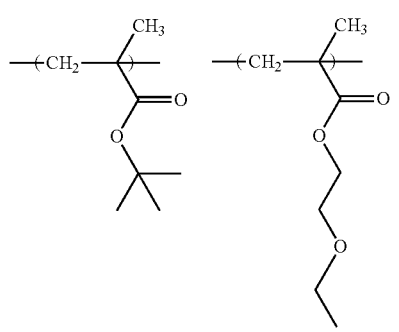
(A1-37)
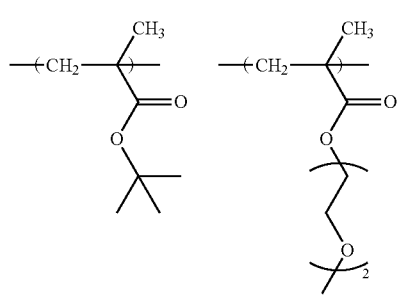
(A1-38)
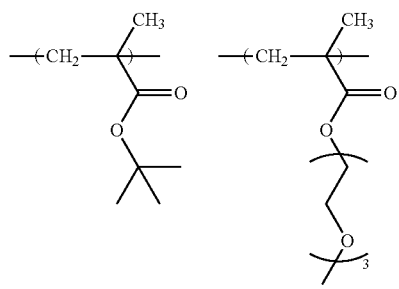
(A1-39)
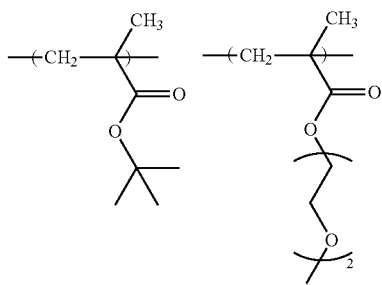
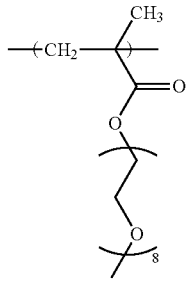
(A1-40)
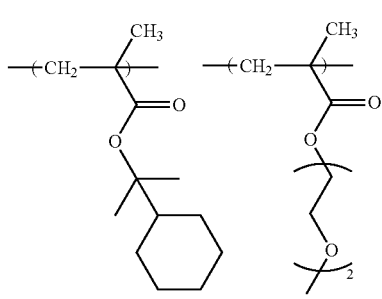
(A1-41)
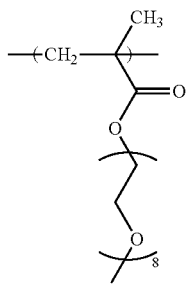
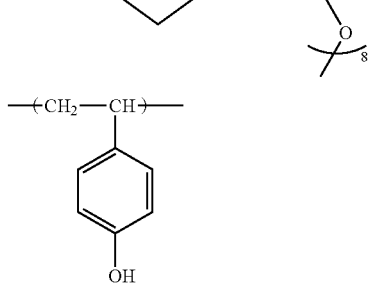

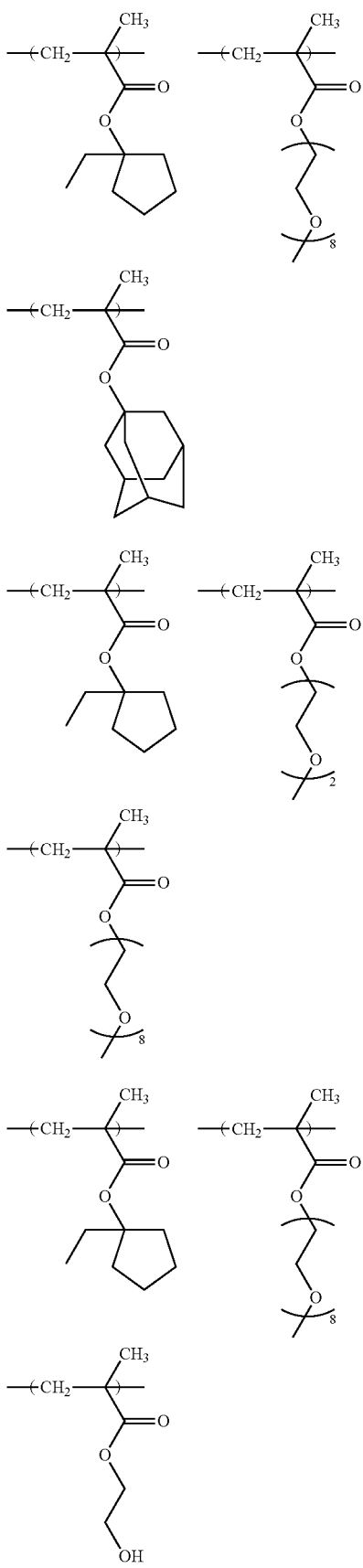

(A1-42)

(A1-43)

(A1-44)

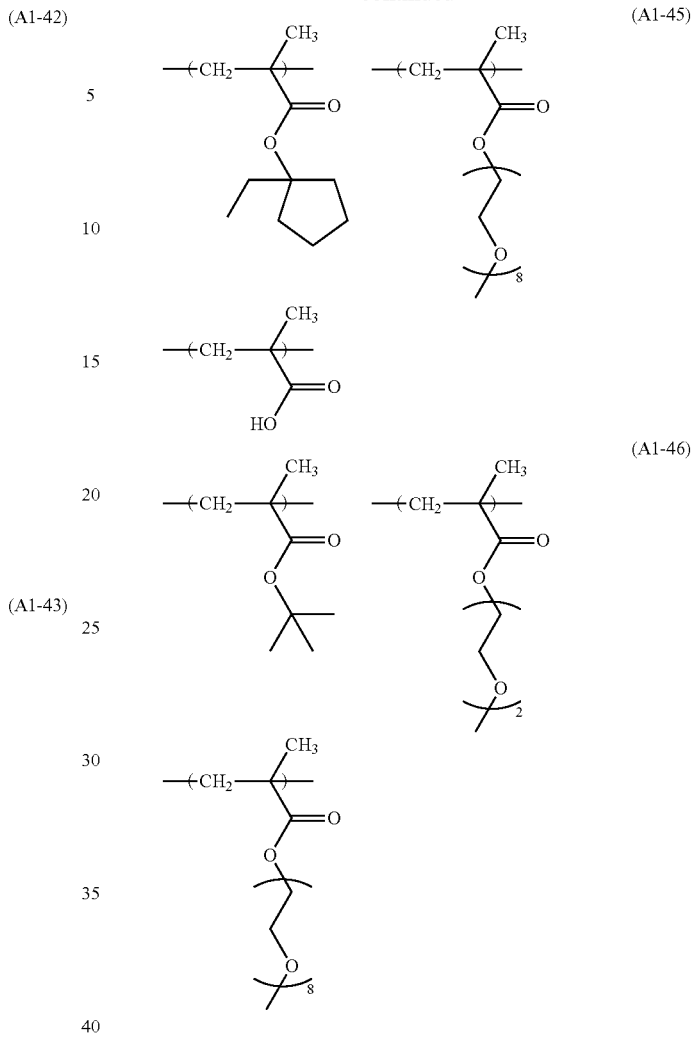

(A1-45)

(A1-46)

Examples of the structural units include structural units in which a hydrogen atom corresponding to $R^{a5}$ has been replaced by a methyl group, or a methyl group corresponding to $R^{a5}$ has been replaced by a hydrogen atom. The resin may have a structural units having a hydrogen atom and a structural units having a methyl group as $R^{a5}$.

The resin (A1) is preferably a resin having the structural unit (a1) and the structural unit (a2), more preferably the structural units (a1-1) and/or (a1-2) and the structural unit (a2).

The resin (A1) may be a resin obtained by reacting a resin which has one or both of a carboxy group and a phenolic hydroxyl group at its side chain with a compound which has at least two vinyloxy groups, which is sometimes referred to as "resin (A1b)".

The resin (A1b) is preferably a resin obtained by reacting a resin which has a phenolic hydroxyl group with a compound which has at least two vinyloxy groups. Such resin can be produced by reacting a resin which has the structural unit (a1-2) with the compound which has at least two vinyloxy groups. A novolak resin described below can be used as the resin having a phenolic hydroxyl group, and the resin (A1b) may be produced by reacting the above described novolak resin with the compound which has at least two vinyloxy groups. The resin (A1b) may be a resin obtained by reacting the compound which has at least two vinyloxy groups with a resin mixture containing a novolak resin and a resin having the structural unit (a1-2). Further, the resin (A1b) may be a combination of a resin which is obtained by reacting a resin having the structural unit (a1-2) with the above described the compound having at least two vinyloxy groups, with a resin which is obtained by reacting the novolak resin with the above described the compound having at least two vinyloxy groups.

In the synthesis of the resin (A1b), the mole ratio of the resin having a phenolic hydroxyl group and a carboxyl group: the compound having at least two vinyloxy groups may be 60 to 99:40 to 1, and preferably 70 to 95:30 to 5.

Specific examples of the resin (A1b) include the resins described in JP2008-134515A1 and JP 2008-46594A1.

Examples of the compound having at least two vinyloxy groups include 1,4-cyclohexanedimethanoldivinylether and ethyleneglycoldivinylether.

When the resin (A1b) contains the novolak resin as starting materials, the content thereof is 30 to 70% by mass with respect to the total mass of the resin (A1b).

The resin (A1) can be produced by polymerizing the above-mentioned monomers in a known manner such as radical polymerization.

The average weight molecule weight of the resin (A1) is preferably 8,000 or more, more preferably 10,000 or more, and preferably 600,000 or less, more preferably 500,000 or less, still more preferably 300,000 or less, further more preferably 100,000 or less. In the present specification, the weight average molecular weight is a value determined by gel permeation chromatography using polystyrene as the standard product. The detailed condition of this analysis is described in Examples.

The content of the resin (A1) in the resist composition is preferably 10% by mass or more, and more preferably 15% by mass or more, and preferably 95% by mass or less, and more preferably 85% by mass or less with respect to the total amount of solid components of the resist composition.

<Resin (A3)>

The resin (A3) is a resin having a structural unit represented by formula (I):

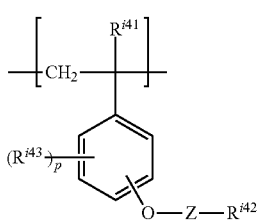
(I)

wherein $R^{i41}$ represents a hydrogen atom or a methyl group, $R^{i42}$ represents a $C_2$ to $C_7$ acyl group, a hydrogen atom or a $C_1$ to $C_{10}$ hydrocarbon group in which a hydrogen atom may be replaced by a hydroxy group, $R^{i43}$ in each occurrence independently represents a $C_1$ to $C_6$ alkyl group or a $C_1$ to $C_6$ alkoxy group, "p" represents an integer of 0 to 4, Z represents a divalent $C_3$ to $C_{20}$ hydrocarbon group having a group represented by formula (Ia), and a methylene group contained in the hydrocarbon group may be replaced by an oxygen atom, a sulfur atom or a carbonyl group:

$$*—[(CH_2)_w—O]_r— \quad (Ia)$$

wherein "w" and "r" each independently represents an integer of 1 to 10, and

* represent a bonding position, provided that $R^{i42}$ represents a $C_2$ to $C_7$ acyl group when "w" represents 1.

The hydrocarbon group may be an alkyl group, an alicyclic hydrocarbon group, an aromatic hydrocarbon group and a combination thereof.

Examples of the alkyl group include methyl, ethyl, propyl, butyl, pentyl, hexyl, heptyl and octyl groups.

The alicyclic hydrocarbon group may be monocyclic or polycyclic group. Examples of the monocyclic alicyclic hydrocarbon group include a cycloalkyl group such as cyclopentyl, cyclohexyl, cycloheptyl and cyclooctyl groups. Examples of the polycyclic alicyclic hydrocarbon group include decahydronaphthyl and norbornyl.

Examples of groups combining the alkyl group and the alicyclic hydrocarbon group include methylcyclohexyl, dimethylcyclohexyl, methylnorbornyl, methyladamantly, cyclohexylmethyl, methylcyclohexylmethyl, and norbornyl-methyl groups.

Examples of the aromatic hydrocarbon group include an aryl group such as phenyl, naphthyl, p-methylphenyl, p-tert-butylphenyl, 2,6-diethyl phenyl and 2-methyl-6-ethylphenyl groups.

Examples of the acyl group include acetyl, propionyl and butyryl groups.

Examples of the alkoxy group include methoxy, ethoxy, n-propoxy, iso propoxy, n-butoxy and tert-butoxy groups.

Examples of the divalent hydrocarbon group include an alkylene group, a divalent alicyclic hydrocarbon group, a divalent aromatic hydrocarbon group and a combination thereof as long as it has $*—[(CH_2)_w—O]_r$. The methylene group contained in the divalent hydrocarbon group may be replaced by an oxygen atom, a sulfur atom or a carbonyl group. Here, * represent a bonding position to an oxygen atom, "w" and "r" each independently represents an integer of 1 to 10.

"w" is preferably an integer of 2 to 10, and more preferably 2 to 5. Among them, $*—[(CH_2)_w—O]_r$ is preferably $*—[(CH_2)_2—O]_r—$ and $*—[(CH_2)_3—O]_r—$, and more preferably $*—[(CH_2)_2—O]_r—$. "r" is preferably an integer of 2 to 10, and more preferably 2 to 5.

Specific examples of Z include the following ones. * represent a bonding position to an oxygen atom, and ** represent a bonding position to $R^{i42}$.

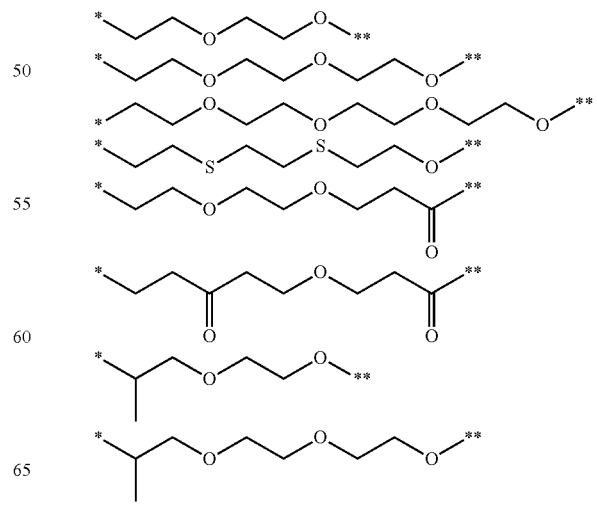

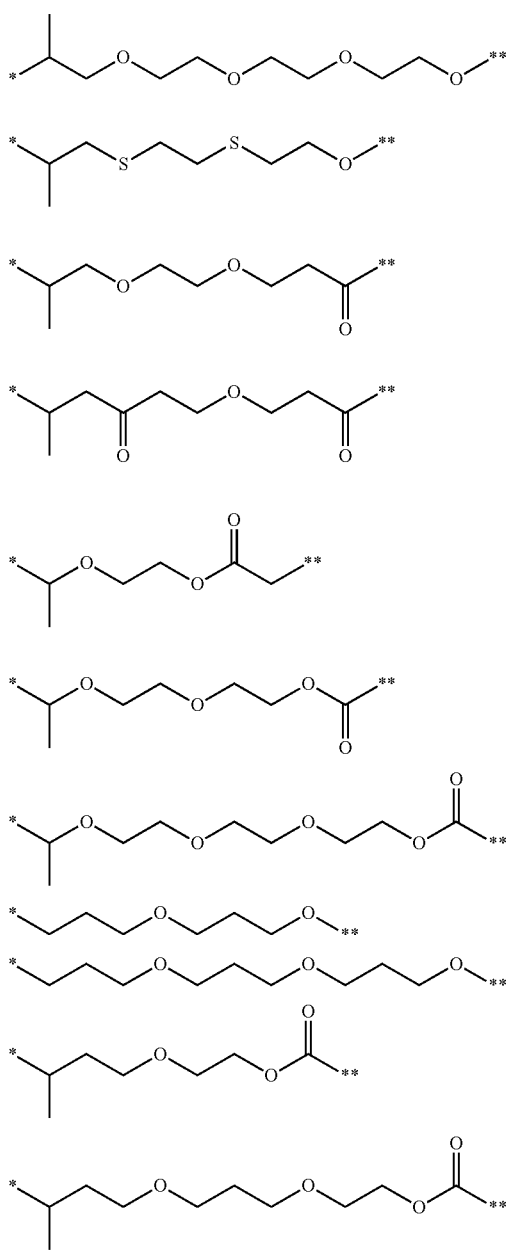

The structural unit represented by formula (I) is preferably structural units represented by formula (I-1) or formula (I-2):

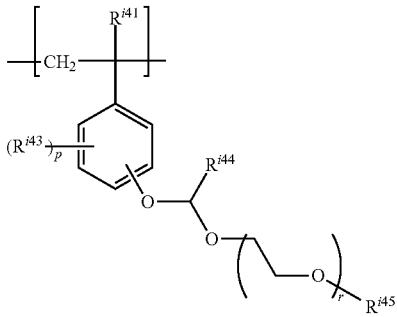

wherein $R^{i41}$, $R^{i42}$, $R^{i43}$, "p" and "r" are as defined above,
$R^{i44}$ represents a $C_1$ to $C_{10}$ hydrocarbon group,
$R^{i45}$ represents a $C_2$ to $C_7$ acyl group.
Examples of the hydrocarbon group for $R^{i44}$ are the same examples as the group described for $R^{i42}$.
Examples of $R^{i45}$ are the same examples as the acyl group described for $R^{i42}$.

Examples of the structural units (I) include the following ones.

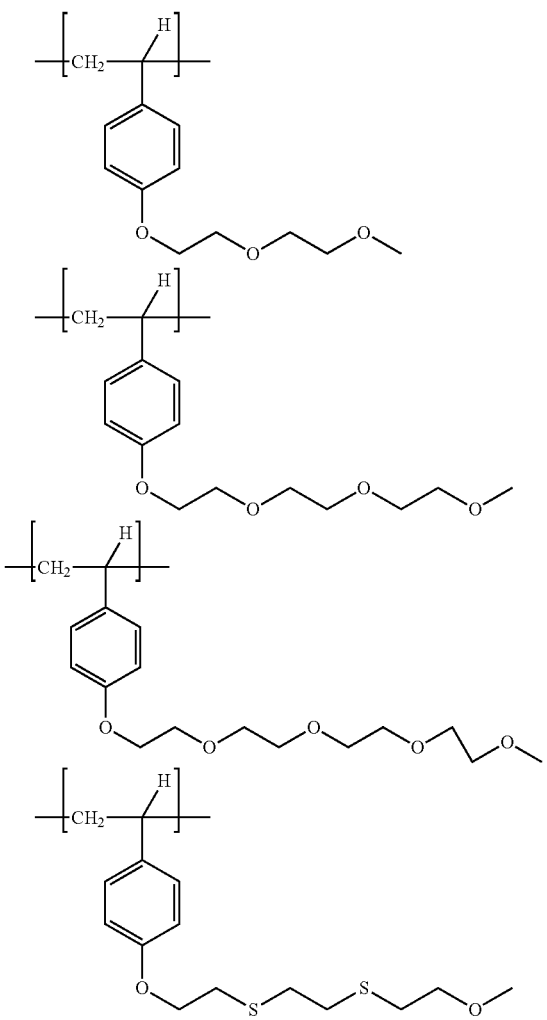

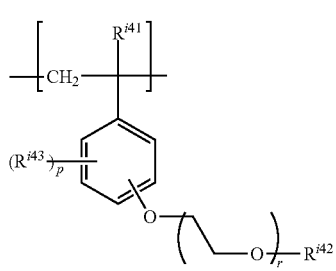

41
-continued
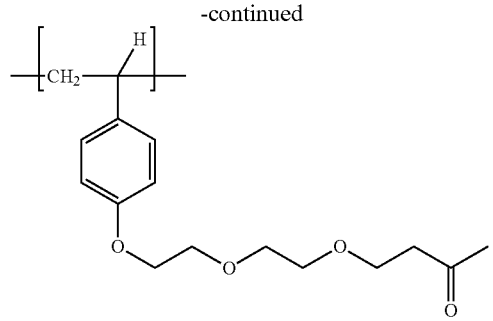
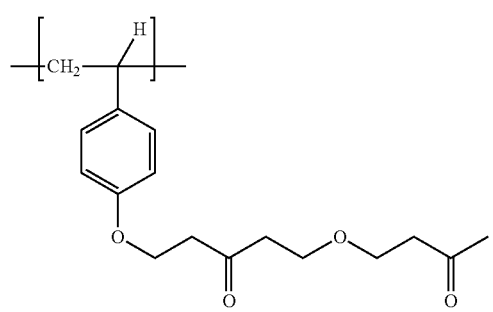
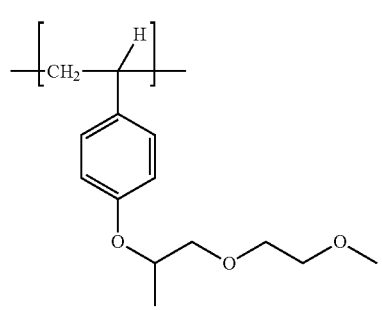
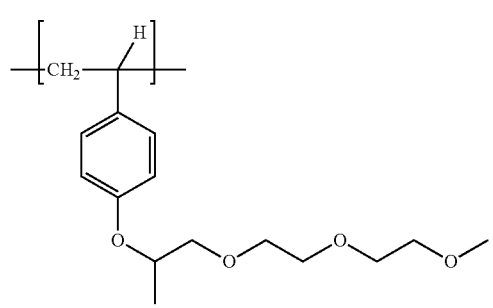
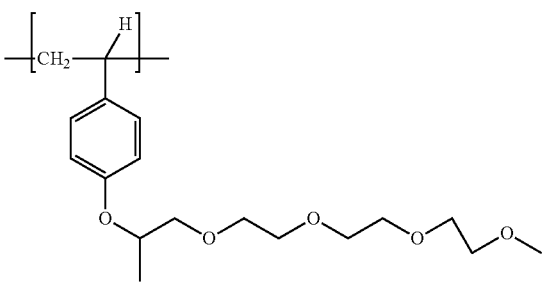
42
-continued
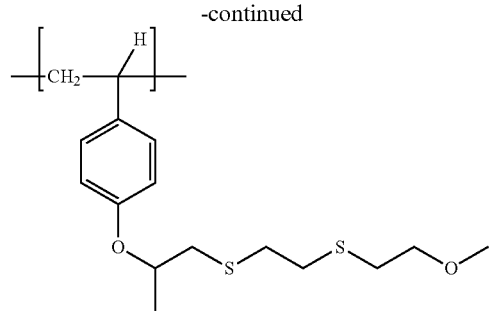
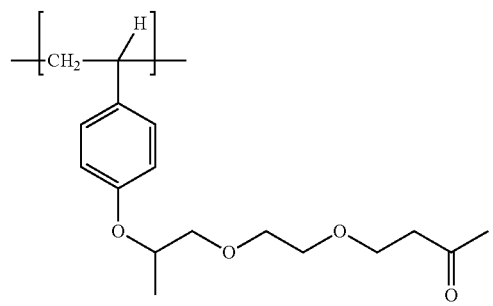
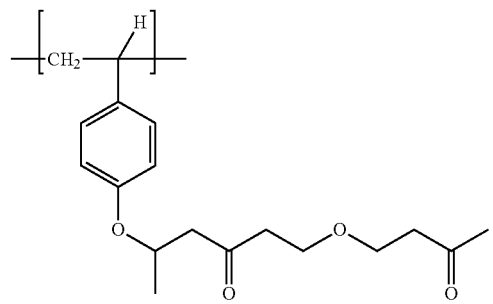
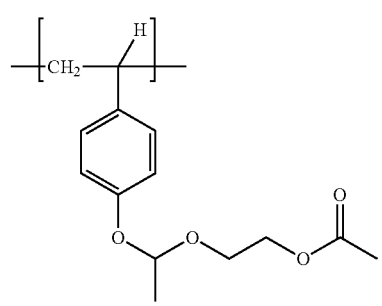
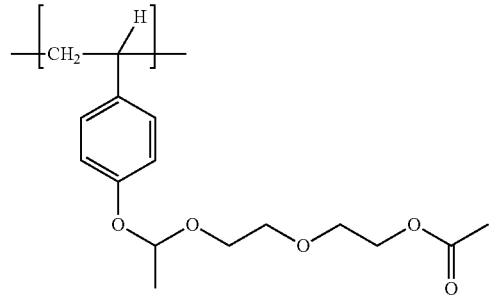

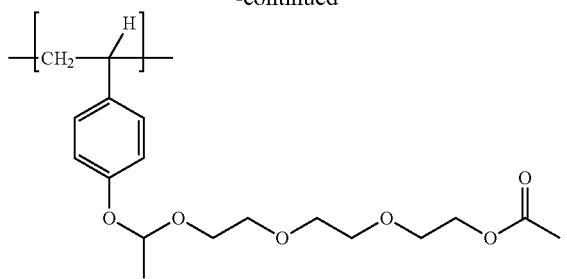

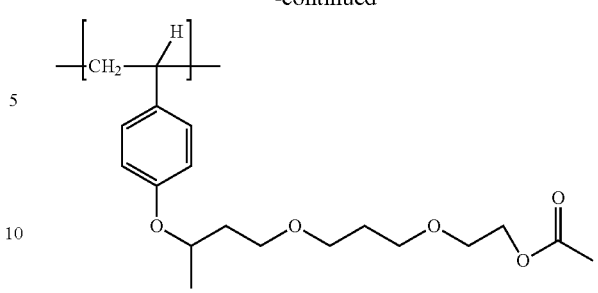

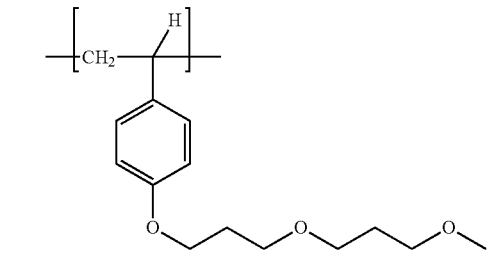

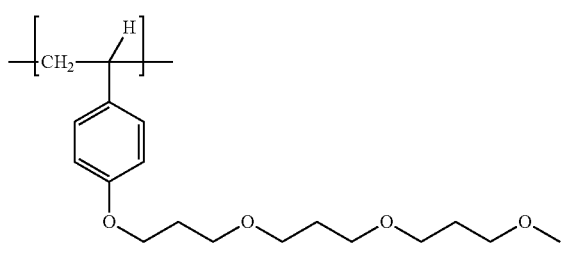

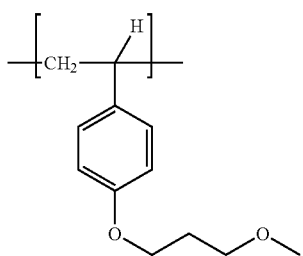

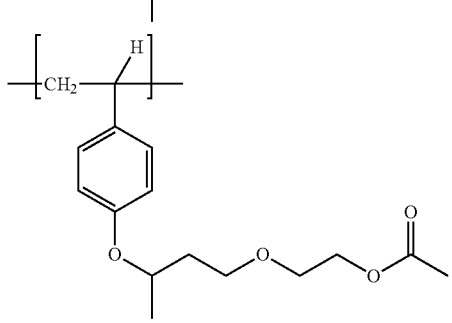

Examples of the structural unit include the structural units represented by the above formulae in which a hydrogen atom corresponding to $R^{i41}$ has been replaced by a methyl group.

<Method for Producing the Structural Unit (I)>

The structural unit (I) and a resin having thereof can be produced by a method as described below.

A monomer which derives the structural unit (I-2) can be obtained by reacting a compound represented by the formula (I-2a) with a compound represented by the formula (I-2b) in presence of a catalyst in a solvent.

Preferred examples of the solvent include ethyl acetate and methyl isobutyl ketone.

Preferred examples of the catalyst include the acidic catalyst such as p-toluene sulfonic acid and oxalic acid.

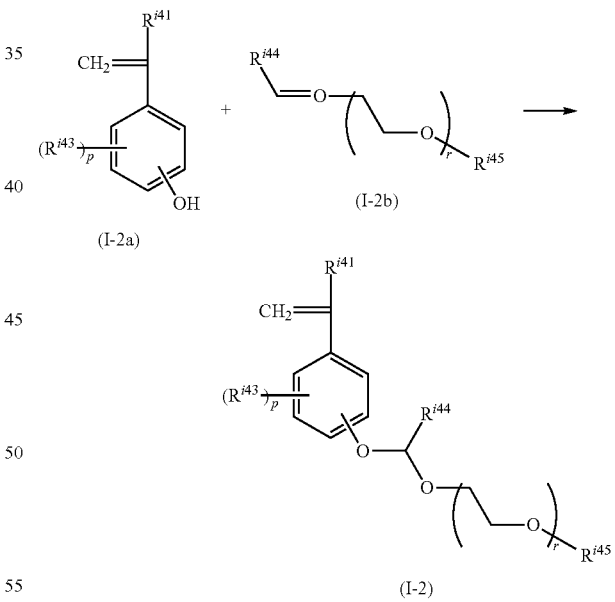

In the formulae, $R^{i41}$, $R^{i43}$, $R^{i44}$, $R^{i45}$, "p" and "r" are as defined above.

The reaction can be conducted at temperature of preferably 10 to 150° C. for 0.1 to 18 hours, and more preferably 10 to 120° C. for 0.5 to 12 hours.

Examples of the compound (I-2b) include a compound represented by formula (I-2b'), which can be obtained by protecting a hydroxy group of a compound represented by the formula (I-2c).

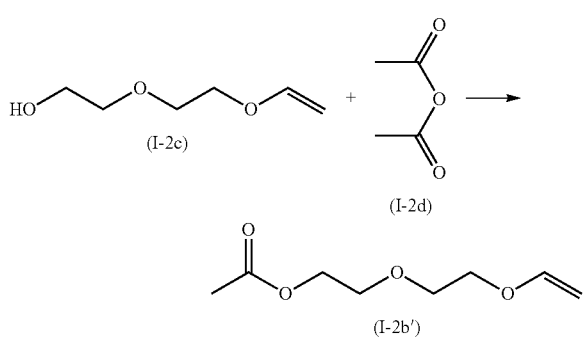

The compounds represented by formula (I-2c) and formula (I-2d) are available on the market.

The resin (A3) may further have a structural unit other than the structural unit represented by formula (I). Examples of such structural unit include the structural unit (a1) described above, the structural unit (a2), and another structural unit known in the art.

When the resin (A3) has the structural unit (a1), the content thereof is preferably 1 to 50% by mole, more preferably 5 to 45% by mole, and still more preferably 5 to 40% by mole, with respect to the total structural units (100% by mole) of the resin (A3).

When the resin (A3) has the structural unit (a2), the content thereof is preferably 1 to 50% by mole, more preferably 5 to 45% by mole, still more preferably 5 to 40% by mole, and further still more preferably 5 to 35% by mole, with respect to the total structural units (100% by mole) of the resin (A3).

The total content of the resin (A3) is preferably 3% by mass or more, and more preferably 5% by mass or more, preferably 50% by mass or less, and more preferably 40% by mass or less, with respect to the total resin content of the resist composition.

<Resin (A2)>

The resin (A2), that is the alkaline-soluble resin, means a resin which has an acid group and soluble in an alkaline developer. The acid group includes a carboxy group, a sulfo group or a phenolic-hydroxy group.

The alkaline-soluble resin includes known resins in the art such as a novolak resin, a resin having polymerization unit derived from a hydroxystylene which has the structural units (a2-1) and no structural unit (a1), a resin having polymerization unit derived from a (meth)acrylic acid and a polyalkylene glycol. The novolak resin is preferred. These may be used as a single resin or as a combination of two or more resins.

The novolak resin is a resin obtained by condensation of an aromatic hydrocarbon having a phenolic hydroxyl group (which is sometimes referred to as "phenolic compound") with an aldehyde in the presence of an acidic catalyst.

Examples of the phenolic compound include phenol, o-cresol, m-cresol or p-cresol, 2,3-xylenol, 2,5-xylenol, 3,4-xylenol, 3,5-xylenol, 2,3,5-trimethylphenol, 2-tert-butylphenol, 3-tert-butylphenol, 4-tert-butylphenol, 2-tert-butyl-4-methylphenol, 2-tert-butyl-5-methylphenol, 2-methylresorcinol, 4-methylresorcinol, 5-methylresorcinol, 2-methoxyphenol, 3-methoxyphenol, 4-methoxyphenol, 2,3-dimethoxyphenol, 2,5-dimethoxyphenol, 3,5-dimethoxyphenol, 2-methoxyresorcinol, 4-tert-butylcatechol, 2-ethylphenol, 3-ethylphenol, 4-ethylphenol, 2,5-diethylphenol, 3,5-diethylphenol, 2,3,5-triethylphenol, 2-naphthol, 1,3-dihydroxynaphthalene, 1,5-dihydroxynaphthalene, 1,7-dihydroxynaphthalene and a polyhydroxy triphenylmethane compound which can be obtained by condensation of xylenol and hydroxybenzaldehyde. These may be used as a single compound or as a combination of two or more compounds.

Among them, the phenolic compound is preferably o-cresol, m-cresol, p-cresol, 2,3-xylenol, 2,5-xylenol, 3,4-xylenol, 3,5-xylenol, 2,3,5-trimethylphenol, 2-t-butylphenol, 3-t-butylphenol, 4-t-butylphenol, 2-t-butyl-4-methylphenol and 2-t-butyl-5-methylphenol.

Examples of the aldehyde include aliphatic aldehydes such as formaldehyde, acetaldehyde, propionaldehyde, n-butylaldehyde, isobutylaldehyde, acrolein and croton aldehyde; alicyclic aldehydes such as cyclohexanealdehyde, cyclopentanealdehyde and furylacrolein; aromatic aldehydes such as furfural, benzaldehyde, o-, m- or p-methylbenzaldehyde, p-ethylbenzaldehyde, 2,4-, 2,5-, 3,4- or 3,5-dimethylbenzaldehyde and o-, m- or p-hydroxybenzaldehyde; and aromatic aliphatic aldehydes such as phenylacetaldehyde and cinnamaldehyde. These may be used as a single compound or as a combination of two or more compounds.

Among them, formaldehyde is preferred in view of easy industrial availability.

Examples of the catalyst for condensation includes inorganic acids such as hydrochloric acid, sulfuric acid, perchloric acid and phosphoric acid; organic acid such as formic acid, acetic acid, oxalic acid, trichloroacetic acid and p-toluenesulfonic acid; divalent metal salts such as zinc acetate, zinc chloride and magnesium acetate. These may be used as a single compound or as a combination of two or more compounds.

The amount of the catalyst to be used is usually from 0.01 to 1 mole per 1 mole of aldehyde.

The condensation reaction can be carried out in a known manner. The condensation reaction can be carried out at the temperature in the range of 60 to 120° C. for 2 to 30 hours. The condensation can be carried out in the presence of a solvent such as methyl ethyl ketone, methyl isobutyl ketone and acetone. After condensation reaction, a water-insoluble solvent is added to the reaction mixture, as needed, the reaction mixture is washed with water, and then concentrated, whereby collecting a novolak resin.

The weight average molecular weight of the novolak resin is preferably 3,000 to 10,000, more preferably 6,000 to 9,000 and still more preferably 7,000 to 8,000. When falling within these ranges, it is possible to effectively prevent the thinning film and the remaining residues after development.

The resin having polymerization unit derived from a hydroxystylene is typically polyvinylphenol, and preferably poly-p-vinylphenol, such as a resin having the structural unit (a2-1). The polyvinylphenol can be obtained by polymerization of monomers described in JP2010-204634A1.

The resin having polymerization unit derived from a (meth)acrylic acid can be obtained by a known polymerization of the following ones as monomers, which may be used as a single monomer or as a combination of two or more monomers;

monomer having a carboxy group such as (meth)acrylic acid;

monomer having a hydroxy group such as 2-hydroxyethyl (meth)acrylate, 2-hydroxypropyl (meth) acrylate;

monomer having multiple ether bonds, polyethylene glycol monomethyl ether (meth)aclylates such as diethylene glycol monomethyl ether (meth)acrylate, triethylene glycol monomethyl ether (meth)acrylate, tetraethylene glycol monomethyl ether (meth)acrylate, pentaethylene glycol monomethyl ether (meth)acrylates, hexa ethylene glycol monomethyl ether (meth)acrylate, heptaethylene glycol monomethyl ether (meth)acrylate, octaethylene glycol monomethyl ether (meth)acrylate, nonaethylene glycol monomethyl ether (meth acrylate.

The above monomers may be used in combination with the following ones;

(meth)acrylic acid alkyl esters such as methyl (meth) acrylate, ethyl (meth)acrylate, tert-butyl (meth)acrylate;

(meth) acrylic acid cycloalkyl esters such as cyclopentyl (meth) acrylate, cyclohexyl (meth) acrylate;

polycyclic (meth)acrylic acid esters such as adamantyl (meth)acrylate;

ethylene glycol monoalkyl ether (meth)acrylates such as ethylene glycol monomethyl ether (meth)acrylate, ethylene glycol monoethyl ether (meth)acrylate, ethylene glycol monopropyl ether (meth)acrylate, ethylene glycol monobutyl ether (meth)acrylate.

The content of the resin (A2) in the resist composition is preferably 10% by mass or more, and more preferably 20% by mass or more, and preferably 70% by mass or less, and more preferably 65% by mass or less with respect to the total amount of the resin contained in the resist composition.

<Acid Generator (B)>

The resist composition of the disclosure contains an acid generator (B).

The acid generator is a compound which can be decomposed by light to generate an acid. The acid acts catalytically to the resin (A) and eliminate a leaving group which is detached by contacting with an acid from the resin (A). The acid generators may be either ionic or non-ionic one.

Examples of the non-ionic acid generator include organic halide, sulfonate esters (e.g., 2-nitrobenzoate, aromatic sulfonate, oxime sulfonate, N-sulfonyloxyimide, sulfonyl oxyketone, diazonaphthoquinone 4-sulfonate) and sulfone (e.g., disulfone, ketosulfone, sulfonyldiazomethane). Examples of the ionic acid generator include an onium salt containing an onium cation (e.g., adiazonium salt, a phosphonium salt, a sulfonium salt, an iodonium salt). Examples of an anions of the onium salts include a sulfonic acid anion, a sulfonylimide anion and a sulfonylmethide anion.

The acid generator includes compounds which generate an acid upon radiation, which are described in JP63-26653A1, JP 55-164824A1, JP62-69263A1, JP63-146038A1, JP63-163452A1, JP 62-153853A1, JP63-146029A1, U.S. Pat. No. 3,779,778, U.S. Pat. No. 3,849,137, German patent No. 3914407 and European patent No. 126712. The acid generator is available on the market, or it can be prepared by a known method.

The non-ionic acid generator is preferably a compound which has a group represented by formula (B1):

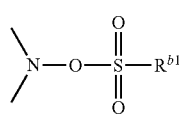

(B1)

wherein $R^{b1}$ represents a $C_1$ to $C_{18}$ hydrocarbon group that may have a fluorine atom, and a methylene group contained in the hydrocarbon group may be replaced by an oxygen atom or a carbonyl group.

The nitrogen atom in formula (B1) may have a double bond, although it is not illustrated therein.

The $C_1$ to $C_{18}$ hydrocarbon group may be an aliphatic hydrocarbon group, an alicyclic hydrocarbon group, an aromatic hydrocarbon group and a combination thereof.

Examples of the aliphatic hydrocarbon group include an alkyl groups such as methyl, ethyl, propyl, butyl, pentyl, hexyl, heptyl octyl, nonyl and decyl groups.

Examples of the alicyclic hydrocarbon group include cyclopropyl, cyclobutyl, cyclopentyl, cyclohexyl, cycloheptyl, cyclooctyl and adamantyl groups.

Examples of the aromatic hydrocarbon group include a $C_6$ to $C_{18}$ aryl group such as phenyl, naphthyl, anthryl, p-methylphenyl, p-tert-butylphenyl, p-adamantylphenyl, tolyl, xylyl, cumenyl, mesityl, biphenyl, phenanthryl, 2,6-diethylphenyl and 2-methyl-6-ethylphenyl groups.

The hydrocarbon group is preferably a $C_1$ to $C_{10}$ alkyl group or a $C_6$ to $C_{10}$ aromatic hydrocarbon group, and more preferably a $C_1$ to $C_8$ alkyl group, and still more preferably a $C_1$ to $C_4$ alkyl group.

Examples of the hydrocarbon group in which a methylene group is replaced by an oxygen atom or a carbonyl group includes those represented by formulae (Y1) to (Y12), preferably those represented by formulae (Y7) to (Y9), more preferably one represented by formula (Y9):

(Y1)

(Y2)

(Y3)

(Y4)

(Y5)

(Y6)

(Y7)

(Y8)

(Y9)
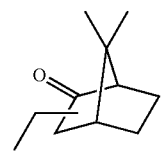

(Y10)
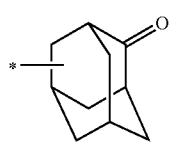

(Y11)
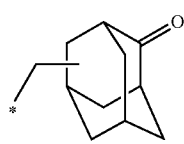

(Y12)
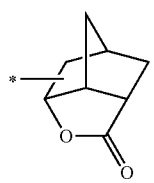

wherein "*" represents a binding position.

Examples of the hydrocarbon group which has a fluorine atom include fluoroalkyl groups such as fluoromethyl, fluoroethyl, fluoropropyl, fluorobutyl, fluoropentyl, fluorohexyl, fluoroheptyl, fluorooctyl, fluorononyl and fluorodecyl groups; alicyclic fluorohydrocarbon groups such as cyclofluoropropyl, cyclofluorobutyl, cyclofluoropentyl, cyclofluorohexyl, cyclofluoroheptyl, cycloperfluorooctyl and fluoroadamantyl groups; fluoroaryl groups such as fluorophenyl, fluoronaphthyl and fluoroanthryl groups.

The hydrocarbon group which has a fluorine atom is preferably a $C_1$ to $C_{10}$ alkyl group which has a fluorine atom and a $C_6$ to $C_{10}$ aromatic hydrocarbon group which has a fluorine atom, and more preferably a $C_1$ to $C_8$ perfluoroalkyl group, and still more preferably a $C_1$ to $C_4$ perfluoroalkyl group.

Examples of the compound represented by formula (B1) includes the compounds represented by formulae (b1), (b2) and (b3), preferably the compounds represented by formulae (b1) and (b2), more preferably the compounds represented by formula (b1).

(b1)
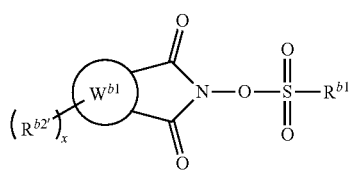

(b2)
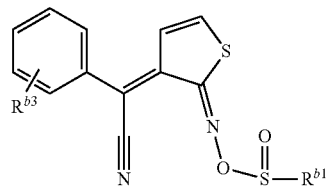

(b3)
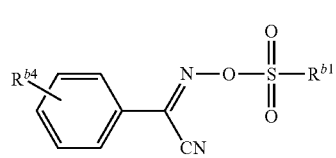

In the formulae, $R^{b1}$ is as the defined above, $R^{b2'}$, $R^{b3}$ and $R^{b4}$ in each occurrence independently represent a hydrogen atom, a $C_1$ to $C_8$ alkyl group or a $C_1$ to $C_8$ alkoxy group, and ring $W^{b1}$ represents a $C_6$ to $C_{14}$ aromatic hydrocarbon ring or a $C_6$ to $C_{14}$ aromatic heterocyclic group; and "x" represents an integer of 0 to 2.

Examples of the alkyl group include methyl, ethyl, propyl, butyl and pentyl groups, preferably a methyl group.

Examples of the alkoxy group include methoxy, ethoxy, propoxy, butoxy, and pentyloxy groups, preferably a methoxy group.

Examples of the aromatic hydrocarbon ring include benzene, naphthalene and anthracene rings.

Examples of the aromatic heterocyclic group include a six-membered to fourteen-membered ring, which preferably includes the following ones:

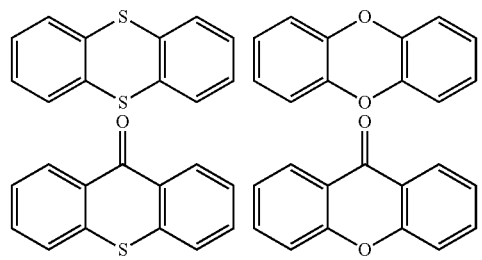

Examples of the substituent which may bind to the ring $W^{b1}$ includes a $C_1$ to $C_5$ alkyl group.

The ring $W^{b1}$ is preferably a naphthalene ring.

The compound represented by formula (b1) is preferably a compound represented by any one of formulae (b4) to (b7), more preferably a compound represented by formula (b4).

(b4)
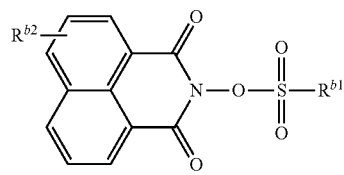

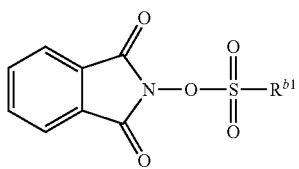
(b5)
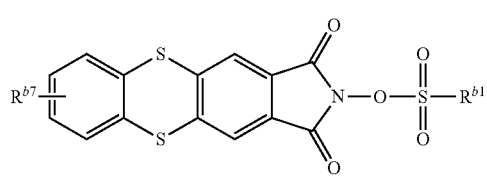
(b6)
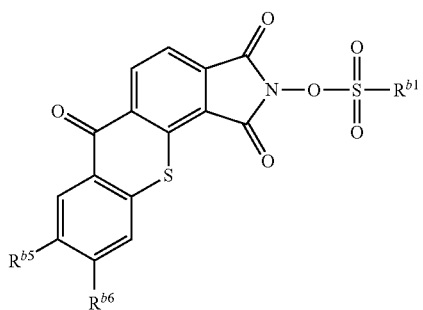
(b7)
In the formulae,
R$^{b1}$ is as defined above,
R$^{b2}$, R$^{b5}$, R$^{b6}$ and R$^{b7}$ each independently represent a hydrogen atom, or a C$_1$ to C$_8$ alkyl group.
Examples of the compound represented by formula (b1) include preferably those represented by formulae (b1-1) to (b1-14), more preferably those represented by formulae (b1-6) and (b1-7).
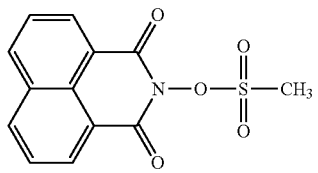
(b1-1)
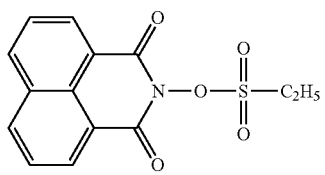
(b1-2)
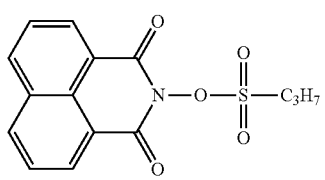
(b1-3)
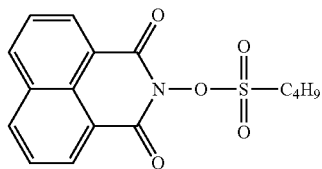
(b1-4)
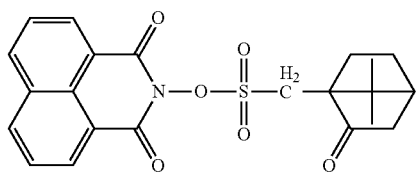
(b1-5)
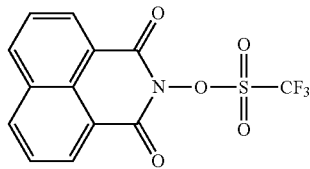
(b1-6)
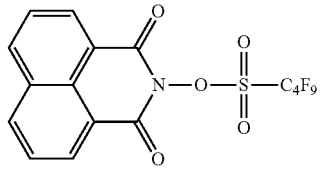
(b1-7)
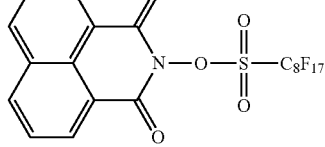
(b1-8)
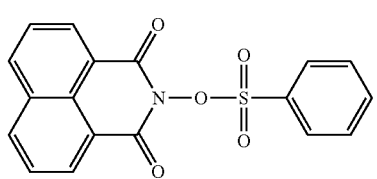
(b1-9)
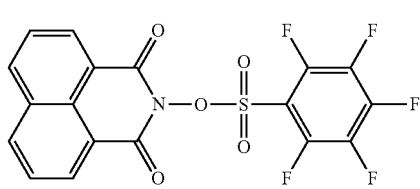
(b1-10)
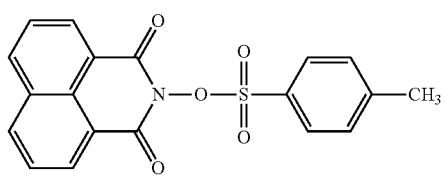
(b1-11)
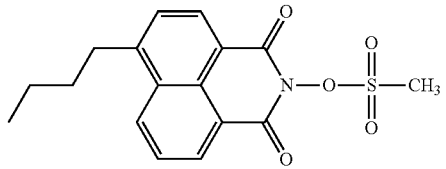
(b1-12)

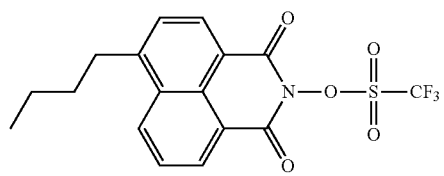

(b1-13)

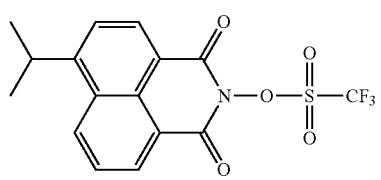

(b1-14)

Examples of the compound represented by formula (b3) include the following ones.

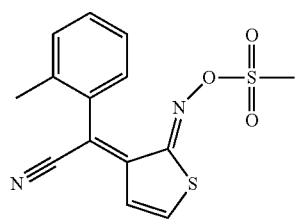

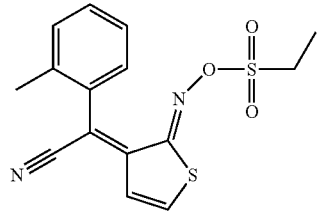

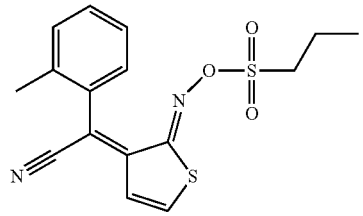

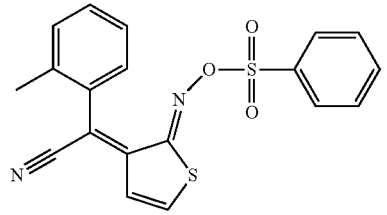

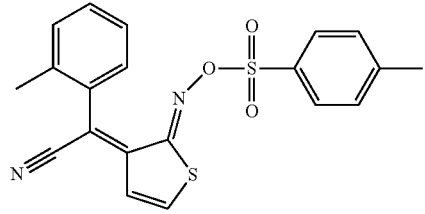

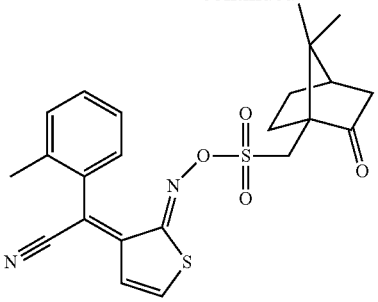

The ionic acid generator is preferably a compound represented by formula (b8) or (b9):

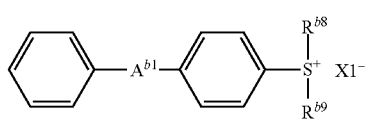

(b8)

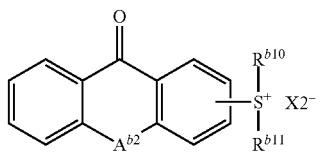

(b9)

wherein $A^{b1}$ and A each independently represent an oxygen atom or a sulfur atom, $R^{b8}$, $R^{b9}$, $R^{b10}$ and $R^{b11}$ each independently represent a $C_1$ to $C_{10}$ alkyl group or a $C_6$ to $C_{12}$ aromatic hydrocarbon group, and $X1^-$ and $X2^-$ each independently represent an organic anion.

Examples of the alkyl group include methyl, ethyl, propyl, butyl, pentyl, hexyl, heptyl group and octyl groups.

Examples of the aromatic hydrocarbon groups include an aryl group such as phenyl, naphthyl, anthryl, p-methylphenyl, p-tert-buthylphenyl, p-adamantylphenyl, tolyl, xylyl, cumenyl, mesityl, biphenyl, phenanthryl, 2,6-diethylphenyl and 2-methyl-6-ethylphenyl groups.

$R^{b8}$, $R^{b9}$, $R^{b10}$ and $R^{b11}$ are each independently preferably a $C_6$ to $C_{12}$ aromatic hydrocarbon group, more preferably a phenyl group.

Examples of the organic anion for X1⁻ and X2⁻ include a sulfonic acid anion, a bis(alkylsulfonyl)amide anion and a tris(alkylsulfonyl) methide anion. The sulfonic acid anion is preferred, and the sulfonic acid anion represented by formula (b10) is more preferred.

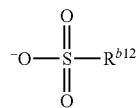
(b10)

In the formula, $R^{b12}$ represents a $C_1$ to $C_{18}$ hydrocarbon group that may have a fluorine atom, and a methylene group contained in the hydrocarbon group may be replaced by an oxygen atom or a carbonyl group.

Examples of $R^{b12}$ include the same ones as the group of $R^{b1}$.

Examples of the compound represented by formula (b9) include the following ones.

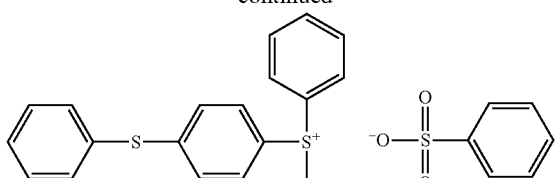

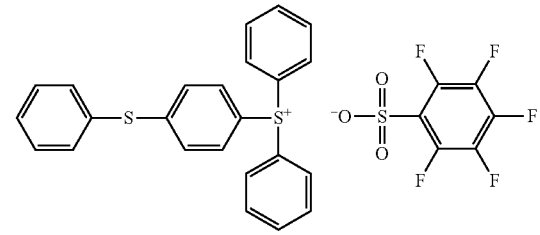

Examples of the compound represented by formula (b10) include the following ones.

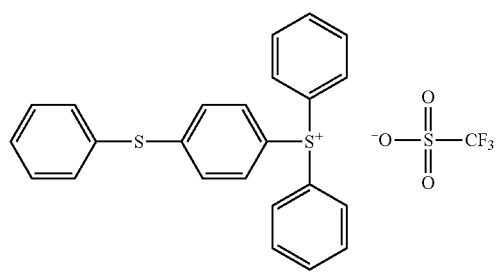

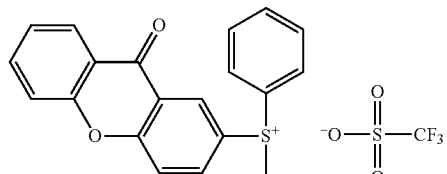

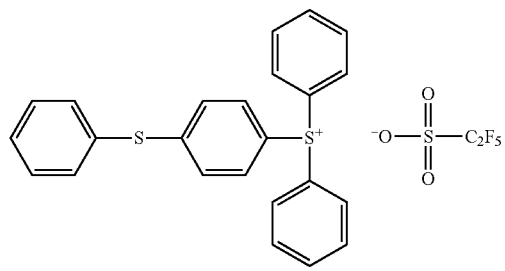

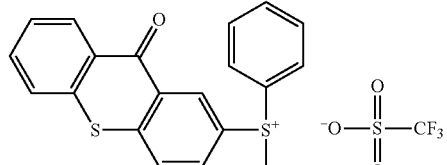

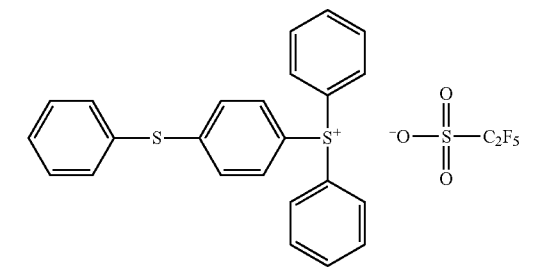

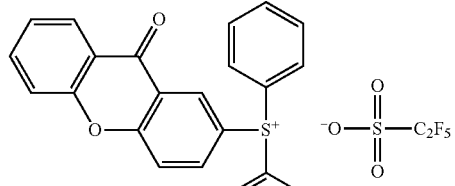

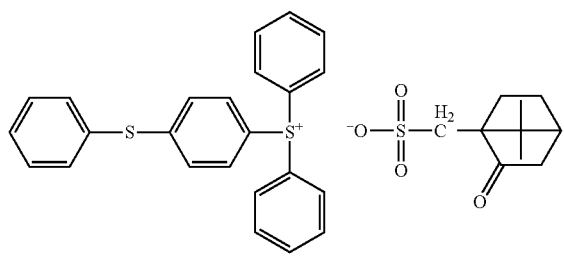

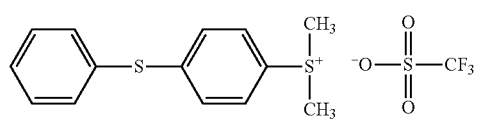

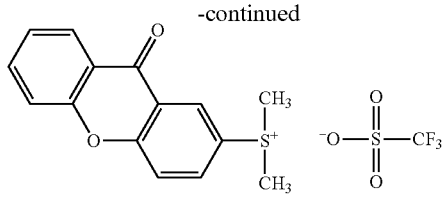

As the acid generator (B), a single salt or a mixture of two or more of the salts can be used.

The content of the acid generator (B) is preferably 0.3 parts by mass or more, preferably 0.5 parts by mass or more, and more preferably 1 parts by mass or more, and preferably 30 parts by mass or less, more preferably 10 parts by mass or less, and still more preferably 5 parts by mass or less, with respect to 100 parts by mass of the resin (A).

<Solvent (D)>

There is no particular limitation on the solvent (D) as along as it dissolves the components contained in the resist composition of the disclosure, examples of the solvent includes a glycol ether ester such as ethyl cellosolve acetate, methyl cellosolve acetate and propylene glycol monomethyl ether acetate; a glycol ether such as propylene glycol monomethyl ether; an ester such as ethyl lactate, butyl acetate, amyl acetate and ethyl pyruvate; a ketone such as acetone, methyl isobutyl ketone, 2-heptanone and cyclohexanone; a lactone such as γ-butyrolactone; and a combination thereof.

The content of the solvent is usually 40 to 75% by mass, preferably 45 to 70% by mass, and more preferably 50 to 68% by mass with respect to total amount of the resist composition of the disclosure. With this range, the resist composition layer having a thickness of about 3 to 150 μm can easily be formed when producing a resist pattern.

<Quencher (C)>

The resist composition of the disclosure preferably further contains a quencher.

The quencher is a compound having a property trapping an acid generated from the acid generator by exposure of light. Examples of the quencher include a basic nitrogen-containing organic compound.

Examples of the basic nitrogen-containing organic compound include an amine compound such as an aliphatic amine and an aromatic amine, and an ammonium salt. Examples of the aliphatic amine include a primary amine, a secondary amine and a tertiary amine.

Examples of amine compounds include those represented by the formulae (C1) and (C2).

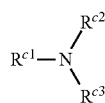

(C1)

In the formula, $R^{c1}$, $R^{c2}$ and $R^{c3}$ each independently represent a hydrogen atom, a $C_1$ to $C_6$ alkyl group, a $C_5$ to $C_{10}$ alicyclic hydrocarbon group or a $C_6$ to $C_{10}$ aromatic hydrocarbon group, and a hydrogen atom contained in the alkyl group and the alicyclic hydrocarbon group may be replaced by a hydroxy group, an amino group or a $C_1$ to $C_6$ alkoxy group, and a hydrogen atom contained in the aromatic hydrocarbon group may be replaced by a $C_1$ to $C_6$ alkyl group, a $C_1$ to $C_6$ alkoxy group or a $C_5$ to $C_{10}$ alicyclic hydrocarbon group.

Examples of the alkyl group, the alicyclic hydrocarbon group, the aromatic hydrocarbon group, an alkoxy group and an alkanediyl group include the same examples as the group described above.

Examples of the compound represented by the formula (C1) include 1-naphthylamine, 2-naphthylamine, aniline, diisopropylaniline, 2-methylaniline, 3-methylaniline, 4-methylaniline, 4-nitroaniline, N-methylaniline, N,N-dimethylaniline, diphenylamine, hexylamine, heptylamine, octylamine, nonylamine, decylamine, dibutylamine, dipentylamine, dihexylamine, diheptylamine, dioctylamine, dinonylamine, didecylamine, triethylamine, trimethylamine, tripropylamine, tributylamine, tripentylamine, trihexylamine, triheptylamine, trioctylamine, trinonylamine, tridecylamine, dibutylmethylamine, methyldipentylamine, dihexylmethylamine, dicyclohexylmethylamine, diheptylmethylamine, methyldioctylamine, methyldinonylamine, didecylmethylamine, ethyldibutylamine, ethyldipentylamine, ethyldihexylamine, ethyldiheptylamine, ethyldioctylamine, ethyldinonylamine, ethyldidecylamine, tris[2-(2-methoxyethoxy)ethyl]amine, triisopropanolamine, ethylenediamine, tetramethylenediamine, hexamethylenediamine, 4,4'-diamino-1,2-diphenylethane, 4,4'-diamino-3,3'-dimethyldiphenylmethane and 4,4'-diamino-3,3'-diethyldiphenylmethane. Among them, preferred is diisopropylaniline, and more preferred is 2,6-diisopropylaniline.

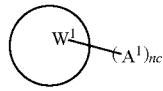

(C2)

In the formula, the ring $W^1$ represents a nitrogen-containing heterocyclic ring, or a benzene ring having a substituted or unsubstituted amino group, and a hydrogen atom contained in the heterocyclic ring and benzene ring may be replaced by a hydroxy group or a $C_1$ to $C_4$ alkyl group;

$A^1$ represents a phenyl group or a naphthyl group, and

"nc" represents an integer of 2 or 3.

The substituted or unsubstituted amino group is represented by $—N(R^{c4})(R^{c5})$, where $R^{c4}$ and $R^{c5}$ each independently represent a hydrogen atom, a $C_1$ to $C_{10}$ aliphatic hydrocarbon group, a $C_3$ to $C_{10}$ alicyclic hydrocarbon group or a $C_6$ to $C_{14}$ aromatic hydrocarbon group.

Examples of the aliphatic hydrocarbon group include an alkyl group such as methyl, ethyl, n-propyl, isopropyl, n-butyl, butyl, pentyl, hexyl, heptyl and octyl groups.

Examples of the alicyclic hydrocarbon group include the same examples as the group described for $R^{a1}$, $R^{a2}$ and $R^{a3}$ in the formula (1), and examples of the aromatic hydrocarbon group include the same examples as the group described for $R^{a1'}$, $R^{a2'}$ and $R^{a3'}$ in the formula (2), described above.

The nitrogen-containing heterocyclic ring is an aromatic or non-aromatic ring, or a ring having a hetero atom other than a nitrogen atom such as an oxygen atom and a sulfur atom. The hetero ring may have 1 to 3 nitrogen atom(s). Examples of the hetero ring include a ring represented by any one of formulae (Y13) to (Y28). In each ring of the formulae, the position where one hydrogen atom has been removed therefrom is a binding position to $A^1$.

(Y13)

(Y14) 

(Y15) 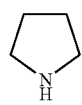

(Y16) 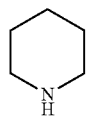

(Y17) 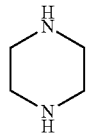

(Y18) 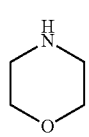

(Y19) 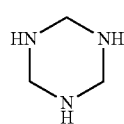

(Y20) 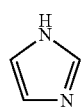

(Y21) 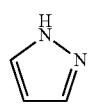

(Y22) 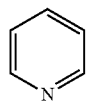

(Y23) 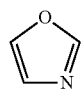

(Y24) 

(Y25) 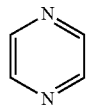

(Y26) 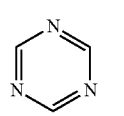

(Y27) 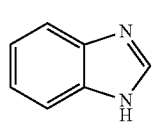

(Y28) 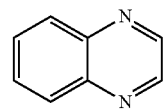

The ring $W^1$ is preferably a nitrogen-containing heterocyclic ring, more preferably a 5- or 6-membered aromatic heterocyclic ring having a nitrogen atom in its ring, and still more preferably a ring represented by any one of formulae (Y20) to (Y25).

The compound represented by formula (C2) includes those represented by formulae (C2-1) to (C2-11), preferably those represented by formulae (C2-2) to (C2-8).

(C2-1) 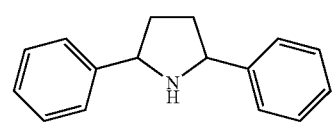

(C2-2) 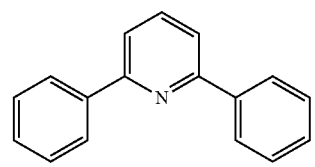

(C2-3) 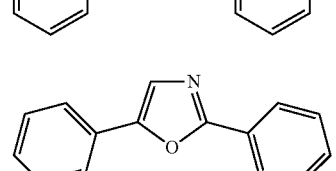

(C2-4) 

(C2-5) 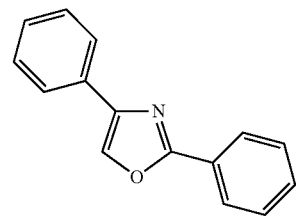

(C2-6) 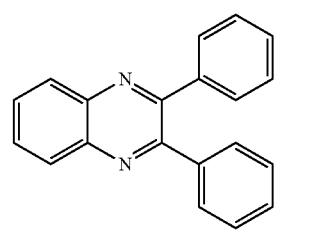

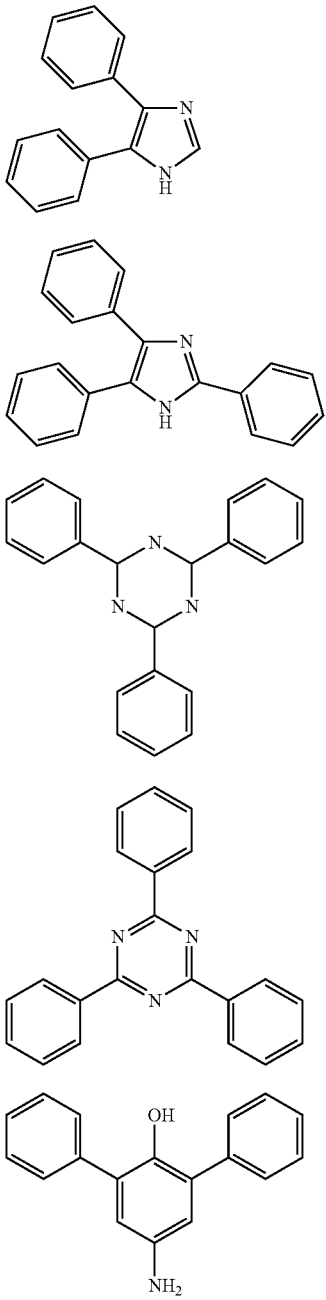

(C2-7)

(C2-8)

(C2-9)

(C2-10)

(C2-11)

The content of the quencher is preferably 0.0001 to 5% by mass, more preferably 0.0001 to 4% by mass, still more preferably 0.001 to 3% by mass, further still preferably 0.01 to 1.0% by mass, and particularly preferably 0.1 to 0.70% by mass with respect to the total amount of solid components of the resist composition.

<Adhesion Improver (E)>

There is no particular limitation on the adhesion improver (E) as along as corrosion of a metal such as aluminum and copper used in a substrate, wiring, or the like can be prevented. An effect of preventing rusting is exhibited by prevention of corrosion of the metal. Furthermore, in addition to those effects, it is possible to enhance the adhesive characteristics between the resist composition and the substrate or the metal.

The adhesion improver (E) may include a sulfur-containing compound, an aromatic hydroxyl compound, a benzotriazol compound, a triazine compound and a silicon-containing compound. These may be used as a single compound or as a combination of two or more compounds.

The sulfur-containing compound may include a compound that has a sulfide bond and/or a mercapto group. The sulfur-containing compound may be a chain compound or a compound having a ring structure.

Examples of the chain compound include dithiodiglycolic glycerol [S(CH$_2$CH(OH)CH$_2$(OH))$_2$], bis (2,3-dihydroxypropylthio)ethylene [CH$_2$CH$_2$ (SCH$_2$CH(OH)CH$_2$(OH))$_2$], 3-(2,3-dihydroxypropylthio)-2-methyl-propylsulfonic acid sodium salt [CH$_2$(OH)CH(OH)CH$_2$SCH$_2$CH(CH$_3$)CH$_2$SO$_3$Na], 1-thioglycerol [HSCH$_2$CH(OH)CH$_2$(OH)], 3-mercapto-1-propanesulfonic acid sodium salt [HSCH$_2$CH$_2$CH$_2$SO$_3$Na], 2-mercaptoethanol [HSCH$_2$CH$_2$(OH)], thioglycolic acid [HSCH$_2$CO$_2$H], 3-mercapto-1-propanol [HSCH$_2$CH$_2$CH$_2$].

The sulfur-containing compound is preferably a compound that has a sulfide bond and a mercapto group, more preferably a heterocyclic compound that has a sulfide bond and a mercapto group. There is no particular limitation on how many sulfide bonds and mercapto groups are presented in the sulfur-containing compound, as long as both of these groups are presented respectively therein.

The heterocyclic ring may be a monocyclic or a polycyclic ring, and the ring may be a saturated or an unsaturated ring. The heterocyclic ring preferably has a hetero atom other than a sulfur atom. Examples of the hetero atom include an oxygen atom and a nitrogen atom, and preferably a nitrogen atom.

The heterocyclic ring has preferably 2 to 12 carbon atoms, more preferably 2 to 6 carbon atoms.

The heterocyclic ring is preferably a monocyclic ring or an unsaturated ring, and more preferably a monocyclic unsaturated ring.

Examples of the heterocyclic ring include the following ones.

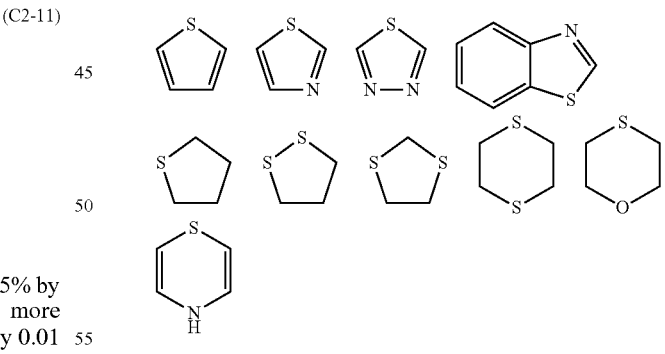

The sulfur-containing compound may be a polymer. The polymer preferably has a structural unit which has a sulfide bond and a mercapto group in its side chain. A structure having a sulfide bond and a mercapto group (which is sometimes referred to as "unit (1)") and a main chain are preferably bonded together with a linking group such as an amido bond, an ether bond, a thioether bond and ester bond.

The polymer may be a homopolymer or a copolymer.

When the polymer is a copolymer, the copolymer may have the structural unit (a1) and/or the structural unit (a2) described above.

The weight average molecular weight of the polymer is usually 3,000 or more, preferably 5,000 or more, while it is usually 100,000 or less, and preferably 50,000 or less.

When the sulfur-containing compound is a polymer, the content of the structural unit which has a sulfide bond and a mercapto group is usually 0.1 to 50% by mole, preferably 0.5 to 30% by mole, and more preferably 1 to 20% by mole with respect to the total structural units of the polymer.

The sulfur-containing compound is preferably a compound represented by formula (IA) or a polymer having a structural unit represented by formula (IB):

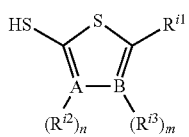
(IA)

wherein $R^{i1}$ represents a hydrogen atom, a $C_1$ to $C_{10}$ aliphatic hydrocarbon group, a $C_3$ to $C_{18}$ alicyclic hydrocarbon group, a $C_6$ to $C_{14}$ aromatic hydrocarbon group, —$SR^{11}$ or —$N(R^{12})(R^{13})$;

$R^{11}$, $R^{12}$ and $R^{13}$ each independently represent a hydrogen atom, a $C_1$ to $C_{10}$ aliphatic hydrocarbon group, a $C_3$ to $C_{10}$ alicyclic hydrocarbon group, a $C_6$ to $C_{14}$ aromatic hydrocarbon group or a $C_1$ to $C_{12}$ acyl group and a hydrogen atom contained in the aliphatic hydrocarbon group, the alicyclic hydrocarbon group, the aromatic hydrocarbon group or the acyl group may be replaced by a hydroxy group;

$R^{i2}$ and $R^{i3}$ in each occurrence independently represent a hydrogen atom, a $C_1$ to $C_{10}$ aliphatic hydrocarbon group, a $C_3$ to $C_{18}$ alicyclic hydrocarbon group or a $C_6$ to $C_{14}$ aromatic hydrocarbon group;

A and B each independently represent a nitrogen atom or a carbon atom; and

"n" and "m" each independently represent 0 or 1, provided that n is 0 when A is a nitrogen atom, n is 1 when A is a carbon atom, m is 0 when B is a nitrogen atom, and m is 1 when B is a carbon atom.

Examples of the aliphatic hydrocarbon group include alkyl groups such as methyl, ethyl, propyl, butyl, pentyl, hexyl, heptyl and octyl groups.

Examples of the aromatic hydrocarbon group include an aryl group such as phenyl, naphthyl, anthryl, p-methylphenyl, p-tert-butylphenyl, p-adamantylphenyl, tolyl, xylyl, cumenyl, mesityl, biphenyl, phenanthryl, 2,6-diethylphenyl and 2-methyl-6-ethylphenyl groups.

The alicyclic hydrocarbon group may be any one of a monocyclic or polycyclic group, examples of the alicyclic hydrocarbon group include a cycloalkyl group such as cyclopentyl, cyclohexyl, cycloheptyl and cyclooctyl group, and the polycyclic alicyclic hydrocarbon group such as decahydronaphthyl, adamantyl and norbornyl groups.

$R^{i1}$ is preferably an aliphatic hydrocarbon group or an acyl group, $R^{i2}$ and $R^{i3}$ are each independently preferably a hydrogen atom, an aliphatic hydrocarbon group, an aromatic hydrocarbon group or an acyl group.

Examples of the acyl group include acetyl, propionyl, butyryl, bareiru, hexylcarbonyl, heptylcarbonyl, octylcarbonyl, decylcarbonyl, dodecylcarbonyl and benzoyl groups.

$R^{i1}$ is more preferably a hydrogen atom or a mercapto group.

$R^{i2}$ and $R^{i3}$ is each independently preferably a hydrogen atom or a $C_1$ to $C_4$ alkyl group, and more preferably a hydrogen atom.

At least one of A and B is preferably a nitro atom, and both of them are more preferably nitrogen atoms.

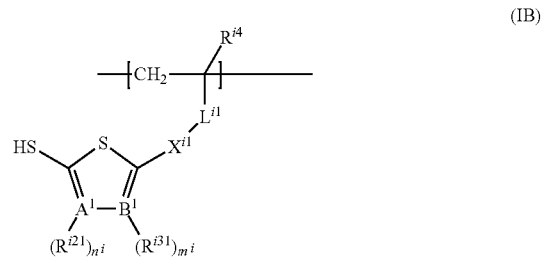
(IB)

In the formula, $R^{i21}$ and $R^{i31}$ in each occurrence independently represent a hydrogen atom, a $C_1$ to $C_{10}$ aliphatic hydrocarbon group, a $C_3$ to $C_{18}$ alicyclic hydrocarbon group or a $C_6$ to $C_{14}$ aromatic hydrocarbon group;

$A^1$ and $B^1$ each independently represent a nitrogen atom or a carbon atom;

$R^{i4}$ represents a hydrogen atom or a methyl group;

$X^{i1}$ represents a sulfur atom or a NH group;

$L^{i1}$ represents a $C_1$ to $C_{20}$ divalent hydrocarbon group where a methylene group may be replaced by an oxygen atom or a carbonyl group; and "$n^i$" and "$m^i$" each independently represent 0 or 1, provided that $n^i$ is 0 when $A^1$ is a nitrogen atom, $n^i$ is 1 when $A^1$ is a carbon atom, $m^i$ is 0 when $B^1$ is a nitrogen atom, and $m^i$ is 1 when $B^1$ is a carbon atom.

Examples of aliphatic hydrocarbon group for $R^{i21}$ and $R^{i31}$ include alkyl groups such as methyl, ethyl, propyl, butyl, pentyl, hexyl, heptyl and octyl groups, preferably a $C_1$ to $C_4$ alkyl group.

Examples of the aromatic hydrocarbon group for $R^{i21}$ and $R^{i31}$ include an aryl group such as phenyl, naphthyl, anthryl, p-methylphenyl, p-tert-butylphenyl, p-adamantylphenyl, tolyl, xylyl, cumenyl, mesityl, biphenyl, phenanthryl, 2,6-diethylphenyl and 2-methyl-6-ethylphenyl groups, and preferably a $C_6$ to $C_{10}$ aryl group.

The alicyclic hydrocarbon group for $R^{i21}$ and $R^{i31}$ may be any one of a monocyclic or polycyclic group, examples of the alicyclic hydrocarbon group include a cycloalkyl group such as cyclopentyl, cyclohexyl, cycloheptyl and cyclooctyl group, and the polycyclic alicyclic hydrocarbon group such as decahydronaphthyl, adamantyl and norbornyl groups, and preferably a $C_5$ to $C_{10}$ alicyclic hydrocarbon group.

$R^{i21}$ and $R^{i31}$ are each independently preferably a hydrogen atom or a $C_1$ to $C_4$ alkyl group.

Examples of the divalent hydrocarbon group for $L^{i1}$ include an alkanediyl group such methylene, ethylene, propane-1,3-diyl, butane-1,4-diyl, pentane-1,5-diyl, hexane-1,6-diyl, heptane-1,7-diyl, octane-1,8-iyl, nonane-1,9-diyl, decane-1,10-diyl, undecane-1,11-diyl, dodecane-1,12-diyl, tridecane-1,13-diyl, tetradecane-1,14-diyl, pentadecane-1,15-diyl, hexadecane-1,16-diyl, heptadecane-1,17-diyl, ethane-1,1-diyl, propane-1,1-diyl, propane-1,2-diyl, propane-2,2-diyl, pentane-2,4-diyl, 2-methylpropane-1,3-diyl, 2-methylpropane-1,2-diyl, pentane-1,4-diyl, 2-methylbutane-1,4-diyl;

a divalent monocyclic saturated alicyclic hydrocarbon group, i.e., a cycloalkanediyl group such as cyclobutane-1,3-diyl, cyclopentane-1,3-diyl, cyclohexane-1,4-diyl, cycloalkanediyl such as cyclooctane-1,5-diyl groups;

a divalent polycyclic saturated alicyclic hydrocarbon group such as a norbornane-1,4-diyl, norbornane-2,5-diyl, adamantane-1,5-diyl and adamantane-2,6-diyl groups;

an arylene group such as phenylene, tolylene and naphthylene groups.

$L^{i1}$ is preferably a $C_2$ to $C_{14}$ alkanediyl group having an ester bond or a combination of a $C_6$ to $C_{10}$ arylene group with a $C_1$ to $C_{11}$ alkanediyl group.

The structural unit represented by formula (IB) is preferably one represented by formula (IB-1) or formula (IB-2).

$$\text{(IB-1)}$$

$$\text{(IB-2)}$$

In the formulae, $R^{i22}$ and $R^{i32}$ each independently represent a hydrogen atom, a $C_1$ to $C_{10}$ aliphatic hydrocarbon group, a $C_3$ to $C_{18}$ alicyclic hydrocarbon group or a $C_6$ to $C_{14}$ aromatic hydrocarbon group;

$A^2$ and $B^2$ each independently represent a nitrogen atom or a carbon atom;

$R^{i5}$ represents a hydrogen atom or a methyl group;

$X^{i11}$ represents a sulfur atom or an NH group;

$L^{i2}$ represents a $C_1$ to $C_{18}$ divalent hydrocarbon group where a methylene group may be replaced by an oxygen atom or a carbonyl group, and "n1" and "m1" each independently represent 0 or 1, provided that "n1" is 0 when $A^2$ is a nitrogen atom, "n1" is 1 when $A^2$ is a carbon atom, "m1" is 0 when $B^2$ is a nitrogen atom and "m1" is 1 when $B^2$ is a carbon atom;

$R^{i23}$ and $R^{i33}$ each independently represent a hydrogen atom, a $C_1$ to $C_{10}$ aliphatic hydrocarbon group, a $C_3$ to $C_{18}$ alicyclic hydrocarbon group or a $C_6$ to $C_{14}$ aromatic hydrocarbon group;

$A^3$ and $B^3$ each independently represent a nitrogen atom or a carbon atom;

$R^{i7}$ represents a $C_1$ to $C_6$ alkyl group or a $C_1$ to $C_6$ alkoxy group;

$X^{i12}$ represents a sulfur atom and an NH group;

$L^{i3}$ represents a $C_1$ to $C_{14}$ divalent hydrocarbon group where a methylene group may be replaced by an oxygen atom or a carbonyl group; and "n2" and "m2" each independently represent 0 or 1, provided that "n2" is 0 when $A^3$ is a nitrogen atom, "n2" is 1 when $A^3$ is a carbon atom, "m2" is 0 when $B^3$ is a nitrogen atom, and/or "m2" is 1 when $B^3$ is a carbon atom.

Examples of the $C_1$ to $C_{10}$ aliphatic hydrocarbon group for $R^{i22}$, $R^{i32}$, $R^{i23}$ and $R^{i33}$ each independently include the same ones as the group of $R^{i21}$ and $R^{i31}$.

Examples of the $C_6$ to $C_{14}$ aromatic hydrocarbon group for $R^{i22}$, $R^{i32}$, $R^{i23}$ and $R^{i33}$ each independently include the same ones as the group of $R^{i21}$ and $R^{i31}$.

Examples of the $C_3$ to $C_{18}$ alicyclic hydrocarbon group for $R^{i22}$, $R^{i32}$, $R^{i23}$ and $R^{i33}$ each independently include the same ones as the group of $R^{i21}$ and $R^{i31}$.

Examples of the $C_1$ to $C_{18}$ divalent hydrocarbon group for $L^{i2}$ include an alkanediyl group such as methylene, ethylene, propane-1,3-diyl, butane-1,4-diyl, pentane-1,5-diyl, hexane-1,6-diyl, heptane-1,7-diyl, octane-1,8-diyl, nonane-1,9-diy, decane-1,10-diyl, undecane-1,11-diyl, dodecane-1,12-diyl, tridecane-1,13-diyl, tetradecane-1,14-diyl, pentadecane-1,15-diyl, hexadecane-1,16-diyl, heptadecane-1,17-diyl, ethane-1,1-diyl, propane-1,1-diyl, propane-1,2-diyl, propane-2,2-diyl, pentane-2,4-diyl, 2-methylpropane-1,3-diyl, 2-methylpropane-1,2-diyl, pentane-1,4-diyl and 2-methylbutane-1,4-diyl;

a divalent monocyclic saturated alicyclic hydrocarbon group, i.e., cycloalkanediyl group such as cyclobutane-1,3-diyl, cyclopentane-1,3-diyl, cyclohexane-1,4-diyl, cycloalkanediyl such as cyclooctane-1,5-diyl groups;

a divalent polycyclic saturated alicyclic hydrocarbon group such as a norbornane-1,4-diyl, norbornane-2,5-diyl, adamantane-1,5-diyl and adamantane-2,6-diyl groups.

$L^{i2}$ is preferably a $C_1$ to $C_{14}$ alkanediyl group, and more preferably a $C_1$ to $C_{11}$ alkanediyl group.

Examples of the $C_1$ to $C_{14}$ divalent hydrocarbon group for $L^{i3}$ include an alkanediyl group such as methylene, ethylene, propane-1,3-diyl, butane-1,4-diyl, pentane-1,5-diyl, hexane-1,6-diyl, heptane-1,7-diyl, octane-1,8-diyl, nonane-1,9-diy, decane-1,10-diyl, undecane-1,11-diyl, dodecane-1,12-diyl, ethane-1,1-diyl, propane-1,1-diyl, propane-1,2-diyl, propane-2,2-diyl, pentane-2,4-diyl, 2-methylpropane-1,3-diyl, 2-methyl propane-1,2-diyl, pentane-1,4-diyl and 2-methyl butane-1,4-diyl;

a divalent monocyclic saturated alicyclic hydrocarbon group, i.e., cycloalkanediyl group such as cyclobutane-1,3-diyl, cyclopentane-1,3-diyl, cyclohexane-1,4-diyl, cycloalkanediyl such as cyclooctane-1,5-diyl groups;

a divalent polycyclic saturated alicyclic hydrocarbon group such as a norbornane-1,4-diyl, norbornane-2,5-diyl, adamantane-1,5-diyl and adamantane-2,6-diyl groups.

$L^{i3}$ is preferably a $C_1$ to $C_{14}$ alkanediyl group, and more preferably a $C_1$ to $C_{11}$ alkanediyl group.

$L^{i3}$ is preferably bonded to a phenylene group so as to form a para-position with respect to a main chain.

Examples of the sulfur-containing compound include compounds represented by formulae (I-1) to (I-26), among them, those represented by formulae (I-1) to (I-13) are preferred, and those represented by formulae (I-1), (I-4) and (I-11) are more preferred.

(I-1)

(I-2)

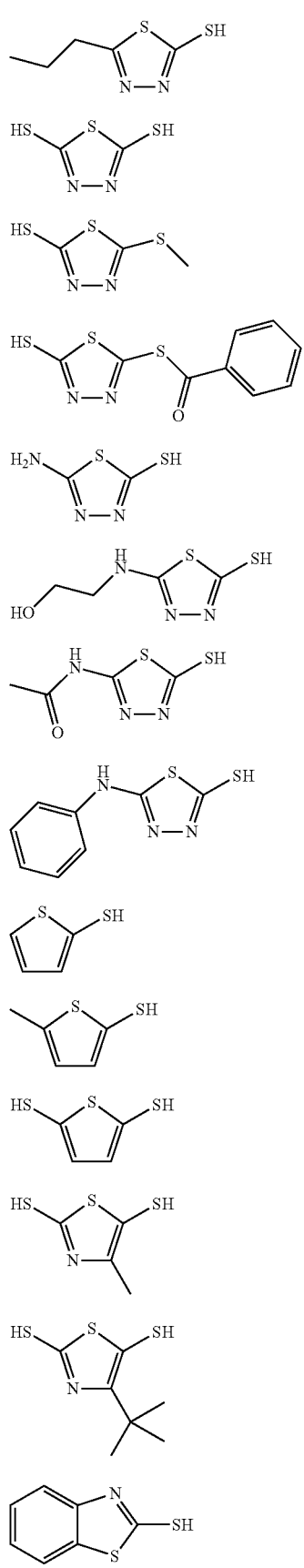
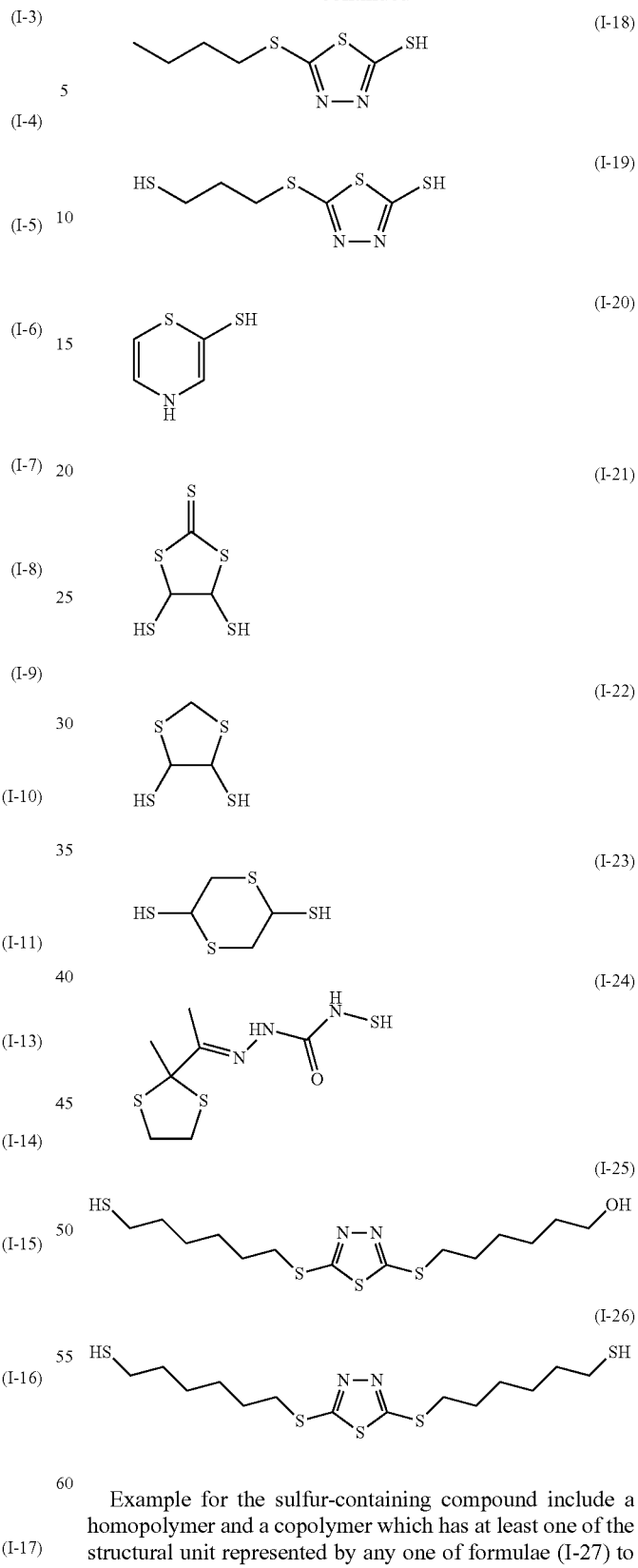

Example for the sulfur-containing compound include a homopolymer and a copolymer which has at least one of the structural unit represented by any one of formulae (I-27) to (I-38), a copolymer which has at least one of the structural unit represented by any one of formulae (I-27) to (I-36) are preferred, a copolymer which has the structural unit represented by formula (I-33) is more preferred.

(I-27) 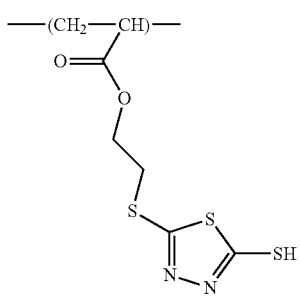
(I-28) 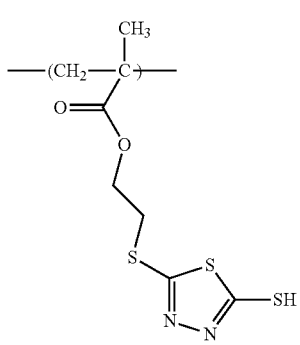
(I-29) 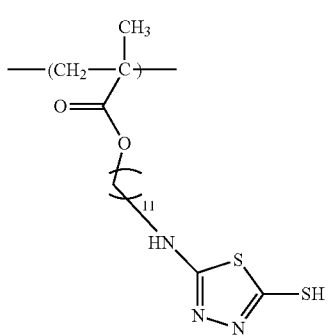
(I-30) 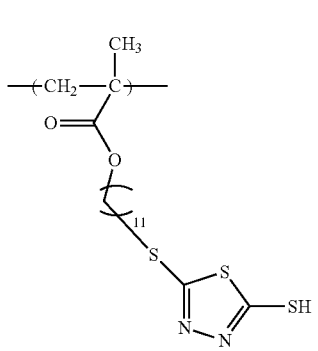
(I-31) 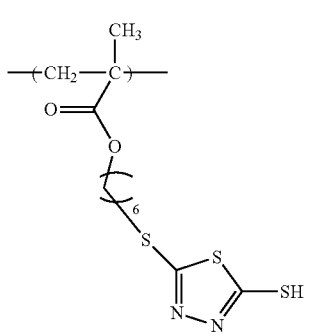
(I-32) 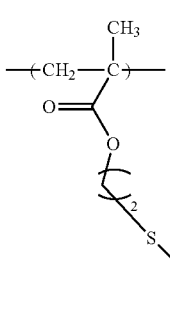
(I-33) 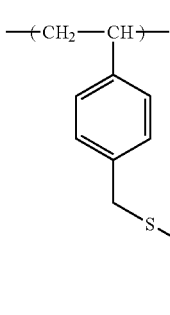
(I-34) 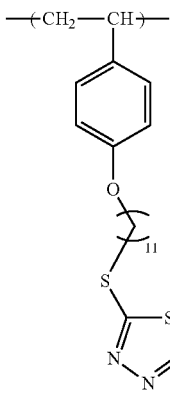
(I-35) 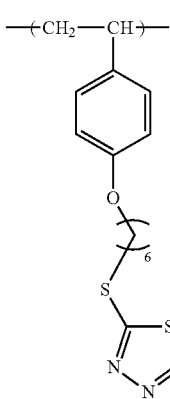

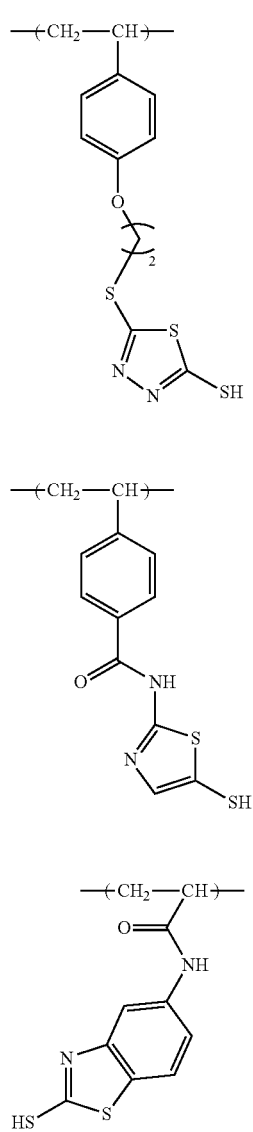
(I-36)
(I-37)
(I-38)
Examples of such copolymer include a copolymer represented by formulae (I-39) to (I-48), and a copolymer represented by formulae (I-39) to (I-44) are preferred.
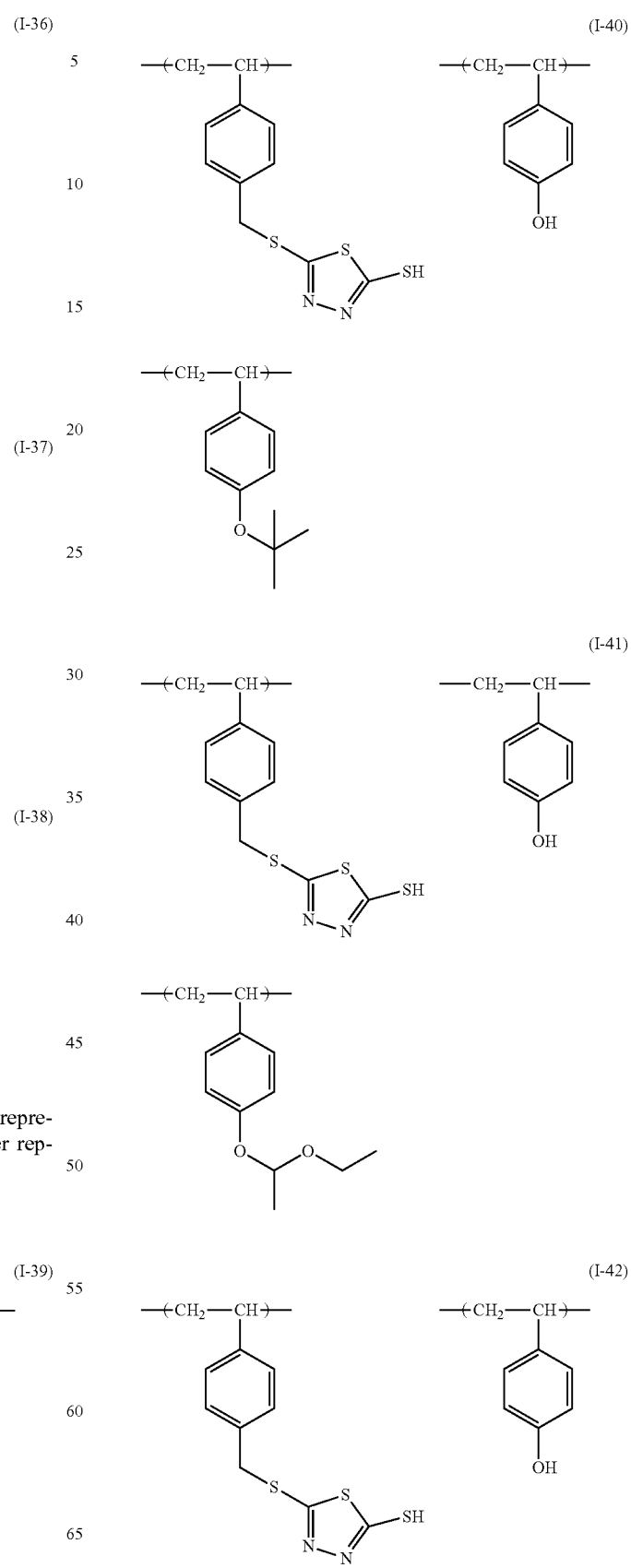
(I-40)
(I-41)
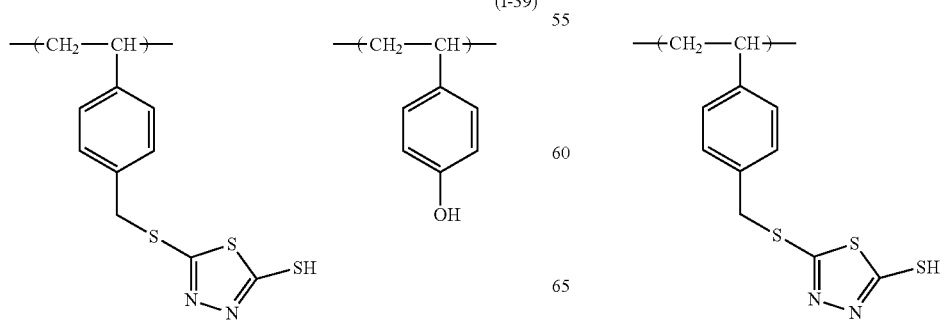
(I-39)
(I-42)

73
-continued
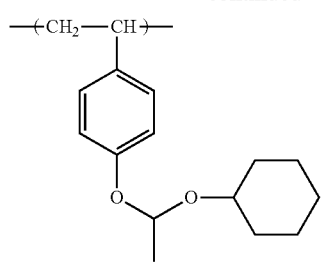
(I-43)
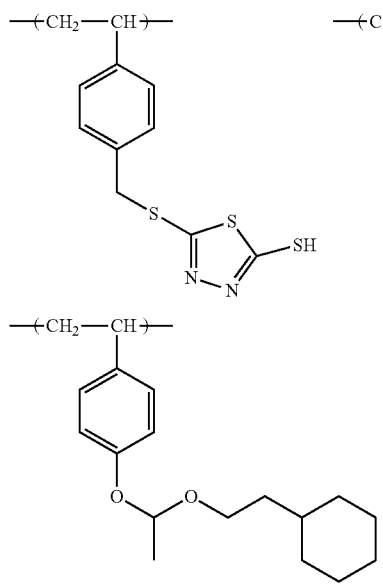
(I-44)
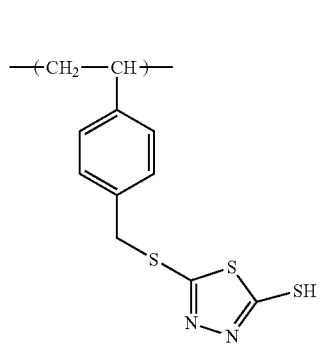
(I-45)
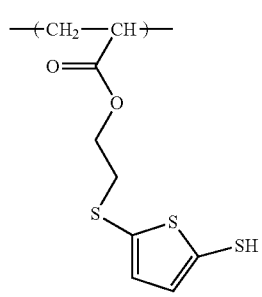
74
-continued
(I-46)
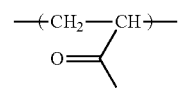
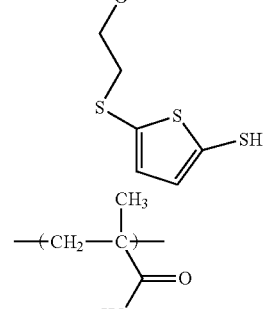
(I-47)
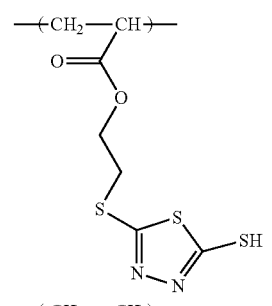
(I-48)
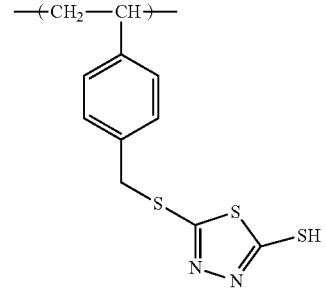
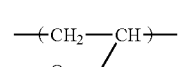
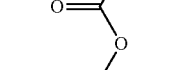
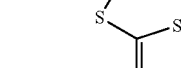
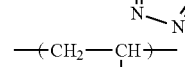
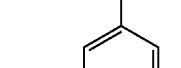
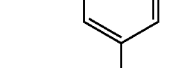
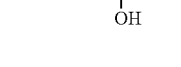
The sulfur-containing compound may be synthesized by a known method (for example, these disclosed in JP2010-79081A1), or may be available product on the market. The polymer that is a sulfur-containing compound may be available product on the market (for example, bismuthiol, manufactured by Tokyo Chemical Industry Co., Ltd.), or may be synthesized by a known method (for example, that disclosed in JP2001-75277A1).

Examples of the aromatic hydroxy compound include phenol, cresol, xylenol, pyrocatechol (=1,2-dihydroxybenzene), tert-butyl catechol, resorcinol, hydroquinone, pyrogallol, 1,2,4-benzene triol, salicyl alcohol, p-hydroxybenzyl alcohol, o-hydroxy benzyl alcohol, p-hydroxy phenethyl alcohol, p-aminophenol, m-aminophenol, diaminophenol, amino resorcinol, p-hydroxybenzoic acid, o-hydroxybenzoic acid, 2,4-dihydroxybenzoic acid, 2,5-dihydroxybenzoic benzoic acid, 3,4-dihydroxybenzoic acid, 3,5-dihydroxybenzoic acid and gallic acid.

Examples of the benzotriazole compound include a compound represented by formula (IX):

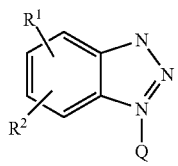

(IX)

wherein $R^1$ and $R^2$ each independently represent a hydrogen atom, an optionally substituted $C_1$ to $C_{10}$ hydrocarbon group, a carboxyl group, an amino group, a hydroxyl group, a cyano group, a formyl group, a sulfonyl alkyl group or a sulfone group.

Q represents a hydrogen atom, a hydroxyl group, an optionally substituted $C_1$ to $C_{10}$ hydrocarbon group, an aryl group or **—$R^3$—N($R^4$)—$R^5$, the hydrocarbon group may has an amide bond or an ester bond, $R^3$ represents an alkanediyl group,

** represents a binding position with a nitrogen atom included the ring, and $R^4$ and $R^5$ each independently represent a hydrogen atom, a hydroxyl group, a $C_1$ to $C_6$ alkyl group, a $C_1$ to $C_6$ hydroxyalkyl group or a $C_1$ to $C_6$ alkoxyalkyl group.

The hydrocarbon group for $R^1$, $R^2$ and Q may be an aliphatic hydrocarbon group or an aromatic hydrocarbon group, and may have a saturated and/or unsaturated bond.

The aliphatic hydrocarbon group is preferably an alkyl group. Examples of the alkyl group include methyl, ethyl, n propyl, isopropyl, n-butyl, sec-butyl, tert-butyl, n-pentyl, methylpentyl, n-hexyl and n-heptyl groups.

The aromatic hydrocarbon group is preferably an aryl group. Examples of the aryl group include phenyl, naphthyl, anthryl, p-methylphenyl, p-tert-butylphenyl, p-adamantylphenyl, tolyl, xylyl, cumenyl, mesityl, biphenyl, phenanthryl, 2, 6-diethylphenyl and 2-methyl-6-ethylphenyl groups.

Examples of the alkanediyl group for $R^3$ include the same ones as the group described above.

Examples of the substituent for the hydrocarbon group include a hydroxyl alkyl and an alkoxyalkyl groups.

Examples of the hydroxylalkyl group include hydroxymethyl and hydroxyethyl groups.

Examples of the alkoxyalkyl group include methoxymethyl, methoxyethyl and dimethoxyethyl groups.

When the resist composition of the disclosure is applied to a substrate that includes copper layer, it is preferred to use a compound in which Q in formula (IX) is **—$R^3$—N($R^4$)

($R^5$). Among them, although the benzotriazole compound in which Q is **—$R^3$—N($R^4$)($R^5$) and at least one of $R^4$ and $R^5$ is a $C_1$ to $C_6$ alkyl group exhibits reduced solubility in water when at least one of $R^4$ and $R^5$ is a $C_1$ to $C_6$ alkyl group, the compound is preferably used provided that another component capable of dissolving the compound is present therein.

When the resist composition of the disclosure is applied to a substrate that has an inorganic material layer (for example, polysilicon film and amorphous silicon film), Q in formula (IX) is preferably a water soluble group, and more specifically a hydrogen atom, a $C_1$ to $C_3$ alkyl group, a $C_1$ to $C_3$ hydroxyalkyl group or a hydroxyl group. In this manner, the anticorrosive properties of the substrate are effectively exerted.

Examples of the benzotriazole compounds include benzotriazole, 5,6-dimethyl benzotriazole, 1-hydroxybenzotriazole, 1-methylbenzotriazole, 1-aminobenzotriazole, 1-phenylbenzotriazole, 1-hydroxymethyl benzotriazole, 1-benzotriazole carboxylic acid methyl ester, 5-benzotriazole carboxylic acid, 1-methoxy-benzotriazole, 1-(2,2-dihydroxy-ethyl)benzotriazole, 1-(2,3-dihydroxypropyl)benzotriazole, or 2,2'-{([(4-methyl-1H-benzotriazol-1-yl)methyl]imino}bisethanol, 2,2'-{([(5-methyl-1H-benzotriazol-1-yl)methyl]imino}bisethanol, 2,2'-{[(4-methyl-1H-benzotriazol-1-yl)methyl]imino}bisethane and 2,2'-{[(4-methyl-1H-benzotriazole-1-yl) methyl]imino}bispropane which are available on the market from Ciba Specialty Chemicals as "Irgamet" series.

Examples of the triazine compound include a compound represented by formula (II):

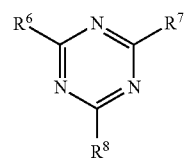

(II)

wherein $R^6$, $R^7$ and $R^8$ each independently represent a halogen atom, a hydrogen atom, a hydroxy group, an amino group, a mercapto group, an optionally substituted $C_1$ to $C_{10}$ hydrocarbon group, an optionally substituted $C_1$ to $C_{10}$ alkoxy group or an amino group substituted with a $C_1$ to $C_{10}$ hydrocarbon group.

Examples of the halogen atom include a fluorine, chlorine, bromine and iodine atoms.

Examples of the hydrocarbon group and an alkyl group include the same ones as the group described above.

Examples of triazine compounds include 1,3,5-triazine-2,4,6-trithiol.

Examples of the silicon-containing compound include a compound represented by formula (IIA):

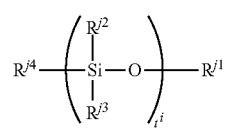

(IIA)

wherein $R^{j1}$ represents a $C_1$ to $C_5$ aliphatic hydrocarbon group or a $C_1$ to $C_5$ mercaptoalkyl group, $R^{j2}$ to $R^{j4}$ each independently represent a $C_1$ to $C_5$ aliphatic hydrocarbon group, a $C_1$ to $C_5$ alkoxy group, a mercapto group or a $C_1$ to $C_5$ mercaptoalkyl group, at least one of $R^{j2}$ to $R^{j4}$ is a mercaptoalkyl group or a $C_1$ to $C_5$ mercapto group, and $t^i$ represents an integer of 1 to 10.

Examples of the aliphatic hydrocarbon group include an alkyl group such as methyl, ethyl, propyl butyl and pentyl groups Examples of the alkoxy group include methoxy and ethoxy groups.

Examples of the mercapto alkyl group include methylmercapto, entylmercapto and puropylmercapto groups.

$R^{j1}$ is preferably a $C_1$ or $C_2$ aliphatic hydrocarbon group and a $C_1$ to $C_3$ mercaptoalkyl group, and more preferably a methyl group or a mercaptopropyl group.

$R^{j2}$ to $R^{j4}$ are each independently preferably a $C_1$ or $C_2$ aliphatic hydrocarbon group, a $C_1$ or $C_2$ alkoxy group, and more preferably a methyl group and a methoxy group. At least one of these is preferably a mercapto group or a $C_1$ to $C_3$ mercaptoalkyl group, and more preferably a mercapto group or a mercaptopropyl group.

$R^{j2}$ and $R^{j3}$ may be the same or different from each other, and are preferably the same in view of productivity.

Examples of the compound represented by formula (IIA) include the compounds represented by formula (II-1) to formula (II-7).

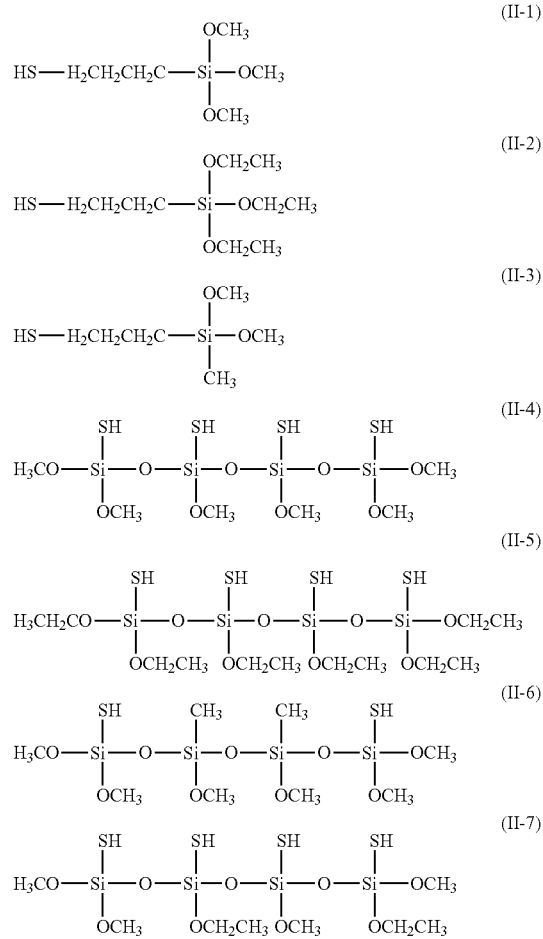

Among them, 3-mercaptopropyl trimethoxysilane and 3-mercaptopropyl triethoxysilane are preferred.

The content of the adhesion improver (E) is preferably 0.001% by mass or more, more preferably 0.002% by mass or more, still more preferably 0.005% by mass or more, especially preferably 0.008% by mass or more, and preferably 20 by mass % or less, more preferably 10% by mass or less, more preferably 4% by mass or less, still more preferably 3% by mass or less, especially preferably 1% by mass or less, more preferably especially 0.1% by mass or less, with respect to the total amount of the solid content of the resist composition. The resist composition within this range can form a resist pattern with high accuracy, ensuring the adhesion between the resist pattern and the substrate.

<Other Component (which is Sometimes Referred to as "Other Component (F)")>

The resist composition of the disclosure may contain other components, as needed. Examples of the other component (F) include various additives known in the art such as surfactants, sensitizers, dissolution inhibitors, stabilizers and dyes.

When the other component (F) is used, the content may be adjusted depending upon the kinds thereof.

<Preparing the Resist Composition>

The resist composition can usually be prepared by mixing the resin (A1), the resin (A3), the acid generator (B), the compound (I) and the solvent (D) as well as the resin (A2), the quencher (C), the adhesion improver (E) and/or other component (F), as needed.

There is no particular limitation on the order of mixing. The temperature of mixing may be adjusted within the range of 10 to 40° C. depending on the kinds of the resin and solubility to the solvent. The time of mixing may be adjusted within the range of 0.5 to 24 hours depending on temperature during mixing. There is no particular limitation to the tool for mixing. An agitation mixing may be used.

After mixing the above components, the mixture is preferably filtrated through a filter having about 0.11 to 50 μm pore diameter.

<Method for Producing Resist Pattern>

The method for producing a resist pattern of the disclosure includes the steps of:

(1) applying the resist composition of the disclosure onto a substrate;

(2) drying the applied composition to form a composition layer;

(3) exposing the composition layer; and (4) developing the exposed composition layer.

In the step (1), the applying of the composition on a substrate is usually conducted using a conventional apparatus such as spin coater. Examples of the substrate include silicon wafers. A substrate on which semiconductor elements (e.g., a transistor, a diode) has been formed in advance can be used for the process. When the resist composition is to be used for bump formation, a substrate on which a conductive material has been laminated is preferred. Examples of the conductive material include a metal such gold (Au), copper (Cu), nickel (Ni), tin (Sn), palladium (Pd), and silver (Ag), and an alloy which contains one or more of these metals. Copper and an alloy containing copper are preferred.

The substrate may be washed or coated with an anti-reflecting layer. For forming the anti-reflecting layer, a composition for an organic anti-reflecting layer as available on the market can be used.

In the step (2), the composition layer is usually formed on the substrate by drying the applied composition to remove the solvent therefrom. The drying is carried out with a heating apparatus such as hot plate (i.e., prebake) for a heat drying, a decompressor for a decompression drying, or a combination thereof.

The temperature is preferably 50 to 200° C., and the operation pressure is preferably 1 to $1.0 \times 10^5$ Pa.

The thickness of the film obtained by step (2) is in the range of preferably 3 to 150 μm, more preferably 4 to 100 μm.

In the step (3), the film is preferably exposed to light using an exposure system. The exposure is usually carried out through a mask having a pattern corresponding to a desired resist pattern. The exposure source can be selected depending on resolution of the intended resist pattern, examples of the exposure source preferably include known one such as a light source emitting a light of 345 to 436 nm of wavelength or a light source emitting a light of 345 to 400 nm of wavelength, more preferably g ray (wavelength: 436 nm), h ray (wavelength: 405 nm) and i ray (wavelength: 365 nm).

The process may further has baking the exposed film, so called post-exposure bake, after the step (3), preferably heating with a heating apparatus. The baking the exposed film can be carried out with heating means such as hot plates. The temperature of baking the exposed film is preferably 50 to 200° C., and more preferably 60 to 120° C. The time of baking is usually 40 to 400 seconds, preferably 50 to 350 seconds.

In the step (4), the development of the exposed resist composition layer is usually carried out. When heating has been carried out, the development of the baked resist composition layer is usually carried out. An alkaline developer is usually used for the development.

Examples of the alkaline developer includes an aqueous solution of tetramethylammonium hydroxide or (2-hydroxyethyl)trimethylammonium hydroxide (commonly known as "choline").

After development, the formed resist pattern is preferably washed with ultrapure water, and the remained water on the resist pattern and the substrate is preferably removed.

<Application>

The resist composition of the disclosure is useful for forming a thick film, in particular, for forming a resist film having 3 to 150 μm-thick Further, the resist composition is useful for producing bumps. When the bump is formed using the resist composition, bumps can be produced by the process including the following steps;

laminating a conductive material (seed metal) on a wafer which has semiconductor elements thereon to form a conductive film, producing a resist pattern on the conductive film from the composition of the disclosure, plating an electrode material such as Cu, Ni or solder, using the resist pattern as its mold, and removing the resist film and the conductive film under the resist film by etching or the like, whereby forming the bumps. The electrode material which has been melted by heating after removing the conductive film may be used as a bump, as needed.

The resist composition of the disclosure can provide a resist pattern with excellent shape, therefore it is useful for formation of the bumps.

Example

The disclosure will be described more specifically by way of examples, which are not construed to limit the scope of the disclosure.

All percentages and parts expressing the content or amounts used in the Examples and Comparative Examples are based on mass, unless otherwise specified.

The weight average molecular weight is a value determined by gel permeation chromatography.
Apparatus: HLC-8120GPC type (Tosoh Co. Ltd.)
Column: TSK gel Multipore HXL-M×3+guardcolumn (Tosoh Co. Ltd.)
Eluant: tetrahydrofuran
Flow rate: 1.0 mL/min
Detecting device: RI detector
Column temperature: 40° C.
Injection amount: 100 μL
Standard material for calculating molecular weight: standard polystyrene (Tosoh Co. ltd.)

Synthesis Example 1: Synthesis of Resin A1-1

20 parts of polyvinylphenol [VP-15000; manufactured by Nippon Soda] was dissolved in 240 parts of methylisobutylketone and the obtained solution was concentrated using an evaporator. The concentrated resin solution and 0.003 parts of p-toluenesulfonic acid dihydrate were charged into a four-necked flask provided with a reflux condenser tube, a stirrer and a thermometer. The temperature was maintained at 20 to 25° C. and 5.05 parts of ethyl vinyl ether was dropped over 10 minutes into the resulting mixture. The mixture was continuously stirred for two hours while maintaining the same temperature. The resulting reaction mixture was diluted with 200 parts of methylisobutylketone, followed by conducting a step of washing with ion-exchanged water and separating an organic layer therefrom five times. The resulting organic layer was concentrated to 45 parts using an evaporator, 150 parts of propylene glycol monomethyl ether acetate were added and then concentration was carried out to obtain 78 parts of a propylene glycol monomethyl ether acetate solution of resin A1-1 (solid component 29%). The weight average molecular weight of the resin A1-1 was $2.21 \times 10^4$. In the resin, the introduction rate of ethoxyethyl groups was 38.5% of the hydroxy groups on the phenol groups. The resin A1-1 had the structural units as shown below.

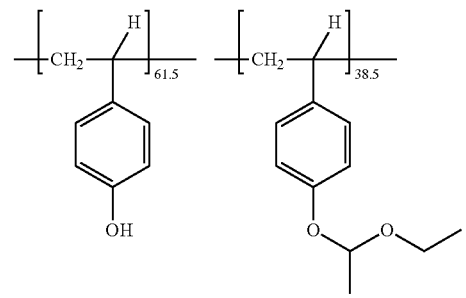

Synthesis Example 2: Synthesis of Resin A1-2

120 g of phenol novolak resin (PSM-4326 manufactured by Gun Ei Chemical Industry) was charged into a flask and dissolved in 960 g of methylisobutylketone. The obtained phenol novolak resin solution was washed 5 times with ion-exchanged water. The resulting resin solution was concentrated to 327.3 g. The resin concentration of the resin solution was 35.2%.

56.8 g of the resulting resin solution obtained above (unit molecular weight: 189 mmol), 76.52 g of methyl isobutyl ketone and 3.6 mg of p-toluensulfonic acid hydrate (0.0189 mmol) were charged into a flask. 6.54 g of ethyl vinyl ether (0.0907 mmol) was dropped into the resin solution, and then reaction was conducted for three hours at room temperature. Then ion-exchanged water was added to the reaction solution and stirred, and allowed to stand, followed by separating an organic layer therefrom. Washing by use of the ion-exchanged water was conducted four times, for the total of five times. Thereafter, the organic layer was removed and concentrated. Then, propylene glycol monomethyl ether acetate was added thereto for azeotropic removal of the aqueous fraction and methyl isobutyl ketone, and then the obtained organic layer was concentrated to obtain 59.77 g of resin solution. The resulting liquid was a solution of a resin in which the hydroxyl groups of the phenyl novolak resin had been partially 1-ethoxyethylated. When the resin was analyzed using $^1$H-NMR, 36.3% of hydroxyl groups were found to have been 1-ethoxyethylated. The concentration of the resin solution was measured using a dry mass reduction method and found to be 38.8%. The resin was referred to as resin A1-2. The weight average molecular weight of the novolak resin A1-2 was $5.1 \times 10^3$.

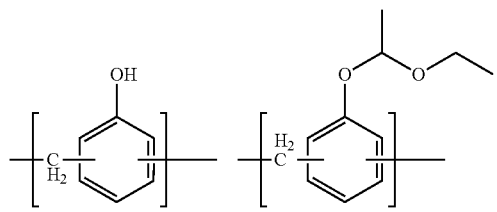

Synthesis Example 3: Synthesis of Novolak Resin A2-1

To a four-necked flask with a stirring device, a reflux condenser and a thermometer, 413.5 parts of 2,5-xylenol, 103.4 parts of salicylaldehyde, 20.1 parts of p-toluenesulfonic acid and 826.9 parts of methanol were poured, the temperature is increased to a reflux state, and the temperature maintained for 4 hours. After cooling, 1320 parts of methylisobutylketone were charged, and 1075 parts were distilled away at ordinary pressure. Then 762.7 parts of m-cresol and 29.0 parts of 2-tert-butyl-5-methylphenol were added thereto and the temperature was increased to 65° C. 678 parts of 37% formalin was dropped over 1.5 hours while the temperature was adjusted to 87° C. at the time of completion of it. The temperature maintained 87° C. for 10 hours and 1115 parts of methylisobutylketone were added thereto, followed by conducting a step of washing with ion-exchanged water, followed by separating a resin solution therefrom three times. To the resulting resin solution, 500 parts of methylisobutylketone was added, and vacuum concentration was carried out until the total amount reached 3435 parts. 3796 parts of methylisobutylketone and 4990 parts of n-heptane were added to the resulting resin solution, the temperature was increased to 60 T. After one hour stirring, separation was carried out, the lower layer, that was resin solution, was diluted using 3500 parts of propylene glycol monomethyl ether acetate, and concentrated to obtain 1690 parts of a propylene glycol monomethyl ether acetate solution of novolak resin A2-1 (solid component 43%). The weight average molecular weight of the resin A2-1 was $7 \times 10^3$.

Synthesis Example 4: Synthesis of Compound Represented by Formula (aa)

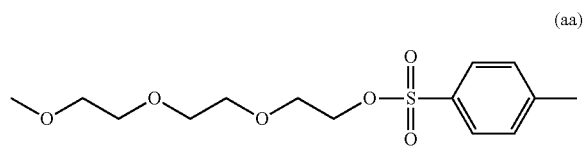

(aa)

To a four-necked flask with a stirring device, a reflux condenser and a thermometer, 100 parts of triethylene glycol monomethyl ether, 100 parts of triethylamine and 600 parts of chloroform were charged and stirred at room temperature to be mixed. A Solution in which 143 parts of p-toluenesulfonyl chloride was dissolved in 360 parts of chloroform was dropped into the obtained reaction solution on an ice bath, and the mixture was stirred for one day at room temperature. To the obtained reaction solution, 288 parts of ion-exchanged water was added, followed by conducting a step of washing with ion-exchanged water and separating an organic layer therefrom twice to obtain an organic layer. 288 parts of 1% solution of oxalic acid was added to the obtained organic layer, followed by conducting a step of washing with ion-exchanged water and separating an organic layer therefrom twice. Further, 288 parts of ion-exchanged water was added to the obtained organic layer, followed by conducting a step of washing with ion-exchanged water, followed by separating an organic layer therefrom twice. 9.6 parts of the activated carbon was added to the obtained organic layer, and then the mixture was stirred and filtrated. The obtained filtrate was concentrated to 214 parts. The obtained concentrate was purified with column chromatography [solvent: mixture of n-heptane and ethyl acetate (weight ratio 4/1), and concentrated again, dried under reduced pressure to obtain 169 parts of the compound represented by formula (aa) (purity: 97%).

Synthesis Example 5: Synthesis of Resin A3-1

To a four-necked flask with a stirring device, a reflux condenser and a thermometer, 26 parts of polyvinylphenol (Trade name VP-8000, Product of Nippon Soda Co., Ltd.), 25 parts of isopropyl alcohol, 3.3 parts of sodium hydroxide and 100 parts of ion-exchanged water were poured, and stirred to make a solution. Then 17 parts of the compound represented by formula (aa) was added to the obtained solution and the temperature is increased to 80° C., and stirred for 5 hours. After cooling to room temperature, 100 parts of methylisobutylketone and 50 parts of 10% aqueous solution of oxalic acid were added to the obtained solution, followed by conducting a step of washing with ion-exchanged water and separating an organic layer therefrom. 50 parts of 10% aqueous solution of oxalic acid was added to the obtained solution, followed by conducting a step of washing with ion-exchanged water and separating an organic layer therefrom. 100 parts of methylisobutylketone and 50 parts of ion-exchanged water were added to the obtained organic layer, followed by adding 2.5 parts of methanol thereto, followed by conducting a step of washing with ion-exchanged water and separating an organic layer therefrom eight times. The obtained organic layer was concentrated until its amount became 45 parts using an evaporator, and 156 parts of propyleneglycolmonomethylether acetate was added thereto, followed by concentrating it to obtain 70 parts of propyleneglycolmonomethylether acetate solution (39% of solid content) of resin A3-1. The weight average molecular weight of the resin was $1.50 \times 10^4$. In the resin, the introduction rate of protective group was 21.2% of the hydroxy groups on the phenol groups. Resin A3-1 had the following structural units.

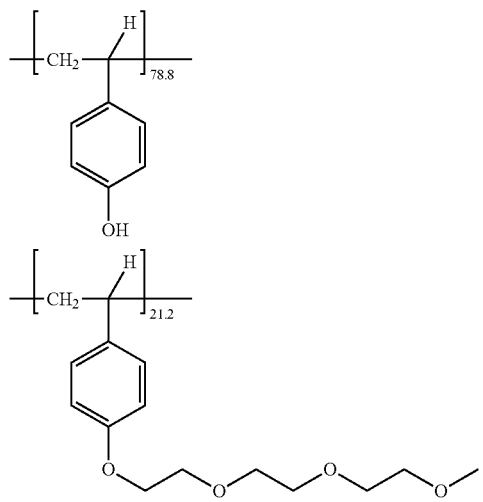

Synthesis Example 6: Synthesis of Resin A3-2

To a four-necked flask with a stirring device, a reflux condenser and a thermometer, 26 parts of polyvinylphenol (Trade name VP-8000, Product of Nippon Soda Co., Ltd.), 25 parts of isopropyl alcohol, 3.3 parts of sodium hydroxide and 100 parts of ion-exchanged water were poured and stirred to make a solution. 10.18 parts of the compound represented by formula (aa) was added to the obtained solution and the temperature is increased to 80° C., and stirred for 5 hours. After cooling to room temperature, 100 parts of methylisobutylketone and 50 parts of 10% aqueous solution of oxalic acid were added in this order to the obtained solution, followed by conducting a step of washing with ion-exchanged water and separating an organic layer therefrom. 50 parts of 2% aqueous solution of oxalic acid was added to the obtained solution, followed by conducting a step of washing with ion-exchanged water and separating an organic layer therefrom. 100 parts of methylisobutylketone, 50 parts of ion-exchanged water and 2.5 parts of methanol were added to the obtained organic layer to separately-wash eight times. The obtained organic layer was concentrated until its amount became 82 parts using an evaporator, and 156 parts of propyleneglycolmonomethylether acetate was added thereto, followed by concentrating it again to obtain 67 parts of propyleneglycolmonomethylether acetate solution (41% of solid content) of resin A3-2. The weight average molecular weight of the resin was $1.43 \times 10^4$. In the resin, the introduction rate of protective group was 13.2% of the hydroxy groups on the phenol groups. Resin A3-2 had the following structural units.

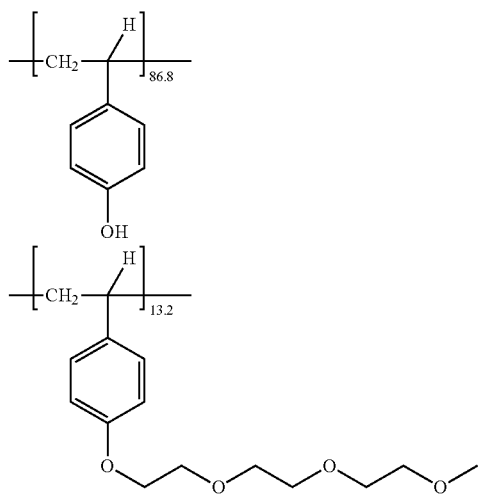

Synthesis Example 7: Synthesis of Compound Represented by Formula (Ab)

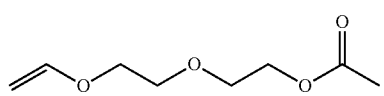

To a four-necked flask with a stirring device, a reflux condenser and a thermometer, 50 parts of diethylene glycol monovinyl ether, 2.3 parts of N,N-dimethyl amino pyridine and 250 parts of pyridine were charged and stirred at room temperature to make a solution. 77 parts of acetic anhydride was dropped into the obtained solution, and the mixture was stirred for 5 hours at room temperature. Then 250 parts of saturated sodium hydrogen carbonate aqueous solution was added to the obtained reaction solution, and 250 parts of ethyl acetate was added, followed by extracting the layer of the product compound. To the obtained aqueous layer, 250 parts of ethyl acetate was added, followed by extracting the layer of the product compound. Further, 250 parts of 10% of copper sulfate aqueous solution was added to the obtained organic layer [the layer of the product], followed by conducting a step of washing with ion-exchanged water and separating an organic layer therefrom. 250 parts of ion-exchanged water was added to the obtained organic layer, followed by conducting a step of washing with ion-exchanged water and separating an organic layer therefrom four times. Toluene was added to the obtained organic layer and then concentrated until pyridine had been eliminated to obtain 56 parts of the compound represented by formula (ab) (purity: 100%).

Synthesis Example 8: Synthesis of Resin A3-3

128 parts of polyvinylphenol [VP-8000; manufactured by Nippon Soda], 128 parts of p-toluenesulfonic acid monohydrate were dissolved in 403 parts of methylisobutylketone, and the obtained solution was concentrated using an evaporator. To a four-necked flask with a stirring device, a reflux condenser and a thermometer, the obtained concentrate was poured, 18.4 parts of the compound represented by formula (ab) was added while keeping at 20 to 25° C. The mixture was stirred for 3 hours keeping the same temperature, diluted with 10 parts of methyisobutylketone. Thereto 60 parts of ion-exchanged water and 0.1 parts of triethylamine was added, followed by conducting a step of washing with ion-exchanged water and separating an organic layer therefrom twice. To the obtained solution 60 parts of ion-exchanged water was added, followed by conducting a step of washing with ion-exchanged water and separating an organic layer therefrom. The obtained organic layer was concentrated until its amount became 111 parts using an evaporator, and 311 parts of propyleneglycolmonomethylether acetate was added thereto, followed by concentrating it to obtain 107 parts of propyleneglycolmonomethylether acetate solution (49% of solid content) of resin A3-3. The weight average molecular weight of the resin was $1.66 \times 10^4$. In the resin, the introduction rate of protective group was 23.0% of the hydroxy groups on the phenol groups. Resin A3-3 had the following structural units.

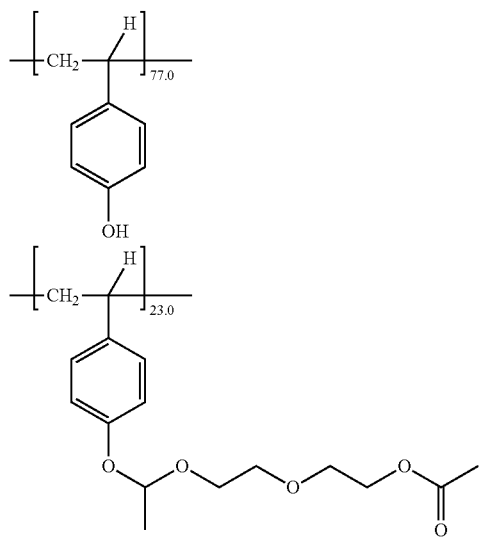

Examples 1 to 6 and Comparative Example 1

<Preparing Resist Compositions>

Resist compositions were prepared by mixing and dissolving each of the components (parts) shown in Table 1, and then filtrating through a fluororesin filter having 5.0 μm pore diameter.

TABLE 1

|  | Resin | Acid Generator | Quencher | Adhesion Improver | PB/PEB |
|---|---|---|---|---|---|
| Ex. 1 | A1-1 = 7.425, A2-1 = 4.725, A3-1 = 1.350 | B1 = 0.24 | C1 = 0.051 | E1 = 0.01 | 110° C./— |
| Ex. 2 | A1-1 = 7.425, A2-1 = 4.725, A3-2 = 1.350 | B1 = 0.24 | C1 = 0.051 | E1 = 0.01 | 110° C./— |
| Ex. 3 | A1-1 = 7.425, A2-1 = 4.725, A3-3 = 1.350 | B1 = 0.24 | C1 = 0.051 | E1 = 0.01 | 110° C./— |
| Ex. 4 | A1-1 = 7.425, A2-1 = 4.725, A3-3 = 1.350 | B2 = 0.23 | C1 = 0.051 | E1 = 0.01 | 110° C./— |
| Ex. 5 | A1-1 = 7.425, A2-1 = 4.725, A3-3 = 1.350 | B3 = 0.24 | C1 = 0.051 | E1 = 0.01 | 110° C./— |
| Ex. 6 | A1-2 = 7.425, A2-1 = 4.725, A3-3 = 1.350 | B1 = 0.24 | C1 = 0.051 | E1 = 0.01 | 110° C./— |
| Comp. Ex. 1 | A1-1 = 7.425, A2-1 = 5.400 | B1 = 0.24 | C1 = 0.051 | E1 = 0.01 | 110° C./— |

The above resist compositions of Examples and Comparative Examples further contain 0.002 parts of polyether modified silicone oil (Toray silicone SH8400; Product of Toray Dow Corning, Co., Ltd.) as a surfactant <Resin>
A1-1: Resin A1-1
A1-2: Resin A1-2
A2-1: Novolak Resin A2-1
A3-1: Resin A3-1
A3-2: Resin A3-2
A3-3: Resin A3-3

<Acid Generator>
B1: N-hydroxynaphthalimide triflate, trade name "NAI-105", product by Midori Kagaku, Co., Ltd.

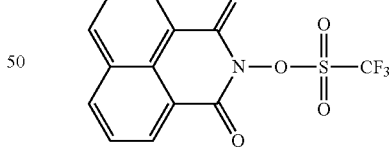

B2: The following compound, PAI-101 product by Midori Kagaku, Co., Ltd.

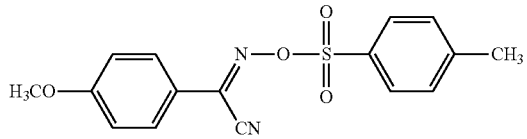 [SMILES: COc1ccc(/C(C#N)=N/OS(=O)(=O)c2ccc(C)cc2)cc1]

B3: The following compound, PAG-103 product by BASF

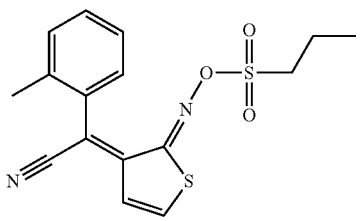 [SMILES: CCCS(=O)(=O)ON=C1SC=C/C1=C(\C#N)c1ccccc1C]

<Quencher>
C1: 2,4,5-triphenylimidazole (Product of Tokyo Chemical Industry, Co., Ltd.)
<Adhesion Improver (E)>
E1: Bismuthiol (Product of Tokyo Chemical Industry, Co., Ltd.)
<Solvent>
Propyleneglycolmonomethylether acetate 21 parts
<Preparation of Resist Pattern>

On a 4-inches substrate where copper had been vapor-deposited on a silicon wafer, each of the resist compositions prepared as above was spin-coated so that the thickness of the resulting film became 10 μm after pre-baking.

Then the substrate was subjected to pre-baking on direct hotplate at the temperature as shown in the column "PB" of Table 1 for 180 seconds.

Using an i-ray stepper ("NSR 1755i7A" manufactured by Nikon, NA=0.5) and a mask for forming a line and space pattern with line width and pitch=1:1 (the width thereof 5 μm), each wafer thus formed with the respective film was subjected to exposure with the exposure quantity being varied stepwise.

After exposure, each wafer was subjected to post-exposure baking on a hotplate at the temperature as shown in the columns "PEB" of Table 1 for 60 seconds.

After that, each wafer was subjected to paddle development for 60 seconds with an aqueous solution of 2.38% by mass tetramethylammonium hydroxide to obtain resist patterns.

The Effective Sensitivity (ES) means the exposure quantity that the line and space patterns became patterns with the width thereof 5 μm. Each pattern was checked using a scanning microscope.

Figure 1B:
FIG. 1(b) illustrates a cross-sectional view of a photoresist pattern which has a round shape at its bottom portion.

Shape:

The resist patterns with the line width thereof 5 μm were obtained by way of the process where the exposure was carried out at the exposure quantity of ES, and then each pattern was observed with a scanning electron microscope at 2000-fold magnification. When the profile of pattern was rectangle at both top and bottom sites as shown in FIG. 1(a), it was marked by "○" (good). When the profile of pattern was a round shape at its top site as shown in FIG. 1(b), it was marked by "X" (bad).

Crack Resistance Evaluation:

On a 4-inches silicon wafer, each of the resist compositions was spin-coated so that the thickness of the resulting film became 10 nm after pre-baking. Then the wafer was subjected to pre-baking on direct hotplate at the temperature as shown in the column "PB" of Table 1 for 180 seconds. The obtained wafer was subjected to baking on a hotplate at 130° C. for 5 minutes, and then cooled rapidly, followed by checking the obtained films with visual observation. Those wafers which had no crack on the film were marked by "○○" (excellent), those wafers which had one to ten cracks were marked by "circle" (○), single circle, and those wafers which had ten or more cracks were marked by "X" (bad).

The results of the evaluation are listed in Table 2.

TABLE 2

|  | Shape | Crack Resistance |
|---|---|---|
| Ex. 1 | ○(a) | ○ |
| Ex. 2 | ○(a) | ○ |
| Ex. 3 | ○(a) | ○○ |
| Ex. 4 | ○(a) | ○ |
| Ex. 5 | ○(a) | ○ |
| Ex. 6 | ○(a) | ○○ |
| Comp. Ex. 1 | ○(a) | X |

The resist composition of the disclosure can provide a resist pattern showing excellent shape and crack resistance.

The present resist composition can be used for semiconductor microfabrication with resist patterns showing excellent shape.

What is claimed is:

1. A resist composition comprising:
   a resin having an acid-labile group but not having a structural unit represented by formula (I),
   a resin consisting of the structural unit represented by formula (I) and a structural unit selected from the group consisting of a structural unit represented by formula (a2-1), a structural unit represented by formula (a2-2) and a structural unit represented by formula (a2-3),
   an acid generator, and
   a solvent:

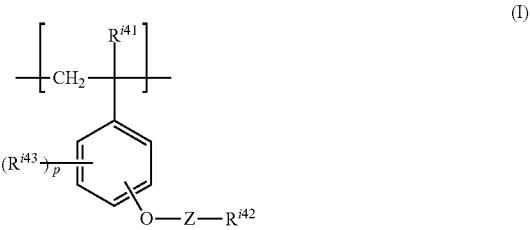

wherein $R^{i41}$ represents a hydrogen atom or a methyl group,
$R^{i42}$ represents a $C_2$ to $C_7$ acyl group or a hydrogen atom, or a $C_1$ to $C_{10}$ hydrocarbon group in which a hydrogen atom can be replaced by a hydroxy group,
$R^{i43}$ in each occurrence independently represents a $C_1$ to $C_6$ alkyl group or a $C_1$ to $C_6$ alkoxy group,
"p" represents an integer of 0 to 4,
Z represents a divalent $C_3$ to $C_{20}$ hydrocarbon group having a group represented by formula (Ia), and a methylene group contained in the hydrocarbon group may be replaced by an oxygen atom, a sulfur atom or a carbonyl group:

wherein "w" and "r" each independently represents an integer of 1 to 10, and
* represent a bonding position, provided that $R^{i42}$ represents a $C_2$ to $C_7$ acyl group when "w" represents 1,

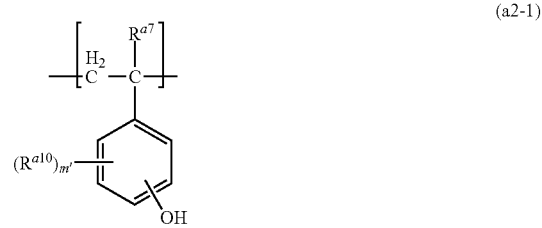

-continued

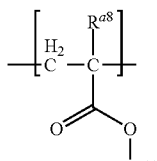
(a2-2)

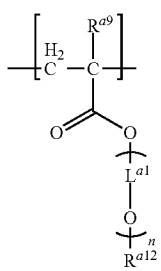
(a2-3)

where $R^{a7}$, $R^{a8}$ and $R^{a9}$ each independently represent a hydrogen atom or a methyl group, $R^{a10}$ in each occurrence independently represents a $C_1$ to $C_6$ alkyl group or a $C_1$ to $C_6$ alkoxy group, m' represents an integer of 0 to 4, $R^{a11}$ represents a hydrogen atom, a $C_1$ to $C_{10}$ primary or secondary hydrocarbon group, $R^{a12}$ represents a $C_1$ to $C_6$ primary or secondary alkyl group, $L^{a1}$ represents a $C_2$ to $C_6$ alkanediyl group where the carbon atom bonding to an oxygen atom is a primary or secondary carbon atom, and n represents an integer of 1 to 30; and wherein the structural unit represented by formula (I) is a structural unit represented by formula (I-1) or formula (I-2):

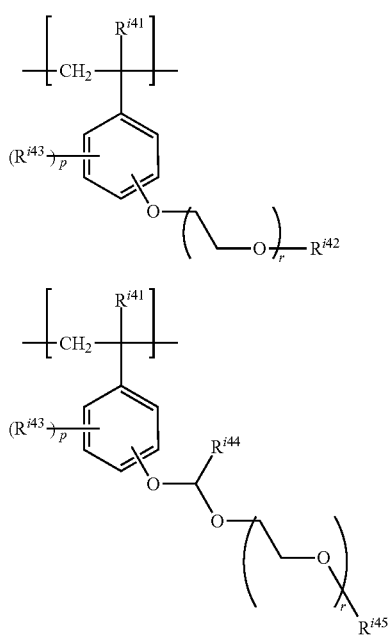

wherein $R^{i41}$ represents a hydrogen atom or a methyl group, $R^{i42}$ represents a $C_1$ to $C_{10}$ hydrocarbon group that may be substituted with a hydroxy group, a $C_2$ to $C_7$ acyl group or a hydrogen atom, $R^{i43}$ in each occurrence independently represents a $C_1$ to $C_6$ alkyl group or a $C_1$ to $C_6$ alkoxy group, "p" represents an integer of 0 to 4, $R^{i44}$ represents a $C_1$ to $C_{10}$ hydrocarbon group, "r" represents an integer of 1 to 10, and $R^{i45}$ represents a $C_1$ to $C_{10}$ hydrocarbon group that may be substituted with a hydroxy group, a $C_2$ to $C_7$ acyl group or a hydrogen atom.

2. The resist composition according to claim 1 wherein the resin having an acid-labile group is a resin having a structural unit represented by formula (a1-2):

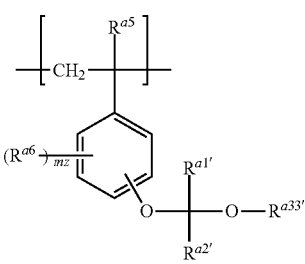
(a1-2)

wherein $R^{a5}$ represents a hydrogen atom or a methyl group, $R^{a1'}$ and $R^{a2'}$ each independently represent a hydrogen atom or a $C_1$ to $C_{12}$ hydrocarbon group, $R^{a33'}$ represents a $C_1$ to $C_{20}$ hydrocarbon group, or $R^{a1'}$ represents a hydrogen atom or a $C_1$ to $C_{12}$ hydrocarbon group, and $R^{a2'}$ and $R^{a33'}$ are bonded together with a carbon atom and an oxygen atom bonded thereto to form a divalent heterocyclic group having 2 to 20 carbon atoms, and a methylene group contained in the hydrocarbon group represented by $R^{a1'}$ and $R^{a2'}$ or the divalent heterocyclic group may be replaced by an oxygen atom or a sulfur atom, $R^{a6}$ in each occurrence independently represents a $C_1$ to $C_6$ alkyl group or a $C_1$ to $C_6$ alkoxy group, and "mz" represents an integer of 0 to 4.

3. The resist composition according to claim 1 wherein the acid generator is a compound having a group represented by formula (B1):

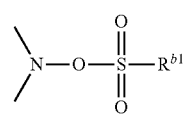
(B1)

wherein $R^{b1}$ represents a $C_1$ to $C_{18}$ hydrocarbon group in which a hydrogen atom may have a fluorine atom and in which a methylene group may be replaced by an oxygen atom or a carbonyl group.

4. A method for producing a resist pattern comprising steps (1) to (4):

(1) applying the resist composition according to claim 1 onto a substrate;

(2) drying the applied composition to form a composition layer;

(3) exposing the composition layer; and (4) developing the exposed composition layer.

5. A resin comprising a structural unit represented by formula (1-2):

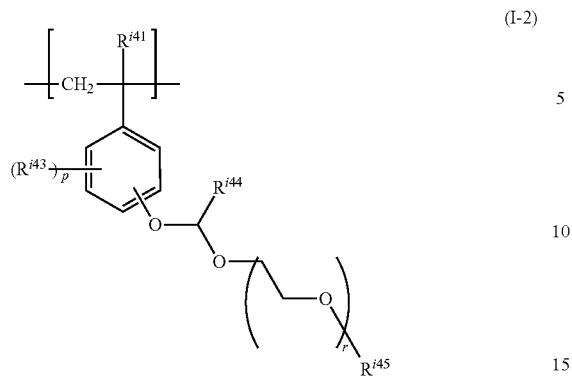

(I-2)

wherein $R^{i41}$ represents a hydrogen atom or a methyl group,
$R^{i43}$ in each occurrence independently represents a $C_1$ to $C_6$ alkyl group or a $C_1$ to $C_6$ alkoxy group,
"p" represents an integer of 0 to 4,
$R^{i44}$ represents a $C_1$ to $C_{10}$ hydrocarbon group,
"r" represents an integer of 1 to 10, and
$R^{i45}$ represents a $C_1$ to $C_{10}$ hydrocarbon group that may be substituted with a hydroxy group, a $C_2$ to $C_7$ acyl group or a hydrogen atom.

* * * * *